US008780599B2

United States Patent
Akiyama

(10) Patent No.: US 8,780,599 B2
(45) Date of Patent: Jul. 15, 2014

(54) CONTENT ADDRESSABLE MEMORY DEVICE

(71) Applicant: Renesas Electronics Corporation, Kawasaki (JP)

(72) Inventor: Mihoko Akiyama, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/782,892

(22) Filed: Mar. 1, 2013

(65) Prior Publication Data

US 2013/0182482 A1 Jul. 18, 2013

Related U.S. Application Data

(63) Continuation of application No. 13/038,916, filed on Mar. 2, 2011, now Pat. No. 8,400,803.

(30) Foreign Application Priority Data

Mar. 2, 2010 (JP) ................................. 2010-045653

(51) Int. Cl.
*G11C 15/00* (2006.01)
*G11C 15/04* (2006.01)

(52) U.S. Cl.
CPC ...................................... *G11C 15/04* (2013.01)
USPC ..................... 365/49.1; 365/49.17; 365/233.1; 365/233.12; 365/233.11; 365/205

(58) Field of Classification Search
CPC ...... G11C 15/00; G11C 15/04; G11C 15/043; G06F 17/30982
USPC ......... 365/49.17, 230.03, 233.1, 233.11, 221, 365/230.05
See application file for complete search history.

(56) References Cited

U.S. PATENT DOCUMENTS

| 5,294,911 A | 3/1994 | Uchida et al. |
| 6,191,969 B1 | 2/2001 | Pereira |
| 6,430,074 B1 | 8/2002 | Srinivasan |

(Continued)

FOREIGN PATENT DOCUMENTS

| JP | 5-127872 B2 | 5/1993 |
| JP | 2003-272386 A | 9/2003 |

(Continued)

OTHER PUBLICATIONS

Japanese Office Action issued in Application No. 2010-045653 dated Oct. 22, 2013.

*Primary Examiner* — Thong Q Le
(74) *Attorney, Agent, or Firm* — McDermott Will & Emery LLP

(57) ABSTRACT

A semiconductor integrated circuit includes a plurality of output transistors each controlling the magnitude of an output voltage relative to the magnitude of a load current according to a control value indicated by an impedance control signal applied to a control terminal, a voltage monitor circuit outputting an output voltage monitor value indicating a voltage value of the output voltage, and a control circuit controling the magnitude of the control value according to the magnitude of an error value between a reference voltage indicating a target value of the output voltage and the output voltage monitor value, and controls based on the control value whether any of such transistors be brought to a conducting state. The control circuit increases a change step of the control value relative to the error value during a predetermined period according to prenotification signals for notifying a change of the load current in advance.

4 Claims, 48 Drawing Sheets

(56) References Cited

U.S. PATENT DOCUMENTS

| | | | |
|---|---|---|---|
| 6,965,519 B1 | 11/2005 | Park et al. | |
| 2003/0179623 A1 | 9/2003 | Inoue | |
| 2005/0068839 A1* | 3/2005 | McKenzie et al. | 365/232 |
| 2007/0247885 A1 | 10/2007 | Watanabe et al. | |
| 2008/0232148 A1 | 9/2008 | Yabe | |

FOREIGN PATENT DOCUMENTS

| | | |
|---|---|---|
| JP | 2007-317342 A | 12/2007 |
| JP | 2009-158027 A | 7/2009 |

* cited by examiner

CONTENT ADDRESSABLE MEMORY DEVICE

CROSS REFERENCE TO RELATED APPLICATIONS

This application is Continuation of U.S. application Ser. No. 13/038,916, now U.S. Pat. No. 8,400,803, filed on Feb. 3, 2011, which in turn claims the benefit of Japanese Application No. 2010-45653, filed on Mar. 2, 2010, the disclosures of which Applications are incorporated by reference herein.

BACKGROUND OF THE INVENTION

The present invention relates to a content addressable memory device.

A content addressable memory array (CAM array) has a function to perform coincidence determination of stored data and supplied search data in addition to a read/write function of data, one entry which stores a search data word comprises plural CAM cells, and a word bit of a search candidate is stored in the CAM cells. In each entry, a match line to which the corresponding CAM cells are coupled in parallel is provided. When a search data word and a stored data word of an entry are in agreement, the corresponding match line is maintained in a state of "1", and when in disagreement, the corresponding match line is driven into a state of "0."

By identifying a voltage level of the match line, it is possible to determine whether data corresponding to the search data is stored in a table etc., for example. Such a content addressable memory is used for determining of a cache hit or cache miss in a communications router, a cache memory, etc., for example. Routing of an IP packet performed by a network router etc. is carried out by verifying that an IP address which is stored in a content addressable memory provided in the router is in agreement with an IP address which is inputted from the exterior. For example, on the basis of match line information indicative of a coincidence state of the content addressable memory provided in the router, a value which indicates the next destination address is written in the IP packet, and then the IP packet is transmitted from a corresponding port.

In searching operation of CAM, a match line which indicates a state of coincidence/non-coincidence between search data (for example, 80-bit width) and stored data (with an identical width to the search data) of the CAM array is pre-charged to a power supply voltage VDD at a pre-charge period. When the search data and the stored data are in disagreement (henceforth called as "Miss") by searching, the match line is discharged by a transistor in a CAM cell to a ground voltage GND. When in agreement (henceforth called as "Hit"), on the other hand, discharging of the match line is not performed, but the level of the pre-charge voltage VDD is maintained. It is determined whether the stored data and the search data are in agreement or not, by the aid of the match line having such two states.

The following explains about current consumed at the time of search in a large-scale CAM array, for example, a 20M-bit (256K entries×80 bits) CAM array, which can perform a huge amount of data search concurrently.

Assuming that current consumed by one entry is I_ML when a search result is Miss (that is, charge and discharge current of one match line), current of I_ML×256K is consumed in the above-described large-scale CAM array.

At the time of searching, a search line which indicates a state of search data is charged to the VDD level when search data is "1" (HIGH), and discharged to a GND level when the searching finishes. Assuming that current consumed by a search line per one bit of search data and one entry is I_SL, current of I_SL×256K×80 is consumed in the above-described large-scale CAM array.

At the time of searching operation, a match amplifier circuit which determines a state of a match line of all the entries is also activated concurrently. Assuming that current consumed by a match amplifier circuit for one entry is I_ma, current of I_ma×256K is consumed in the above-described large-scale CAM array.

In this way, in the above-described large-scale CAM array, the current consumed by the match line, the search line, and the match amplifier circuit amounts to (I_ML×256K+I_SL×256K×80+I_ma×256K). This value of the consumption current is very large, and occupies the greater part of the entire consumption current. Moreover, the value of the consumption current increases in proportion to formation of a large-scale capacity and speeding up.

A configuration which reduces the consumption current I_ML in a match line in a CAM array is disclosed by Patent Document 1 (U.S. Pat. No. 6,191,969). That is, in configurations illustrated in FIG. 4 of Patent Document 1 and FIG. 3 of Patent Document 2 (U.S. Pat. No. 6,430,074), a match line of a CAM array is divided into plural blocks. When search result of the first stage block is of Miss, searching in the second stage block is controlled not to be performed, and the match lines of the second and latter stages are pre-charged (or discharged). Accordingly, the pre-charge current is reduced and power lowering is attained.

A configuration which reduces consumption current I_ML in a match line in a CAM array is disclosed also in Patent Document 2. That is, in FIG. 10A of Patent Document 2, by dividing match lines of a CAM array into three or more blocks, and controlling match line pre-charge of the third stage block according to search result (Hit, Miss) of the first stage block, formation of pipeline and speeding up of a clock are attained easily, and the pre-charge current is reduced and power lowering is attained.

A configuration which reduces consumption current I_SL in a search line in a CAM array is disclosed by Patent Document 3 (Japanese Patent Laid-open No. 2003-272386). That is, in Patent Document 3, a match line of a CAM array is divided into three or more, and pre-charge of the second stage is controlled by search result of the first stage. Accordingly, the pre-charge current is reduced. Furthermore, when all the entries are of non-coincidence in the first stage block, search lines of the third stage block and the latter stage blocks are rendered non-active. Accordingly, the consumption current of the search lines is reduced, and power lowering is attained.

A configuration which reduces consumption current I_ML in a match line in a CAM array is disclosed also in Patent Document 4 (Japanese Patent Laid-open No. 2009-158027). That is, in Patent Document 4, searching is performed for every memory cell array, and when search data is in agreement with any of data stored in the memory cell array, a search line driver unit is rendered non-active, and searching is not performed for the subsequent memory cell arrays. Accordingly, it become possible to reduce the number of match lines which need charging when returning to a standby state, and it becomes possible to attain reduction of consumption current.

Considering a case where 80 bits of search data are compared with 80 bits of stored data and non-coincidence (Miss) occurs, the number of bits in non-coincidence may be 1 bit-80 bits. When all of 80 bits are of non-coincidence, driving ability is great and access is quick, because match lines are drawn out to the GND side by search transistors of 80 bits. When only one bit is of non-coincidence, on the other hand, the match line is drawn out to the GND side by a search transistor of one bit, accordingly, the speed is slow. Accordingly, a worst access of searching is the non-coincidence of one bit (henceforth called one-bit miss). That is, an operating frequency in searching a CAM array is decided by the present access in most cases.

A configuration which attains speeding up at the time of a one-bit miss in a CAM array is disclosed by Patent Document 5 (U.S. Pat. No. 6,965,519). That is, in a configuration illustrated in FIG. 1 of Patent Document 5, a match line of a CAM array is divided into plurality, parasitic capacitance of the match line is reduced, and speeding up is attained by adopting a pipeline structure.

In Patent Document 6 (Japanese Patent Laid-open No. 2007-317342), by using a differential amplifier for an amplifier circuit of a match line, a very small amplitude signal of the match line is detected and speeding up of access at the time of a one-bit miss is attained. Moreover, a configuration which reduces consumption current I_ML in a match line in a CAM array is disclosed by Patent Document 6. That is, in a configuration illustrated in Patent Document 6, the pre-charge level of a match line is lowered to a middle voltage level lower than VDD/2, and a sense amplifier which can detect voltage of two states of the middle voltage level and a GND level is used. Accordingly, the pre-charge current of a match line is reduced.

Patent Document 7 (Japanese Patent Laid-open No. Hei 05 (1993)-127872) discloses a semiconductor integrated circuit comprising a sub sense line to which each output of bit comparator circuits of the corresponding group is summarized, and one main sense line for outputting a comparison result, to which each sub sense line is coupled in common via each drive element.

(Patent Document 1) U.S. Pat. No. 6,191,969
(Patent Document 2) U.S. Pat. No. 6,430,074
(Patent Document 3) Japanese Patent Laid-open No. 2003-272386
(Patent Document 4) Japanese Patent Laid-open No. 2009-158027
(Patent Document 5) U.S. Pat. No. 6,965,519
(Patent Document 6) Japanese Patent Laid-open No. 2007-317342
(Patent Document 7) Japanese Patent Laid-open No. Hei 05 (1993)-127872.

SUMMARY OF THE INVENTION

In response to a demand for speeding up beyond 300 Msps (search per second) in recent years, a match line is divided as in the previously existing technology, and pipeline structure is adopted to realize the speeding up. However, due to an increase in the number of pipeline stages accompanying the speeding up, the number of match amplifier circuits in operation has increased and consumption current has increased.

The breakdown of the consumption current in a CAM memory corresponding to a high-speed operation is given on an average by a ratio of (match amplifier circuit: search line: match line)=(1:2:4). It is assumed that current of a match amplifier circuit, current of a search line, and current of a match line is 1I, 2I, and 4I, respectively. In a method in which the number of pipeline stages is set to two stages in order to reduce pre-charge current of the match line, as in FIG. 4 of Patent Document 1 and FIG. 3 of Patent Document 2, the pre-charge current of the match line decreases from 4I to 2I, but the consumption current of the match amplifier circuit increases from 1I to 2I. Therefore, the consumption current as a whole decreases only from 7I to 6I, and the reduction effect is small.

In a method in which the number of pipeline stages is set to four stages in order to attain speeding up and to reduce pre-charge current of the match line as well, as in FIG. 10A of Patent Document 2, the pre-charge current of the match line decreases from 4 I to 2 I, but the consumption current of the match amplifier circuit increases from 1 I to 4I. Therefore, the consumption current as a whole rather increases from 7I to 8I, and there is no reduction effect.

In Patent Document 3, although pre-charge current of the match line decreases from 4I to 1I and charge and discharge current of the search line decreases from 2I to 1I, consumption current in the match amplifier circuit increases from 1I to 4I. Therefore, the consumption current as a whole decreases only from 7I to 6I, and the reduction effect is small.

With speeding up of a network, performance expected to CAM becomes high and it is predicted that searching at 500 Msps or more will be required in the near future. Therefore, in FIG. 3 of Patent Document 1 and in Patent Document 2, pre-charge (or discharge) operation (at the next clock) is becoming difficult. For example, in the case of 500 Msps, it is necessary to complete match line pre-charge or discharge of the next stage, after activating a match amplifier circuit and determining Miss/Hit within ½ cycle (1 ns). Accordingly, a design for realizing this situation is very difficult.

Patent Document 3 and Patent Document 4 both have failed to describe simultaneous pursuit of low power consumption and speeding up.

For that reason, the first purpose of the present invention is to provide a content addressable memory device which can manage to balance low power consumption and speeding up.

In a configuration illustrated in FIG. 1 of Patent Document 5, speeding up is attained by reducing parasitic capacitance of a match line of a CAM array by dividing the match line into plural parts, and by adopting pipeline structure. However, there is a problem that the number of circuits, such as a control circuit, a latch, and a flip-flop, increases due to adoption of the pipeline structure, and that a layout increases due to the increased number of circuits.

In a configuration illustrated in FIG. 1 of Patent Document 6, speeding up of access of a one-bit miss is attained by detecting a very small amplitude signal of a match line through the use of a differential amplifier for an amplifier circuit of a match line. However, the further speeding up by a future advanced process is considered to meet difficulty. The reason for the difficulty lies in the fact that, when miniaturization is advanced from now on, a line-to-line capacitance of a match line with an adjoining line will increase. Accordingly, parasitic capacitance of the match line does not decrease (or rather increases) and driving ability of a search transistor decreases by miniaturization. Therefore, access of a one-bit miss becomes slow. Since an amount of local variations of transistors becomes large by miniaturization and a sensitivity of an amplifier such as a differential amplifier for a match line deteriorates, it is likely that access deteriorates as a result. In order to avoid the situation, it is necessary to enlarge an amplifier circuit or to enlarge a search transistor in order to enlarge a signal amplitude of a match line at the time of a one-bit miss. Thereby the layout will increase greatly.

In the configuration of Patent Document 7, since match lines are formed hierarchically, a transistor for pre-charging a local match line and a circuit for controlling the transistor are needed.

For that reason, the second purpose of the present invention is to provide a content addressable memory device in which rapid access at the time of a one-bit miss is possible, without being accompanied by drastic increase in the number of circuits and the layout.

In Patent Document 6, reduction of consumption current of a match line is attained by lowering the voltage of a precharge level of the match line. However, because of the voltage lowered, a high sensitivity amplifier for amplifying a match line signal of a small amplitude and a reference voltage are needed. Therefore, amplifier control becomes more complicated than before, causing a problem that speeding up and realization of a high degree of integration are difficult.

For that reason, the third purpose of the present invention is to provide a content addressable memory device in which low power consumption is realizable, without being accompanied by drastic increase in the number of circuits and the layout.

A content addressable memory device according to one embodiment of the present invention comprises: a first memory array which comprises plural content addressable memory cells arranged in a matrix; plural first match lines each of which is coupled to each of plural content addressable memory cells belonging to a corresponding entry in the first memory array; plural first determination circuits each of which determines coincidence or non-coincidence of search data and data stored in a content addressable memory in an entry of the first memory array, according to a voltage of the first match line; a second memory array which comprises plural content addressable memory cells arranged in a matrix, plural second match lines each of which is coupled to each of plural content addressable memory cells belonging to a corresponding entry in the second memory array; plural second determination circuits each of which determines coincidence or non-coincidence of search data and data stored in a content addressable memory in an entry of the second memory array, according to a voltage of the second match line; and a control circuit which directs to start searching in the second memory array after two or more cycles after searching has been started in the first memory array, and directs to stop searching in the second memory array according to a voltage of the first match line after the searching in the first memory array.

According to one embodiment of the present invention, it is possible to realize a content addressable memory device which can manage to balance low power consumption and speeding up.

DETAILED DESCRIPTION OF THE PREFERRED EMBODIMENTS

Hereinafter, with reference to the accompanying drawings, the embodiments of the present invention are explained in detail.

(Embodiment 1)

Figure 1:
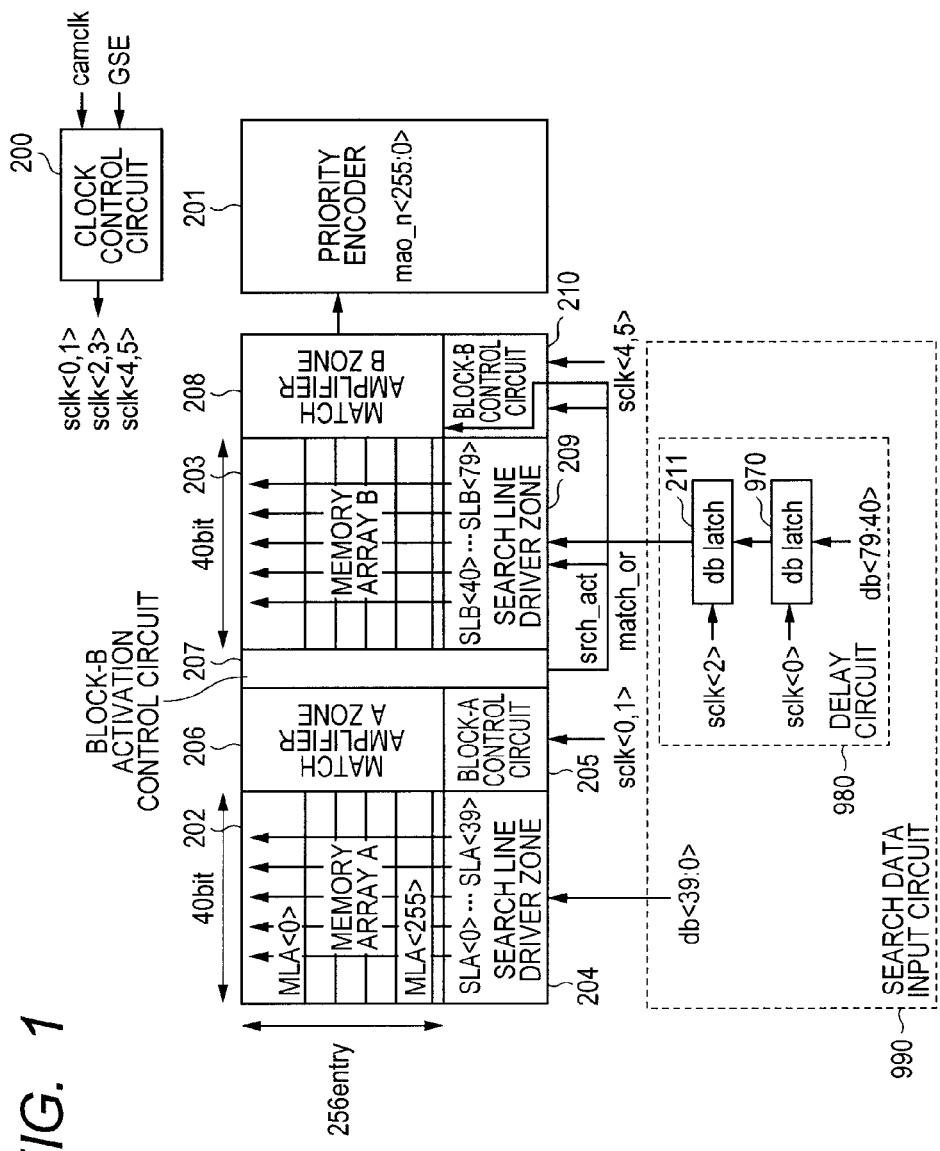
FIG. 1 is a drawing illustrating roughly an entire configuration of a content addressable memory device according to Embodiment 1.

(Configuration) FIG. 1 illustrates roughly an entire configuration of a content addressable memory device according to Embodiment 1.

As illustrated in FIG. 1, the content addressable memory device according to Embodiment 1 comprises an array block, a clock control circuit 200, a search data input circuit 990, and a priority encoder 201.

The clock control circuit 200 generates a search clock sclk<0>-sclk<5> based on a search command GSE and a clock camclk.

The search data input circuit 990 divides search data db<79:0> comprised of 80 bits into first data db<39:0> and second data db<79:40>, and supplies the first data to a search line driver zone 204 and the second data to a search line driver zone 209 after delaying it for a prescribed time (two cycles).

The search data input circuit 990 comprises a delay circuit 980 which is comprised of a latch circuit 211 and a latch circuit 970.

The latch circuit 970 latches the search data db<79:40> from the exterior, according to the search clock sclk<0>. The latch circuit 211 latches an output of the latch circuit 970, according to the search clock sclk<2>.

The array block (80 bits×256 entries) is divided into a block A (the first half of 40 bits×256 entries) and a block B (the second half of 40 bits×256 entries).

The block A comprises a memory array A, a match amplifier A zone 206 adjoining the memory array A in the row direction, a search line driver zone 204 adjoining the memory array A in the column direction, a block-A control circuit 205 adjoining the match amplifier A zone 206 and the search line driver zone 204, and a block-B activation control circuit 207 adjoining the match amplifier A zone 206 and the block-A control circuit 205 in the row direction.

The memory array A comprises a matrix of unit cells UC each of which serves as an content addressable memory cell (CAM cell).

The memory array A is divided into plural entries ERY in units of row. Each entry ERY is provided with a match line MLA to which a unit cell UC in the corresponding entry is coupled in parallel. A search line pair SLA (SL, /SL) which transmits the search data is provided in the column direction of the memory array A. A unit cell UC is provided corresponding to a cross point of the search line pair SLA and the match line MLA.

The match amplifier A zone 206 comprises a match amplifier A provided corresponding to each entry ERY. The match amplifier A is coupled to a match line MLA of the corresponding entry ERY, and determines coincidence/non-coincidence of search data and stored data of each entry in the memory array A.

The search line driver zone 204 comprises a search line driver for every search line SL. The search line driver A zone receives the 40-bit search data db<39:0> from the exterior. The search line driver supplies the VDD voltage or a ground voltage to the corresponding search line SL, according to search data db<i> from the exterior.

The block-A control circuit 205 controls components in the block A. The block-B activation control circuit 207 controls search activity of the block B based on a search result of the memory array A.

The block B comprises a memory array B, a match amplifier B zone 208 adjoining the memory array B in the row direction, a search line driver zone 209 adjoining the memory array B in the column direction, and a block-B control circuit 210 adjoining the match amplifier B zone 208 and the search line driver zone 209.

The memory array B comprises a matrix of unit cells UC each of which serves as a content addressable memory cell (CAM cell).

The memory array B is divided into plural entries ERY in units of row. Each entry ERY is provided with a match line MLB to which a unit cell UC in the corresponding entry is coupled in parallel. A search line pair SLB (SL, /SL) which transmits the search data is provided in the column direction of the memory array B. A unit cell UC is provided corresponding to a cross point of the search line pair SLB and the match line MLB.

The match amplifier B zone 208 comprises a match amplifier B provided corresponding to each entry ERY. The match amplifier B is coupled to a match line MLB of the corresponding entry ERY, and determines coincidence/non-coincidence of search data and stored data of each entry in the memory array B. The match amplifier B outputs a search determination signal mao_n which indicates a search result in the entire of the memory array A and the memory array B.

The search line driver zone 209 comprises a search line driver for every search line SL. The search line driver B zone receives the 40-bit search data db<79:40> from the exterior via the delay circuit 980. The search line driver supplies a VDD voltage or a ground voltage to the corresponding search line SL, according to search data db<i> from the exterior.

The block-B control circuit 210 controls components in the block B. The priority encoder 201 receives the search determination signal mao_n[0]-mao_n[255] from all the entries. The priority encoder 201 outputs an address of an entry with a high priority among the entries which have outputted a search determination signal of an "L" level.

Figure 2:
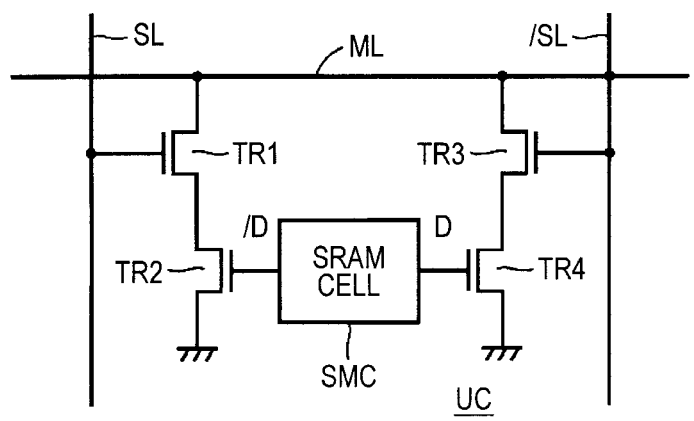
FIG. 2 is a drawing illustrating a configuration of a unit cell UC.

(Unit cell) FIG. 2 illustrates a configuration of a unit cell UC.

FIG. 2 illustrates an example of a configuration of a unit cell UC in the memory array A and the memory array B illustrated in FIG. 1. In FIG. 2, the unit cell UC comprises a SRAM cell SMC which stores one-bit data, N-channel MOS transistors (insulated-gate field effect transistors) TR1 and TR2 coupled in series between a match line ML and a ground node, and N-channel MOS transistors TR3 and TR4 coupled in series between the match line ML and the ground node. Gates of the MOS transistors TR1 and TR3 are coupled to the search lines SL and /SL, respectively. The MOS transistors TR2 and TR4 serve as search transistors, and the respective sources are coupled to the grand power supply.

Gates of the MOS transistors TR2 and TR4 are coupled to internal storage nodes /D and D of the SRAM cell SMC, respectively. Data bits which are complementary with each other are stored in the memory nodes D and /D. When the SRAM cell SMC stores data "1", the internal storage node D is at a high level (H level), and the internal storage node /D is at a low level (L level). Therefore, in the present state, the MOS transistor TR2 is in a conductive state and the MOS transistor TR4 is in a non-conductive state. When the SRAM cell SMC stores data "0", the states are reversed.

Search lines SL and /SL form the search line pair SLA or SLB illustrated in FIG. 1, and complementary data are transmitted at the time of searching. In the unit cell UC illustrated in FIG. 2, a word line and a bit-line pair for performing data writing and data reading of the SRAM cell SMC are provided. However, the word line and the bit-line pair are not illustrated in FIG. 2.

At the time of searching, it is assumed that the search data "1" is supplied, when the SRAM cell SMC stores "1" (the internal storage node D is at an H level). In the present case, the search line SL is at an H level and the complementary search line /SL is at an L level. Accordingly, the MOS transistors TR2 and TR3 are in a non-conductive state, and the match line ML maintains a pre-charge voltage level. On the other hand, when the internal storage node D of the SRAM cell SMC is at an H level and the search data of "0" is transferred to the search line SL, the search line SL is at an L level and the complementary search line /SL is at an H level. In the present case, the MOS transistors TR3 and TR4 are in a conductive state, and the match line ML is discharged from the pre-charge voltage level to the ground voltage level by the MOS transistor TR4 which is serving as a search transistor.

Accordingly, when the unit cell UC illustrated in FIG. 2 is used, it is possible to make binary determination of coincidence/non-coincidence of the search data and the stored data of an entry. Unit cells UC of the corresponding entry are coupled to the match line ML in parallel. When the unit cells UC of an entry ERY are all in a coincidence state, the match line ML maintains the pre-charge voltage level. On the other hand, when a unit cell for at least one bit in an entry is in a non-coincidence state, the match line ML is discharged via the present unit cell in the non-coincidence state, and the potential of the match line ML falls from the pre-charge voltage level. Accordingly, by amplifying the potential level of the match line ML with the match amplifier A or the match amplifier B, it becomes possible to make binary determination of coincidence/non-coincidence of the search data and the stored data of each entry.

Figure 3:
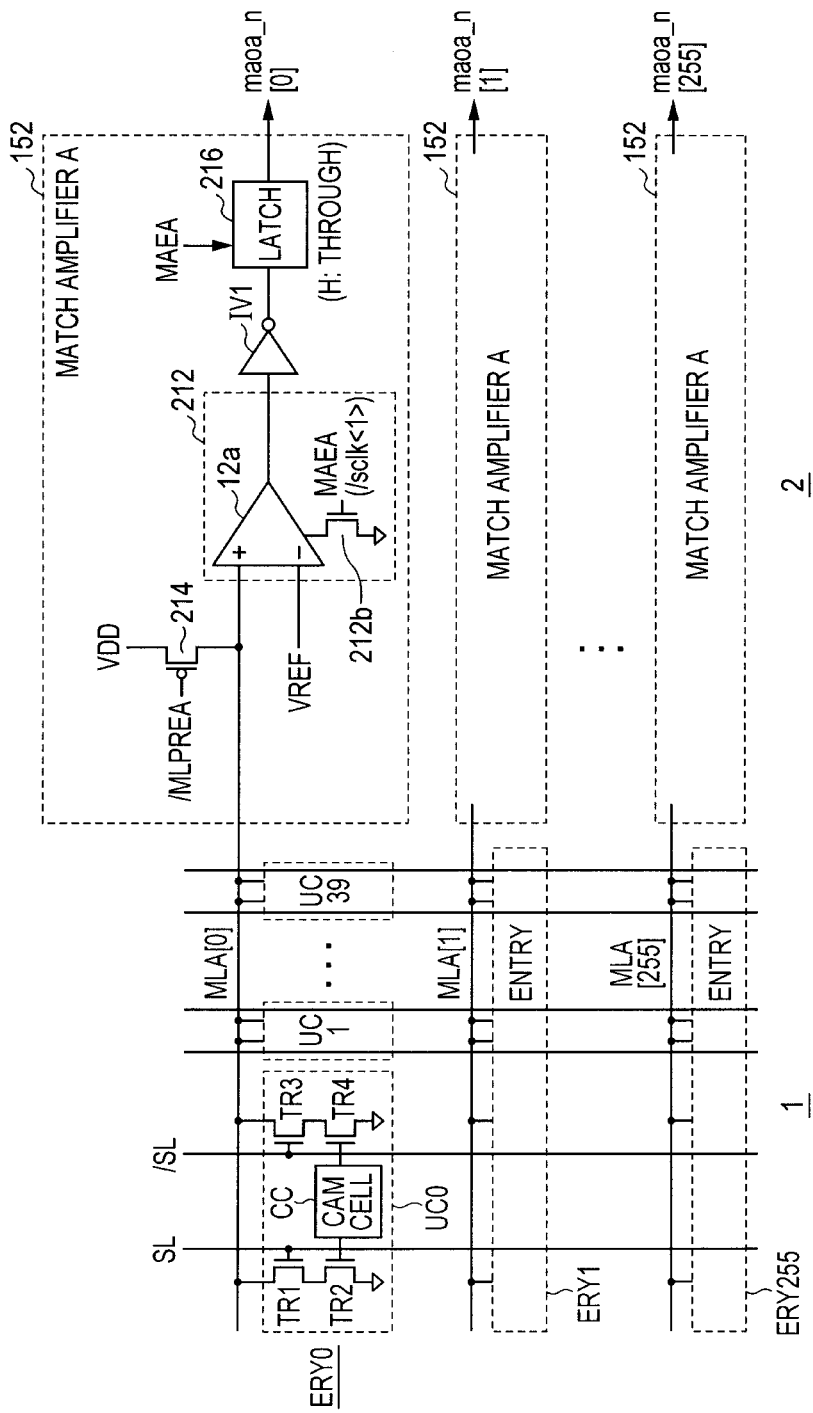
FIG. 3 is a drawing illustrating a configuration of an entry of a memory array A and a match amplifier A coupled to the entry.

(Entry of block A) FIG. 3 illustrates a configuration of an entry of a memory array A and a match amplifier A coupled to the entry.

As illustrated in FIG. 3, the match amplifier A comprises a P-channel MOS transistor 214. The P-channel MOS transistor 214 pre-charges the match line MLA to the VDD voltage, when an inverted pre-charge signal /MLPREA is activated to an L level.

The match amplifier A comprises a match amplifier circuit 212, an inverter IV1, and a latch circuit 216.

The match amplifier circuit 212 comprises a differential amplifier 12a to which a voltage of the match line A and a reference voltage VREF are inputted, and an N-channel MOS transistor 212b which couples the differential amplifier 12a to the grand power supply. The differential amplifier 12a amplifies a difference voltage of the voltage of the match line A and the reference voltage VREF, when a match amplifier activation signal MAEA is activated to an H level.

The inverter IV1 inverts an output of the match amplifier circuit 212, and outputs it to the latch circuit 216. According to the match amplifier activation signal MAEA, the latch circuit 216 latches an output of the inverter IV1, and outputs a block-A search determination signal maoa_n. The block-A search determination signal maoa_n turns to an L level, when all the unit cells UC of the corresponding entry of the memory array A are of Hit, and turns to an H level, when at least one unit cell UC of the corresponding entry of the memory array A is of Miss.

Figure 4:
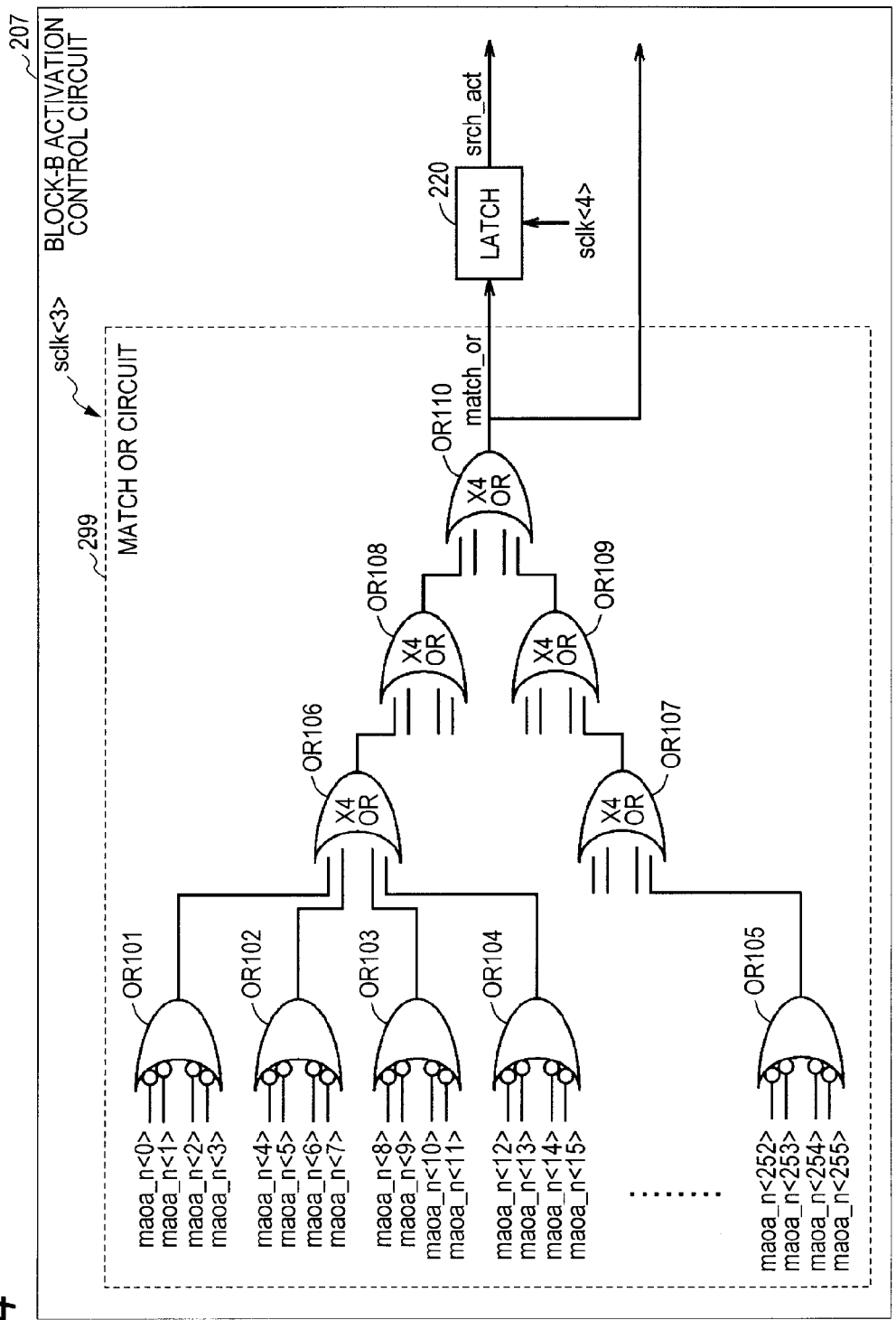
FIG. 4 is a drawing illustrating a configuration of a block-B activation control circuit.

(Block B activation control circuit) FIG. 4 illustrates a configuration of a block-B activation control circuit.

As illustrated in FIG. 4, the block-B activation control circuit 207 comprises a match OR circuit 299 and a latch circuit 220.

The match OR circuit 299 comprises plural OR circuits OR101-OR110 which are formed hierarchically. The match OR circuit 299 is activated by a search clock sclk<3>, and outputs an inverted logical product signal match_or of block-A search determination signals maoa_n<0>-maoa<255>. The match OR circuit 299 outputs the inverted logical product signal match_or at the timing of the search clock sclk<3>.

The latch circuit 220 latches the inverted logical product signal match_or, and outputs a search activation signal srch_act. When all the entries of the block A are of Miss, it is not necessary to search the block B. Therefore, the search activation signal srch_act is deactivated to an L level, and the block B does not perform searching. When at least one entry of the block A is of Hit, on the other hand, the search activation signal srch_act is activated to an H level, and the block B performs searching.

Figure 5:
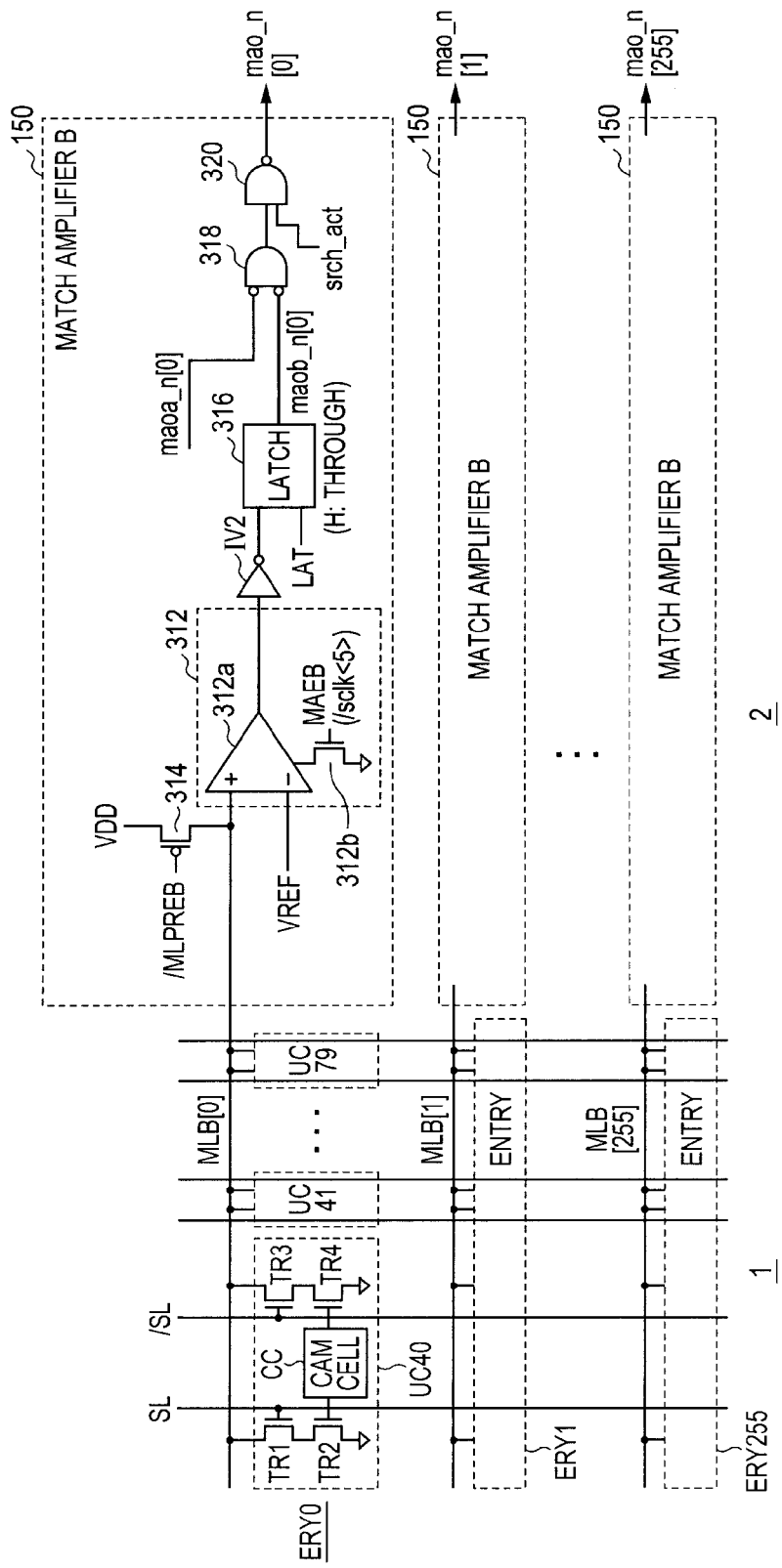
FIG. 5 is a drawing illustrating a configuration of an entry of a memory array B and a match amplifier B coupled to the entry.

(Entry of block B) FIG. 5 illustrates a configuration of an entry of a memory array B and a match amplifier B coupled to the entry.

As illustrated in FIG. 5, the match amplifier B comprises a P-channel MOS transistor 314. The P-channel MOS transistor 314 pre-charges the match line MLB to the VDD voltage, when an inverted pre-charge signal /MLPREB is activated to an L level.

The match amplifier B comprises a match amplifier circuit 312, an inverter IV2, and a latch circuit 316.

The match amplifier circuit 312 comprises a differential amplifier 312a to which a voltage of the match line B and the reference voltage VREF are inputted, and an N-channel MOS transistor 312b which couples the differential amplifier 312a to the grand power supply. The differential amplifier 312a amplifies a difference voltage of the voltage of the match line B and the reference voltage VREF, when a match amplifier activation signal MAEB is activated to an H level.

The inverter IV2 inverts an output of the match amplifier circuit 312, and outputs it to the latch circuit 316. According to the match amplifier activation signal MAEB, the latch circuit 316 latches an output of the inverter IV2, and outputs a block-B search determination signal maob_n. The block-B search determination signal maob_n turns to an L level, when all the unit cells UC of the corresponding entry of the memory array B are of Hit, and turns to an H level, when at least one unit cell UC of the corresponding entry of the memory array B is of Miss.

The inverted logical addition circuit 318 outputs an inverted logical addition of the block-A search determination signal maoa_n and the block-B search determination signal maob_n.

The inverted logical product circuit 320 outputs an inverted logical product of an output of the inverted logical addition circuit 318 and the search activation signal srch_act, as a search determination signal mao_n.

That is, the search determination signal mao_n turns to an H level indicating Miss, when the search activity signal srch_act is at an L level. The search determination signal mao_n turns to an L level indicating Hit, when the search activity signal srch_act is at an H level, the block-A search determination signal maoa_n is at an L level (that is, Hit), and the block-B search determination signal maob_n is at an L level (that is, Hit).

Figure 6:
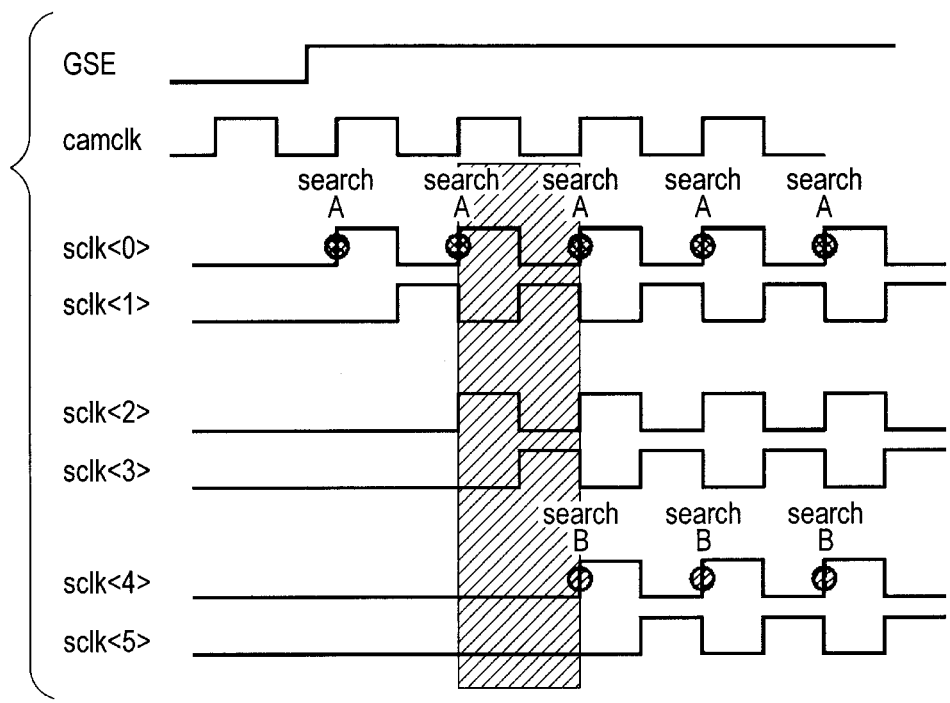
FIG. 6 is a drawing for explaining search timing of a block A and a block B.

(Search timing) FIG. 6 is a drawing for explaining search timing of the block A and the block B.

As illustrated in FIG. 6, the clock control circuit 200 generates the search clock sclk<0>-sclk<5> based on the clock camclk, when the search command GSE is activated to an H level. The block A performs searching at the timing of rising of the search clock sclk<0>. The block B performs searching at the timing of rising of the search clock sclk<4> which is delayed by two cycles from the search clock sclk<0>. That is, searching of two blocks is performed during three cycles.

Figure 7:
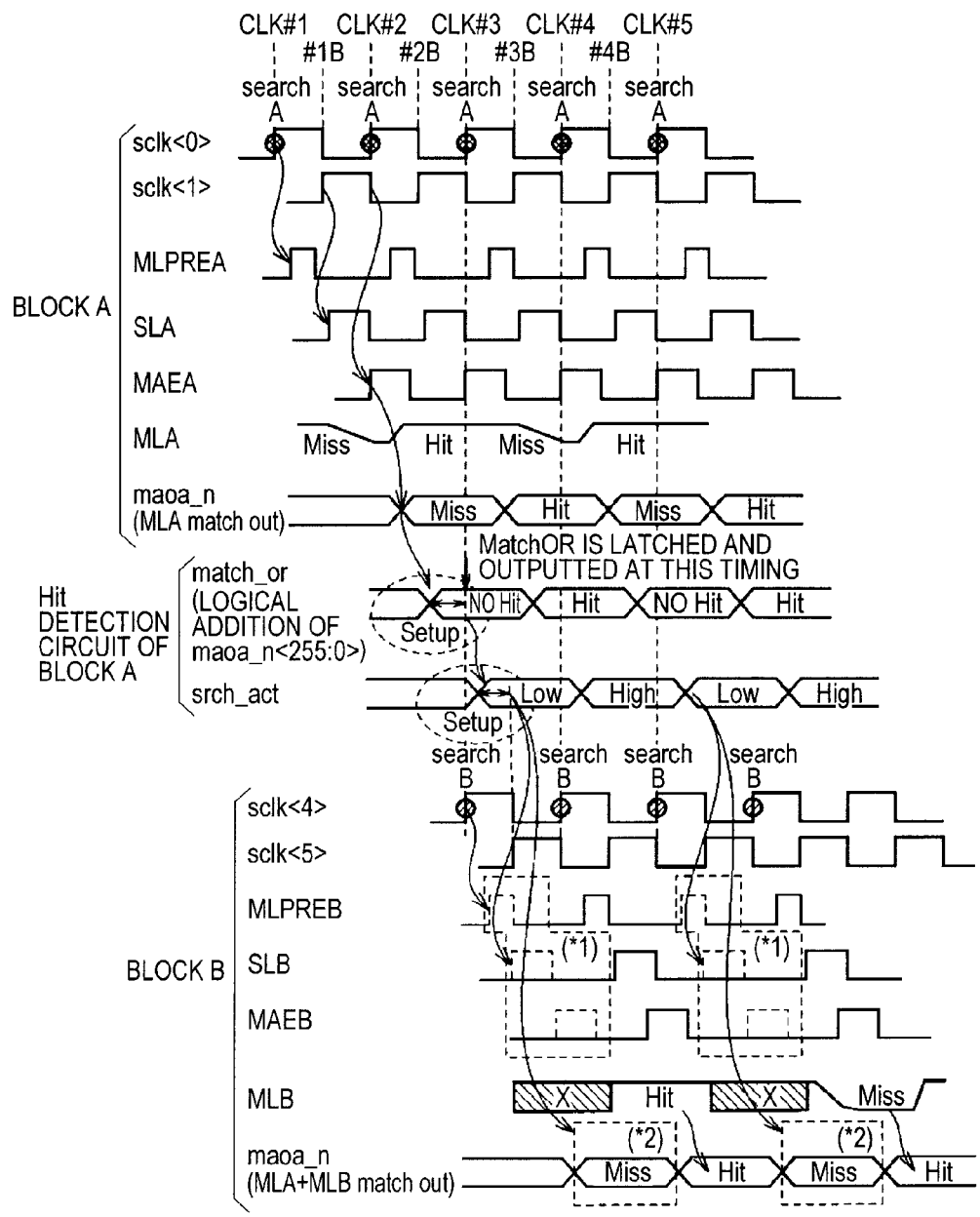
FIG. 7 is a drawing illustrating operating waveforms of the content addressable memory device according to Embodiment 1.

(Operation) FIG. 7 illustrates operating waveforms of the content addressable memory device according to Embodiment 1.

As illustrated in FIG. 7, first, the clock control circuit 200 changes the search clock sclk<0> to an H level, in response to the fact that the search command GSE has been activated at the timing of CLK#1 of the clock camclk. The block-A control circuit 205 activates the pre-charge signal MLPREA to an H level, according to the fact that the search clock sclk<0> has changed to an H level. The P-channel MOS transistor 214 pre-charges the match line MLA of the memory array A, according to the fact that the pre-charge signal MLPREA has been activated to an H level.

Next, the clock control circuit 200 changes the search clock sclk<1> to an H level at the timing of CLK#1B of the clock camclk. The search line driver of the block A activates the search line SLA of the block A, according to the fact that the search clock sclk<1> has changed to an H level.

Next, the clock control circuit 200 changes the search clock sclk<1> to an L level and changes the search clock sclk<2> to an H level, at the timing of CLK#2 of the clock camclk, the block-A control circuit 205 activates the match amplifier activation signal MAEA to an H level, according to the fact that the search clock sclk<1> has changed to an L level. The match amplifier circuit 212 amplifies a voltage of the match line MLA, according to the fact that the match amplifier activation signal MAEA has been activated to an H level. The latch circuit 216 latches an output of the match amplifier circuit 212, and outputs a block-A search determination signal maoa_n[0] (in the case of the 0th entry). When the block-A search determination signal maoa_n[0] is at an L level, it is meant that all the unit cells UC of the 0th entry of the block A are of Hit. When the block-A search determination signal maoa_n[0] is at an H level, it is meant that at least one unit cell UC of the 0th entry of the block A is of Miss. The block-A control circuit 205 activates the match amplifier activation signal MAEA to an H level for a prescribed time and then deactivates it to an L level. The search line SLA is deactivated by the search line driver of the block A after the match amplifier activation signal MAEA is activated. After the search line SLA is deactivated, the block-A control circuit 205 activates the pre-charge signal MLPREA to an H level. The P-channel MOS transistor 214 pre-charges the match line MLA of the block A, according to the fact that the pre-charge signal MLPREA has been activated to an H level (accordingly, an inverted pre-charge signal /MLPREA has been activated to an L level).

Next, the clock control circuit 200 changes the search clock sclk<3> to an H level at the timing of CLK#2B of the clock camclk. According to the fact that the search clock sclk<3> has changed to an H level, the match OR circuit 299 of the block-B activation control circuit 207 calculates an inverted logical product of the block-A search determination signals maoa_n<0>-maoa_n<255> which are outputted by the latch circuit 216 of all the entries of the block A, and outputs an inverted logical product signal match_or. When the inverted logical product signal match_or is at an H level, it is meant that all the unit cells UC are of Hit in at least one entry of the block A. When the inverted logical product signal match_or is at an L level, it is meant that at least one unit cell UC is of Miss in all the entries of the block A.

Next, the clock control circuit 200 changes the search clock sclk<4> to an H level at the timing of CLK#3 of the clock camclk. According to the fact that the search clock sclk<4> has changed to an H level, the latch circuit 220 of the block-B activation control circuit 207 latches the inverted logical product signal match_or, and outputs the search activation signal srch_act to the block B. The block-B control circuit 210 activates the pre-charge signal MLPREB to an H level, when the inverted logical product signal match_or outputted from the block A is activated to an H level. On the other hand, the block-B control circuit 210 does not activate the pre-charge signal MLPREB to an H level, when the inverted logical product signal match_or is deactivated to an L level.

Next, the clock control circuit 200 changes the search clock sclk<5> to an H level at the timing of CLK#3B of the clock camclk. When the search activation signal srch_act outputted from the block A is activated to an H level according to the fact that the search clock sclk<5> has changed to an H level, the search line driver of the block B activates the search line SLB of the block B. On the other hand, the search line driver of the block B does not activate the search line SLB of the block B, when the search activation signal srch_act is deactivated to an L level.

Next, the clock control circuit 200 changes the search clock sclk<5> to an L level at the timing of CLK#4 of the clock camclk. According to the fact that the search clock sclk<5> has changed to an L level, the block-B control circuit 210 activates the match amplifier activation signal MAEB to an H level, when the search activation signal srch_act outputted from the block A is activated to an H level. The match amplifier circuit 312 amplifies a voltage of the match line MLB, according to the fact that the match amplifier activation signal MAEB has been activated to an H level. The latch circuit 316 latches an output of the match amplifier circuit 312, and outputs the block-B search determination signal maob_n[0] (in the case of the 0th entry). When the block-B search determination signal maob_n[0] is at an L level, it is meant that all the unit cells UC of the 0th entry of the block B are of Hit. When the block-B search determination signal maob_n[0] is at an H level, it is meant that at least one unit cell UC of the 0th entry of the block B is of Miss. The inverted logical addition circuit 318 outputs an inverted logical addition signal of the block-A search determination signal maoa_n[0] and the block-B search determination signal maob_n[0]. The inverted logical addition signal is set to an H level only when both of the block-A search determination signal maoa_n[0] and the block-B search determination signal maob_n[0] are at an L level, that is, when all the unit cells of the 0th entry of the block A and the block B are of Hit. The inverted logical product circuit 320 outputs an inverted logical product of an inverted logical addition signal outputted by the inverted logical addition circuit 318 and the search activation signal srch_act, as the search determination signal mao_n. Only when all the CAM cells of the 0th entry of the block A and the block B are of Hit, and the search activation signal srch_act is at an H level (that is when all the CAM cells are of Hit in at least one entry of the block A), the search determination signal mao_n[0] becomes at an L level indicating Hit.

On the other hand, the block-B control circuit 210 does not activate the match amplifier activation signal MAEB to an H level, when the search activation signal srch_act outputted from the block A is deactivated to an L level. In this case, the search determination signal mao_n[n] (n=0-255) of all the entries is set to an H level indicating Miss by the inverted logical product circuit 320.

The priority encoder 201 receives the search determination signals mao_n[0]-mao_n[255] from all the entries. The priority encoder 201 outputs an address of an entry of high priority among the entries which have outputted the search determination signal of an L level.

Figure 8:
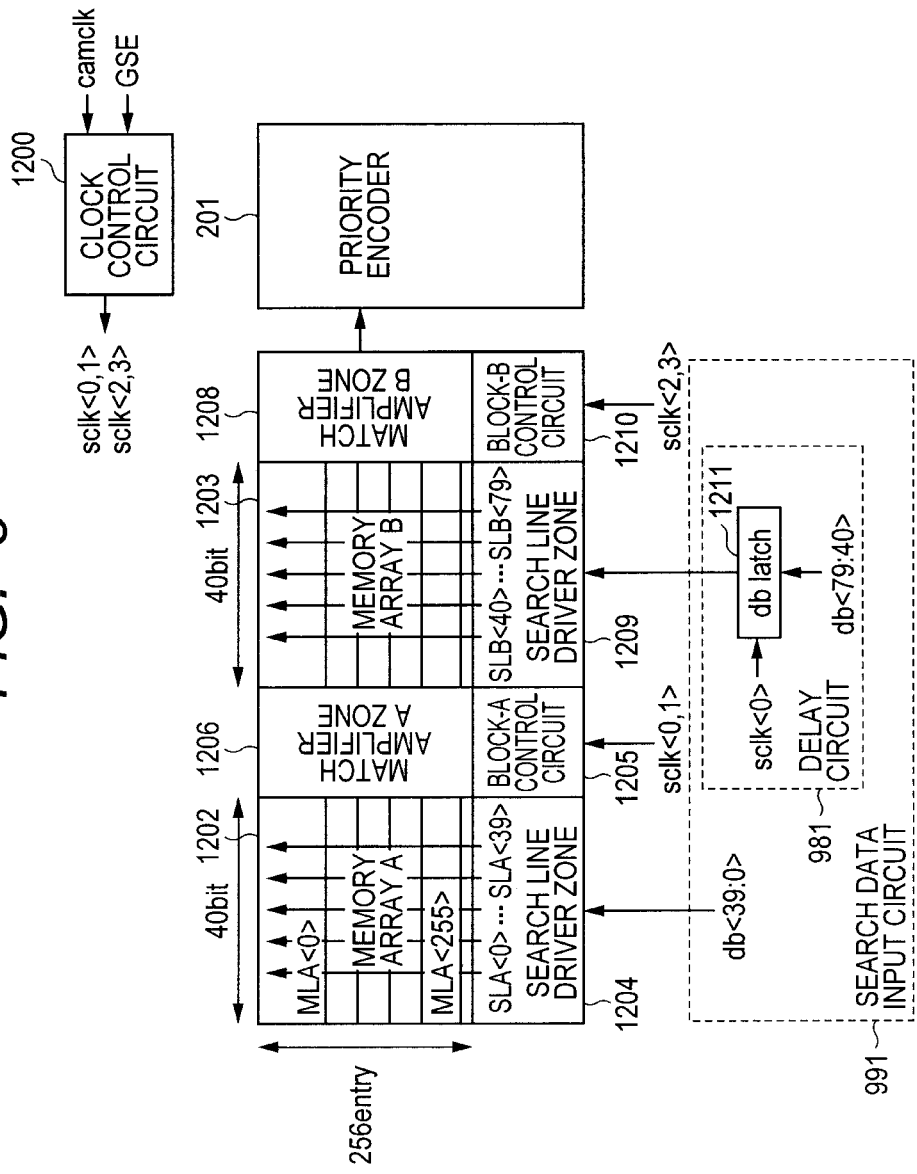
FIG. 8 is a drawing illustrating roughly an entire configuration of a conventional content addressable memory device.
Figure 9:
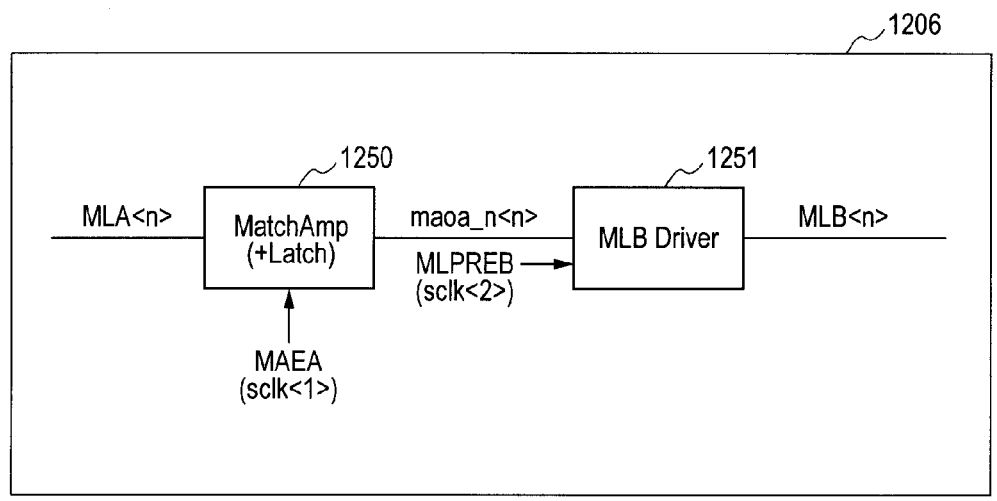
FIG. 9 is a drawing illustrating a configuration of a match amplifier A of a match amplifier A zone illustrated in FIG. 8.

(Reference) FIG. 8 illustrates roughly an entire configuration of a conventional content addressable memory device. FIG. 9 illustrates a configuration of a match amplifier A of a match amplifier A zone illustrated in FIG. 8.

Figure 10:
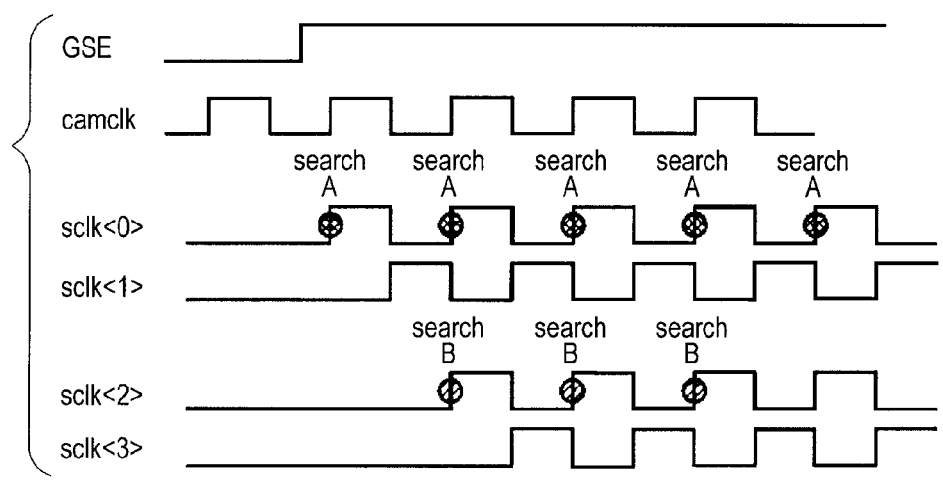
FIG. 10 is a drawing for explaining search timing of a block A and a block B illustrated in FIG. 8.

FIG. 10 is a drawing for explaining search timing of a block A and a block B illustrated in FIG. 8.

As illustrated in FIG. 10, a clock control circuit 1200 generates search clocks sclk<0>-sclk<3> based on the clock camclk, when a search command GSE is activated to an H level. The block A performs searching at the timing of rising of the search clock sclk<0>. The block B performs searching at the timing of rising of the search clock sclk<2> which is delayed by one cycle from the search clock sclk<0>. That is, searching of two blocks is performed during two cycles.

Figure 11:
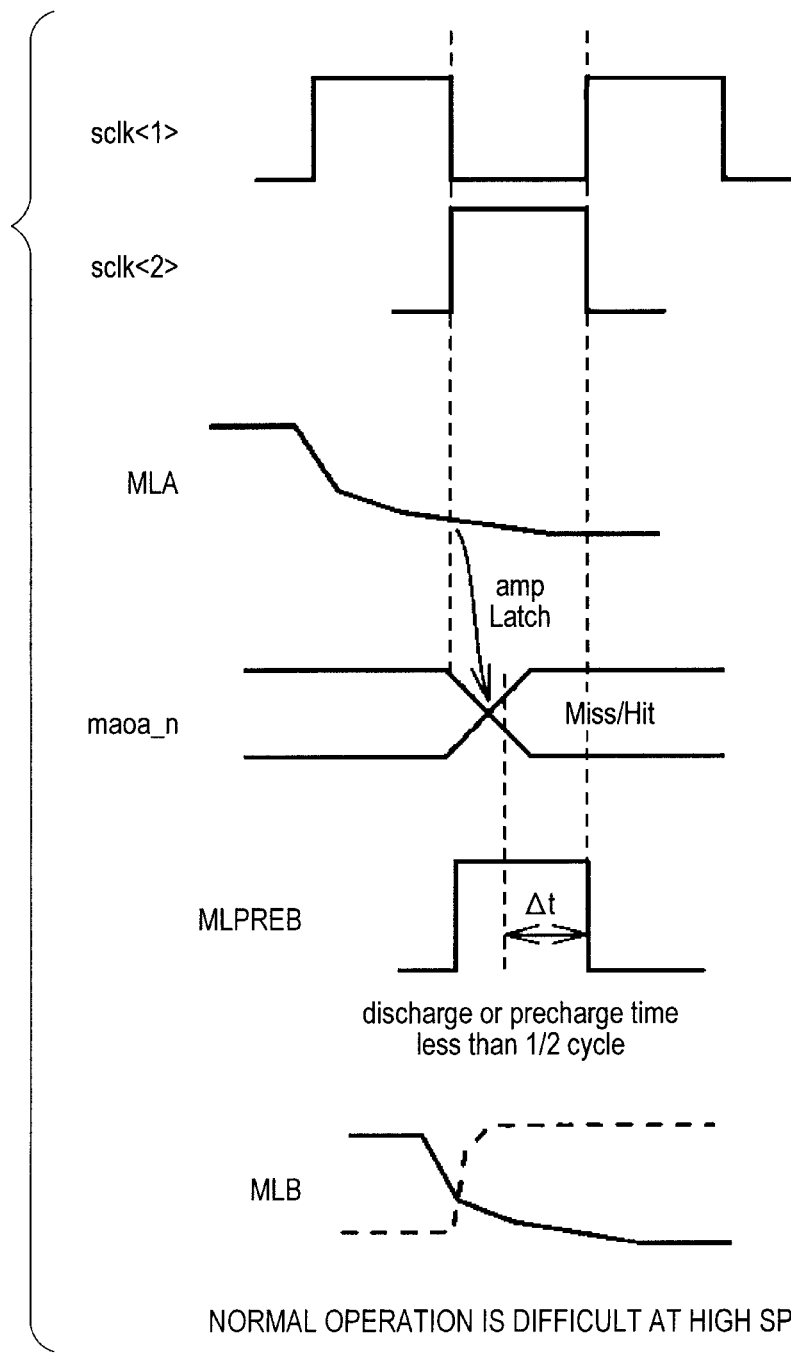
FIG. 11 is a drawing illustrating roughly operating waveforms of the content addressable memory device illustrated in FIG. 8.

FIG. 11 illustrates roughly operating waveforms of the content addressable memory device illustrated in FIG. 8. As illustrated in FIG. 11, since the pre-charge signal MLPREB is activated to an H level based on the search clock sclk<2>, it is necessary to pre-charge or to discharge the match line MLB within a period $\Delta t$ less than ½ cycle. When the frequency of the clock camclk becomes high, it will become difficult to complete pre-charging or discharging the match line MLB in the period $\Delta t$.

(Effects) The breakdown of the consumption current in a CAM memory is given on an average by a ratio of (match amplifier: search line: match line)=(1:2:4). Assuming that current of a match amplifier, current of a search line, and current of a match line is 1I, 2I, and 4I, respectively, in the present embodiment, the pre-charge current of the match line is reduced from 4I to 2I, there is no increase of the consumption current in the match amplifier, and the charge and discharge current of the search line is reduced from 2I to 1I. Therefore, the consumption current as a whole is reduced from 7I to 4I.

In the present embodiment, when the block A has an entry of which the search result is Hit, searching of the block B is performed. However, since search of almost all the entries results in Miss in the ordinary CAM (for example, only several searches are of Hit out of 256K entries in a 20M-byte CAM array), almost all the block A of the entire chip becomes of Miss, and almost all the block B becomes non-active. Therefore, in the entire chip, the consumption current becomes about 4/7, and a large reduction effect is obtained.

(Embodiment 2)

Figure 12:
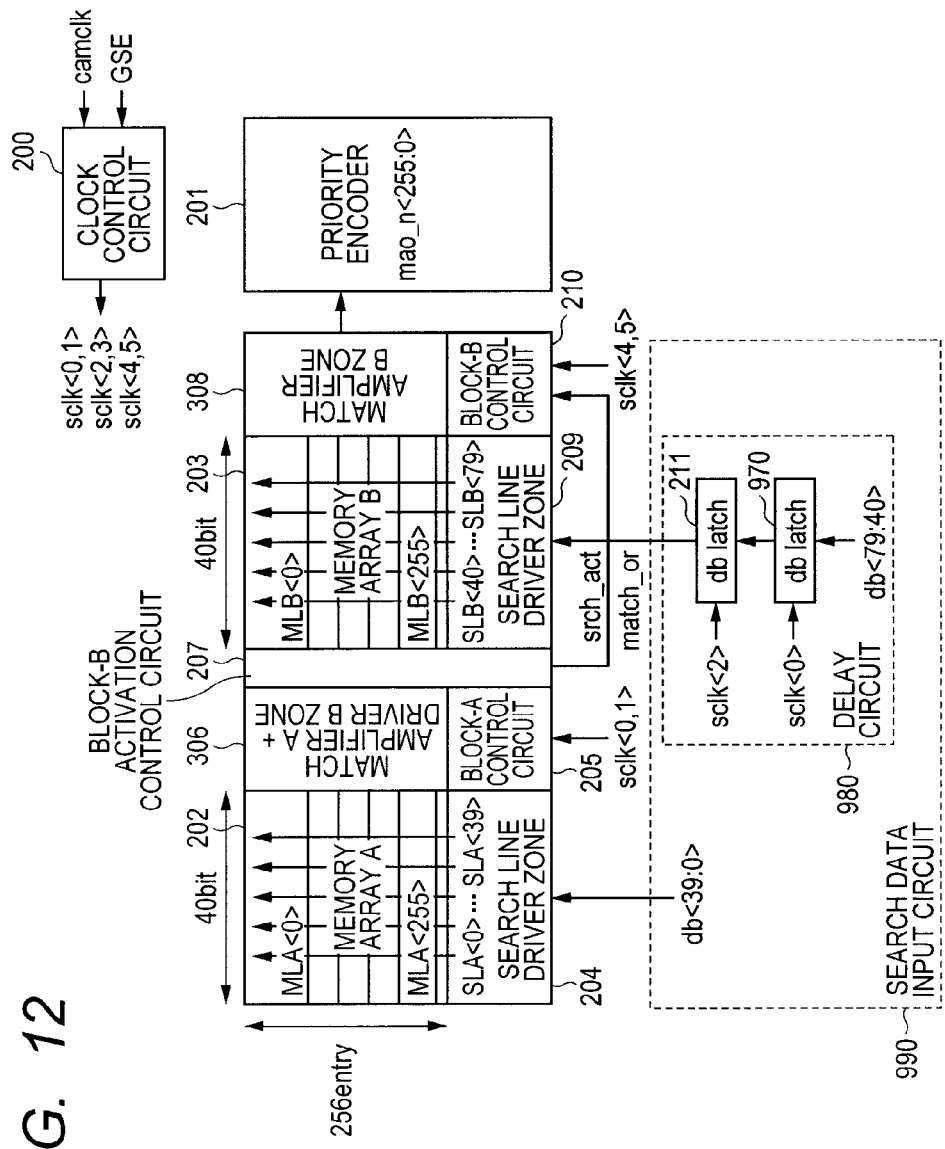
FIG. 12 is a drawing illustrating a configuration of a content addressable memory device according to Embodiment 2.

(Configuration) FIG. 12 illustrates a configuration of a content addressable memory device according to Embodiment 2.

As illustrated in FIG. 12, the content addressable memory device according to Embodiment 2 is different from the content addressable memory device according to Embodiment 1 illustrated in FIG. 1, with respect to the parts of a match amplifier A plus driver zone 306 and a match amplifier B zone 308.

The match amplifier A plus driver B zone 306 comprises a match amplifier A and a driver B which are provided corresponding to each entry ERY. The match amplifier A is coupled to a match line MLA of the corresponding entry ERY, and determines coincidence/non-coincidence of search data and stored data of each entry. The driver B pre-charges or discharges a match line MLB, according to a determination result in the match amplifier A.

The match amplifier B zone 308 comprises a match amplifier B provided corresponding to each entry ERY. The match amplifier B is coupled to the match line MLB of the corresponding entry ERY, and determines coincidence/non-coincidence of search data and stored data of each entry in the memory array B, and outputs a search determination signal mao_n which indicates a search result in the entire of the memory array A and the memory array B.

Figure 13:
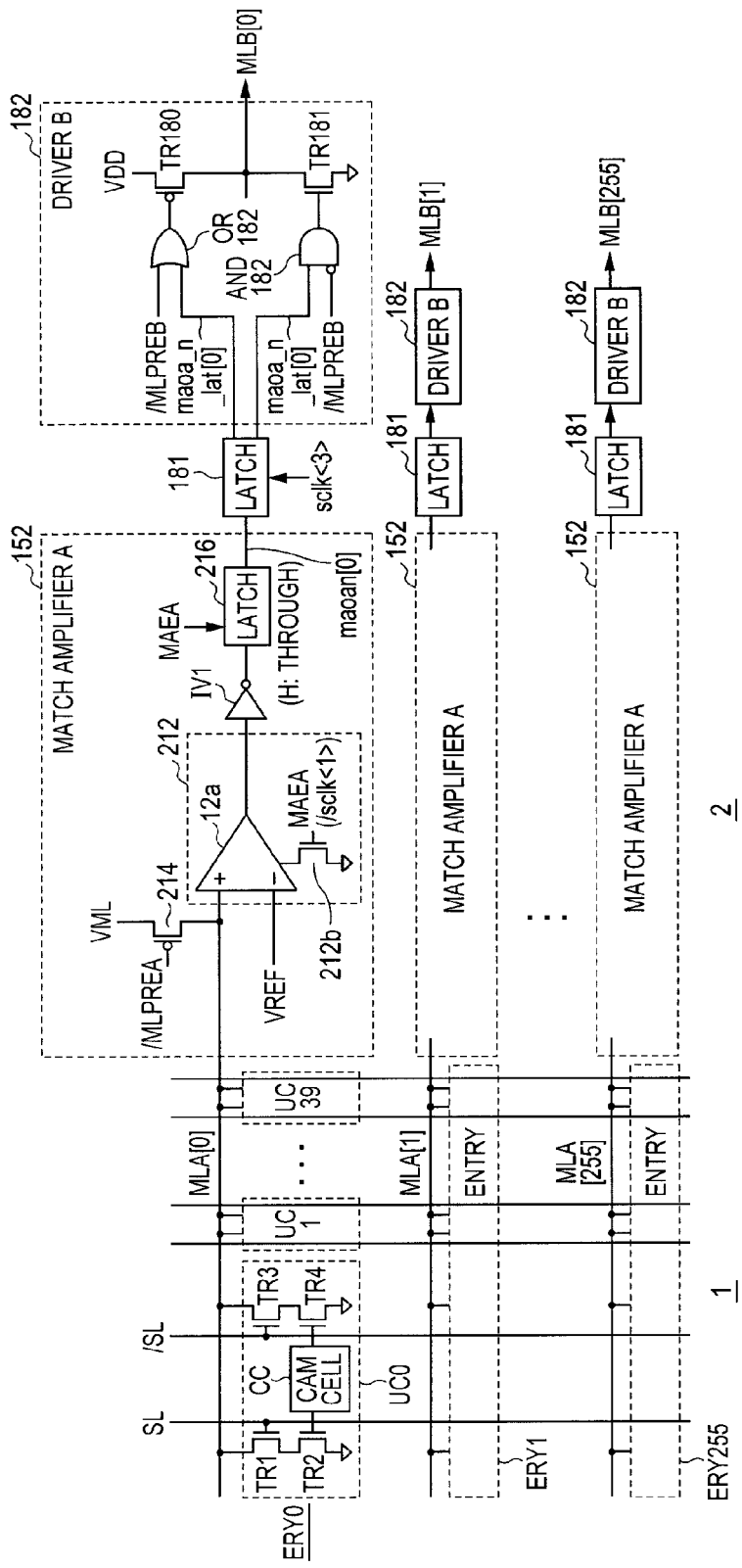
FIG. 13 is a drawing illustrating a configuration of an entry of a memory array A and a match amplifier A and a driver B which are coupled to the entry.

(Entry of block A) FIG. 13 illustrates a configuration of an entry of a memory array A and a match amplifier A and a driver B which are coupled to the entry.

As illustrated in FIG. 13, the match amplifier A is the same as the match amplifier A of the match amplifier A illustrated in FIG. 3. The latch circuit 181 latches an output of the match amplifier A according to the search clock sclk<3>.

The driver B (182) comprises a logical addition circuit OR182 and a P-channel MOS transistor TR180. The logical addition circuit OR182 outputs a logical addition of a delayed block-A search determination signal maoa_n_lat outputted by the latch circuit 181, and an inverted pre-charge signal /MLPREB. The P-channel MOS transistor TR180 has a source coupled to the VDD voltage, a gate coupled to an output of the logical addition circuit OR182, and a drain coupled to the match line MLB.

When the inverted pre-charge signal /MLPREB is activated to an L level, and when the delayed block-A search determination signal maoa_n_lat is at an L level (indicating Hit), the match line MLB is pre-charged to the VDD voltage by the driver B (182).

The driver B (182) comprises a logical product circuit AND182 and an N-channel MOS transistor TR181. The logical product circuit AND182 outputs a logical product of a delayed block-A search determination signal maoa_n_lat outputted by the latch circuit 181, and an inverted signal of the inverted pre-charge signal /MLPREB. The N-channel MOS transistor TR181 has a source coupled to the ground power supply, a gate coupled to an output of the logical product circuit AND182, and a drain coupled to the match line MLB.

When the inverted pre-charge signal /MLPREB is activated to an L level, and when the delayed block-A search determination signal maoa_n_lat is at an H level (indicating Miss), the match line MLB is discharged to 0V by the driver B (182).

Figure 14:
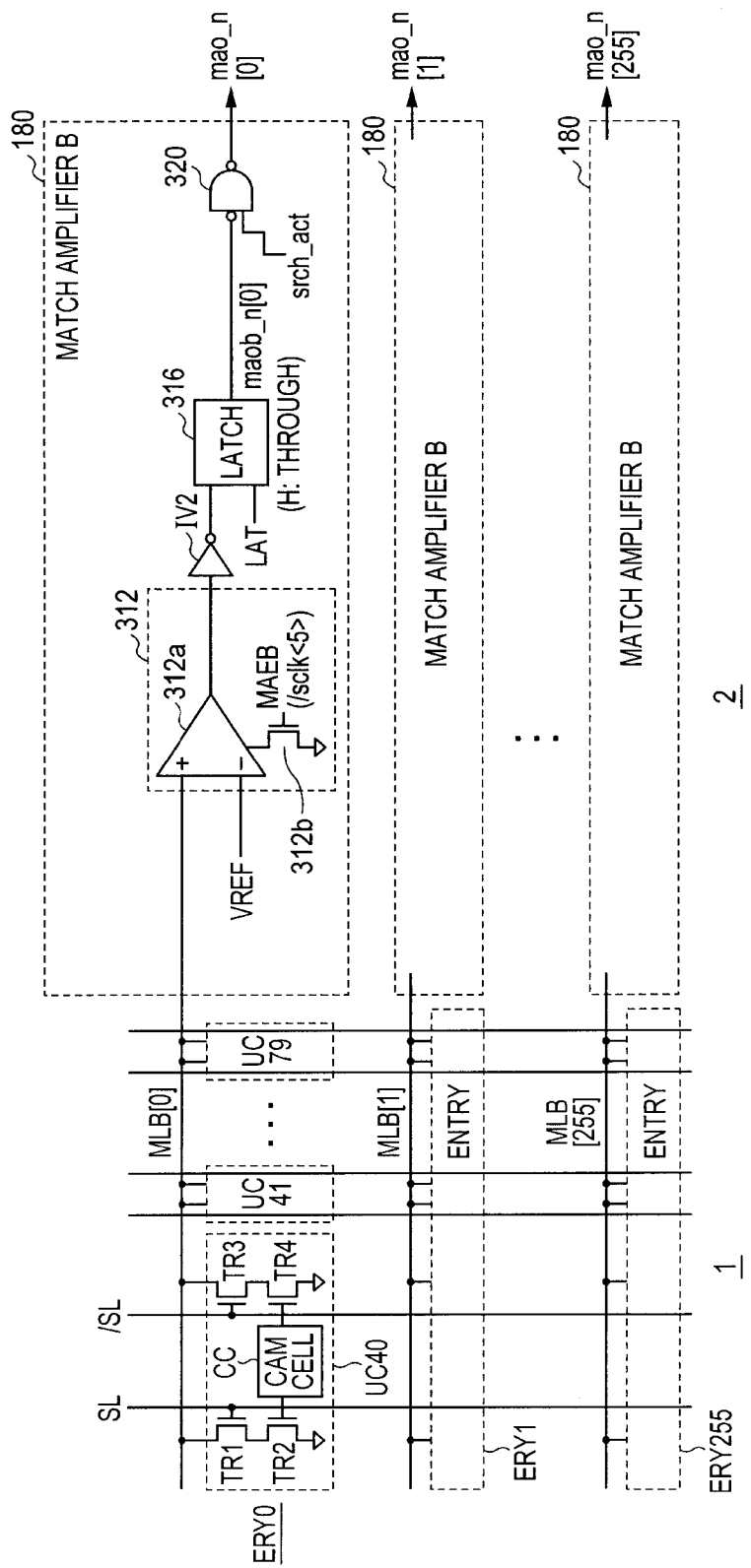
FIG. 14 is a drawing illustrating a configuration of an entry of a memory array B and a match amplifier B coupled to the entry.

(Entry of block B) FIG. 14 illustrates a configuration of an entry of a memory array B and a match amplifier B coupled to the entry.

As illustrated in FIG. 14, the match amplifier B comprises a match amplifier circuit 312, an inverter IV2, a latch circuit 316, and an inverted logical product circuit 320.

The match amplifier circuit 312 comprises a differential amplifier 312a to which a voltage of the match line MLB and the reference voltage VREF are inputted, and an N-channel MOS transistor 312b for coupling the differential amplifier 312a to the ground power supply. The match amplifier circuit 312a amplifies a difference voltage of a voltage of the match line MLB and the reference voltage VREF, when the match amplifier activation signal MAEB is activated to an H level.

The inverter IV2 inverts an output of the match amplifier circuit 312, and outputs it to the latch circuit 316. According to the match amplifier activation signal MAEB, the latch circuit 316 latches an output of the inverter IV2, and outputs the block-B search determination signal maob_n. The block-B search determination signal maob_n turns to an L level when all the unit cells UC of the corresponding entry of the memory array B are of Hit, and turns to an H level when at least one unit cell UC is of Miss.

The inverted logical product circuit 320 outputs an inverted logical product of an inverted signal of the block-B search determination signal maob_n and the search activation signal srch_act, as a search determination signal mao_n. The search determination signal mao_n turns to an L level (indicating Hit), only when the search activity signal srch_act is at an H level (at least one entry of the block A is of Hit) and the block-B search determination signal maob_n is at an L level (an entry of the block B is of Hit).

Figure 15:
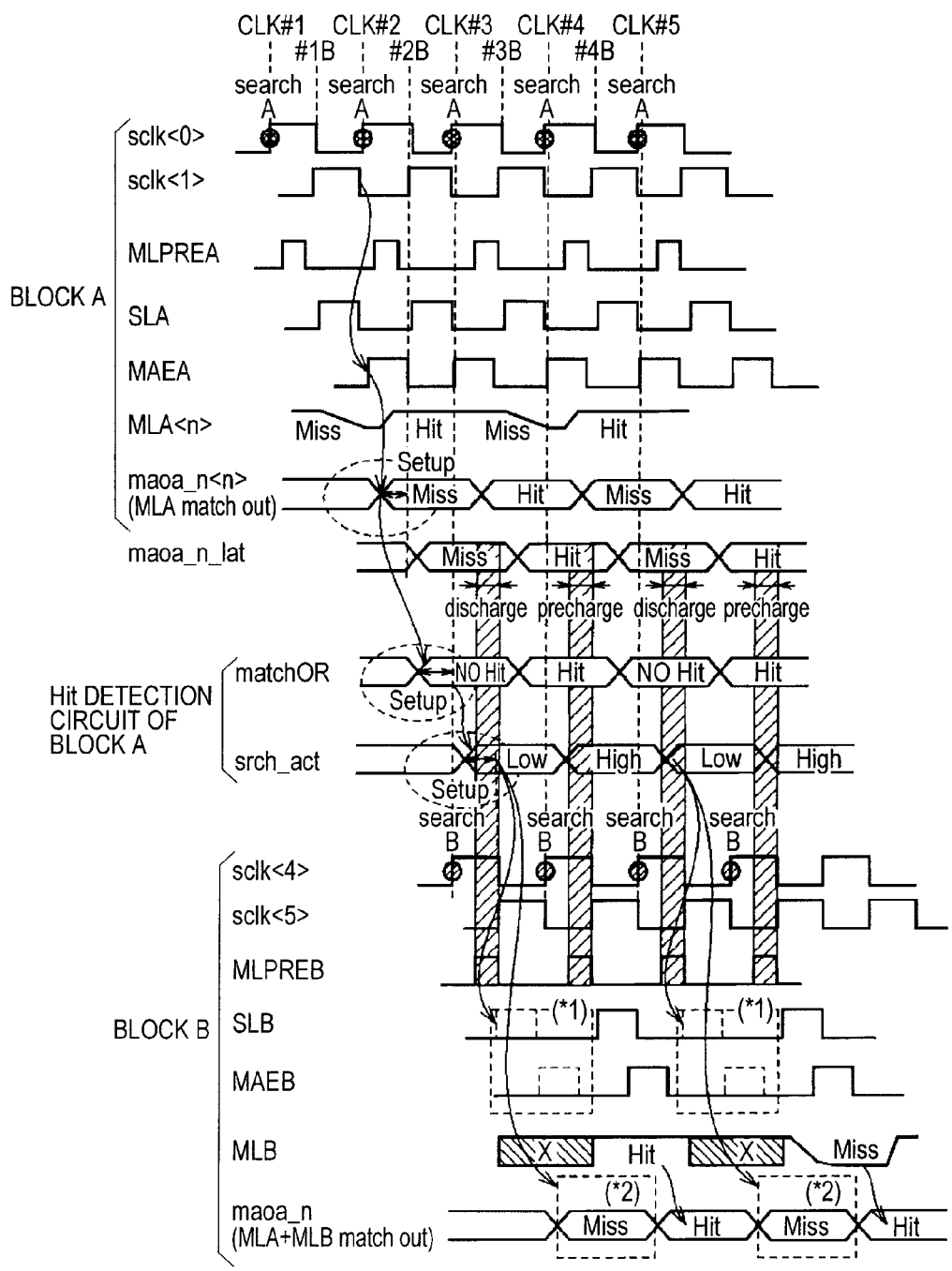
FIG. 15 is a drawing illustrating operating waveforms of the content addressable memory device according to Embodiment 2.

(Operation) FIG. 15 illustrates operating waveforms of the content addressable memory device according to Embodiment 2.

As illustrated in FIG. 15, first, the clock control circuit 200 changes the search clock sclk<0> to an H level, in response to the fact that the search command GSE has been activated at the timing of CLK#1 of the clock camclk. The block-A control circuit 205 activates the pre-charge signal MLPREA to an H level, according to the fact that the search clock sclk<0> has changed to an H level. The P-channel MOS transistor 214 pre-charges the match line MLA of the block A, according to the fact that the pre-charge signal MLPREA has been activated to an H level.

Next, the clock control circuit 200 changes the search clock sclk<1> to an H level at the timing of CLK#1B of the clock camclk. The search line driver activates the search line SLA of the block A, according to the fact that the search clock sclk<1> has changed to an H level.

Next, the clock control circuit 200 changes the search clock sclk<1> to an L level and changes the search clock sclk<2> to an H level, at the timing of CLK#2 of the clock camclk. The block-A control circuit 205 activates the match amplifier activation signal MAEA to an H level, according to the fact that the search clock sclk<1> has changed to an L level. The match amplifier circuit 212 amplifies a voltage of the match line MLA, according to the fact that the match amplifier activation signal MAEA has been activated to an H level. The latch circuit 216 latches an output of the match amplifier circuit 212, and outputs a block-A search determination signal maoa_n[0] (in the case of the 0th entry). When the block-A search determination signal maoa_n[0] is at an L level, it is meant that all the unit cells UC of the 0th entry of the block A are of Hit. When the block-A search determination signal maoa_n[0] is at an H level, it is meant that at least one unit cell UC of the 0th entry of the block A is of Miss. The block-A control circuit 205 activates the match amplifier activation signal MAEA to an H level for a prescribed time and then deactivates it to an L level. The search line SLA is deactivated by the search line driver of the block A after the match amplifier activation signal MAEA is activated. After the search line SLA is deactivated, the block-A control circuit 205 activates the pre-charge signal MLPREA to an H level. The P-channel MOS transistor 214 pre-charges the match line MLA of the block A, according to the fact that the pre-charge signal MLPREA has been activated to an H level (accordingly, an inverted pre-charge signal /MLPREA has been activated to an L level).

Next, the clock control circuit 200 changes the search clock sclk<3> to an H level at the timing of CLK#2B of the clock camclk. According to the fact that the search clock sclk<3> has changed to an H level, the match OR circuit 299 of the block-B activation control circuit 207 calculates an inverted logical product of the block-A search determination signals maoa_n<0>-maoa_n<255> which are outputted by the latch circuit 216 of all the entries of the block A, and outputs an inverted logical product signal match_or. When the inverted logical product signal match_or is at an H level, it is meant that all the unit cells UC are of Hit in at least one entry of the block A. When the inverted logical product signal match_or is at an L level, it is meant that at least one unit cell UC is of Miss in all the entries of the block A. The latch circuit 181 latches the block-A search determination signal maoa_n[0] outputted by the match amplifier circuit 212, according to the search clock sclk<3>, and outputs the delayed block-A search determination signal maoa_n_lat[0] (in the case of the 0th entry).

Next, the clock control circuit 200 changes the search clock sclk<4> to an H level at the timing of CLK#3 of the clock camclk. According to the fact that the search clock sclk has changed to an H level, the latch circuit 220 of the block-B activation control circuit 207 latches the inverted logical product signal match_or, and outputs it as the search activation signal srch_act to the block B. The block-B control circuit 210 activates the pre-charge signal MLPREB to an H level, according to the fact that the search clock sclk<4> has changed to an H level. The driver B discharges the match line MLB to 0V when the pre-charge signal MLPREB is activated to an H level and the delayed block-A search determination signal maoa_n_lat[0] is at an H level. That is, the match line MLB of each entry is discharged to 0V, when at least one unit cell UC of the same entry of the block A is of Miss. Accordingly, it is possible to notify the block B of the fact that the block A has been of Miss. The voltage of the match line MLB serves as a voltage indicative of Miss, even when the block B is of Hit.

On the other hand, the driver B pre-charges the match line MLB to VDD, when the pre-charge signal MLPREB is activated to an H level and the delayed block-A search determination signal maoa_n_lat[0] is at an L level. That is, when all the unit cells UC of the same entry of the block A are of Hit, the match line MLB is pre-charged to VDD.

Next, the clock control circuit 200 changes the search clock sclk<5> to an H level at the timing of CLK#3B of the clock camclk. When the search activation signal srch_act outputted from the block A is activated to an H level according to the fact that the search clock sclk<5> has changed to an H level, the search line driver of the block B activates the search line SLB of the block B. On the other hand, the search line driver of the block B does not activate the search line SLB of the block B, when the search activation signal srch_act is deactivated to an L level.

Next, the clock control circuit 200 changes the search clock sclk<5> to an L level at the timing of CLK#4 of the clock camclk. According to the fact that the search clock sclk<5> has changed to an L level, the block-B control circuit 210 activates the match amplifier activation signal MAEB to an H level, when the search activation signal srch_act outputted from the block A is activated to an H level. The match amplifier circuit 312 amplifies a voltage of the match line MLB, according to the fact that the match amplifier activation signal MAEB has been activated to an H level. The latch circuit 316 latches an output of the match amplifier circuit 312, and outputs the block-B search determination signal maob_n[0] (in the case of the 0th entry). When the block-B search determination signal maob_n[0] is at an L level, it is meant that all the unit cells UC of the 0th entry of the block A and the block B are of Hit. When the block-B search determination signal maob_n[0] is at an H level, it is meant that at least one unit cell UC of the 0th entry of the block A and the block B is of Miss.

The inverted logical product circuit 320 outputs an inverted logical product of the search activation signal srch_act and the inverted signal of the block-B search determination signal maob_n[0] outputted by the latch circuit 316, as the search determination signal mao_n. Only when all the unit cells UC of the 0th entry of the block A and the block B are of Hit and the search activation signal srch_act is at an H level (that is, all the unit cells UC in at least one entry of the block A are of Hit), the search determination signal mao_n[0] becomes at an L level indicating Hit.

On the other hand, the block-B control circuit 210 does not activate the match amplifier activation signal MAEB to an H level, when the search activation signal srch_act outputted from the block A is deactivated to an L level. In this case, the search determination signal mao_n[n] (n=0-255) of all the entries is set to an H level indicating Miss by the inverted logical product circuit 320.

The priority encoder 201 receives the search determination signals mao_n[0]-mao_n[255] from all the entries. The priority encoder 201 outputs an address of an entry of high priority among the entries which have outputted the search determination signal of an L level.

Figure 16:
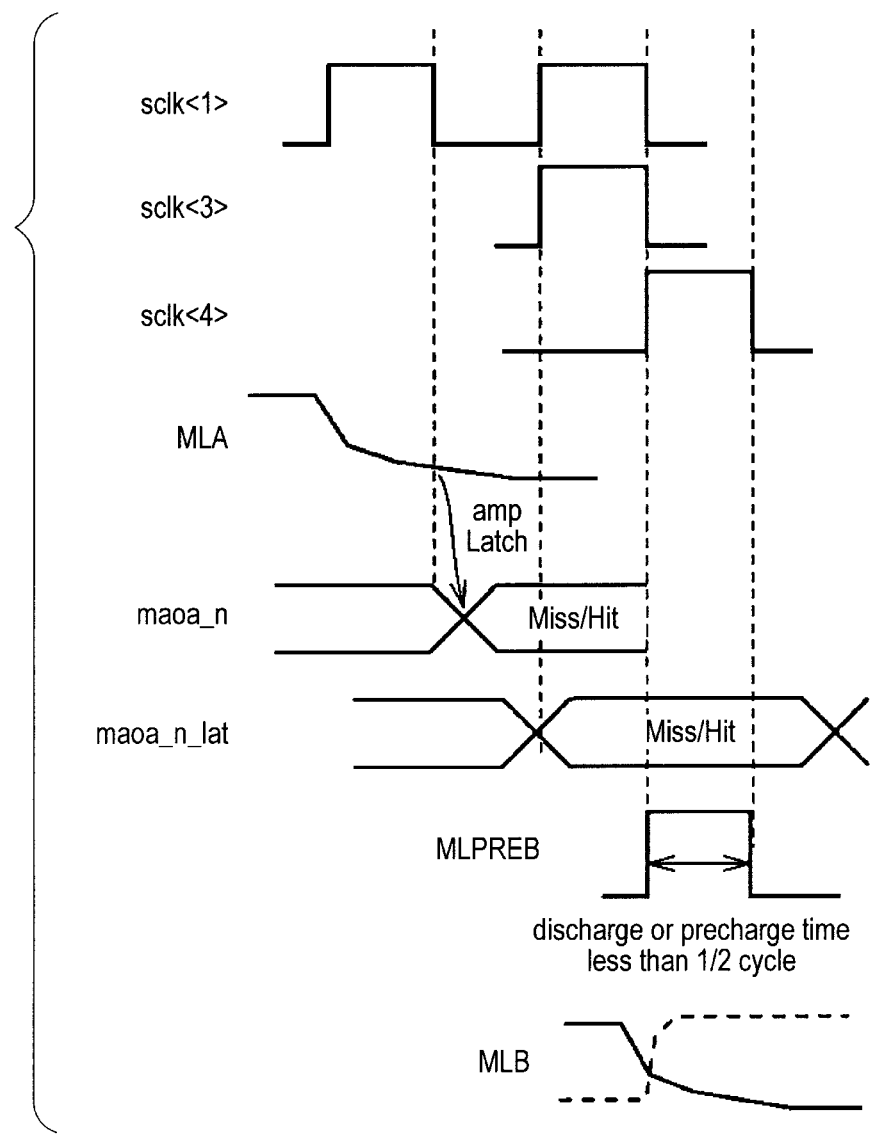
FIG. 16 is a drawing enlarging a part of the operating waveforms illustrated in FIG. 15.

FIG. 16 is a drawing enlarging a part of the operating waveforms illustrated in FIG. 15. Since the pre-charge signal MLPREB is activated to an H level based on the search clock sclk<4>, as illustrated in FIG. 16, it is sufficient for the match line MLB to be pre-charged or discharged in ½ cycle. Accordingly, it is possible to pre-charge or to discharge the match line MLB even when frequency of the clock camclk becomes high.

(Effects) As described above, the present embodiment adds a circuit which controls pre-charge of the match line of the memory array B using the search result for every entry of the memory array A. An entry of Hit of the memory array A pre-charges the match line of the same entry of the memory array B, and an entry of Miss of the memory array A does not pre-charge the match line of the same entry of the memory array B.

In the present embodiment, the memory array B is searched with a latency of two cycles after the memory array A is searched. Therefore, a problem that pre-charge control is becoming difficult due to speeding up in the previously existing technology is solved, and it becomes possible to make simultaneous pursuit of low power consumption and speeding up.

(Embodiment 3)

Figure 17:
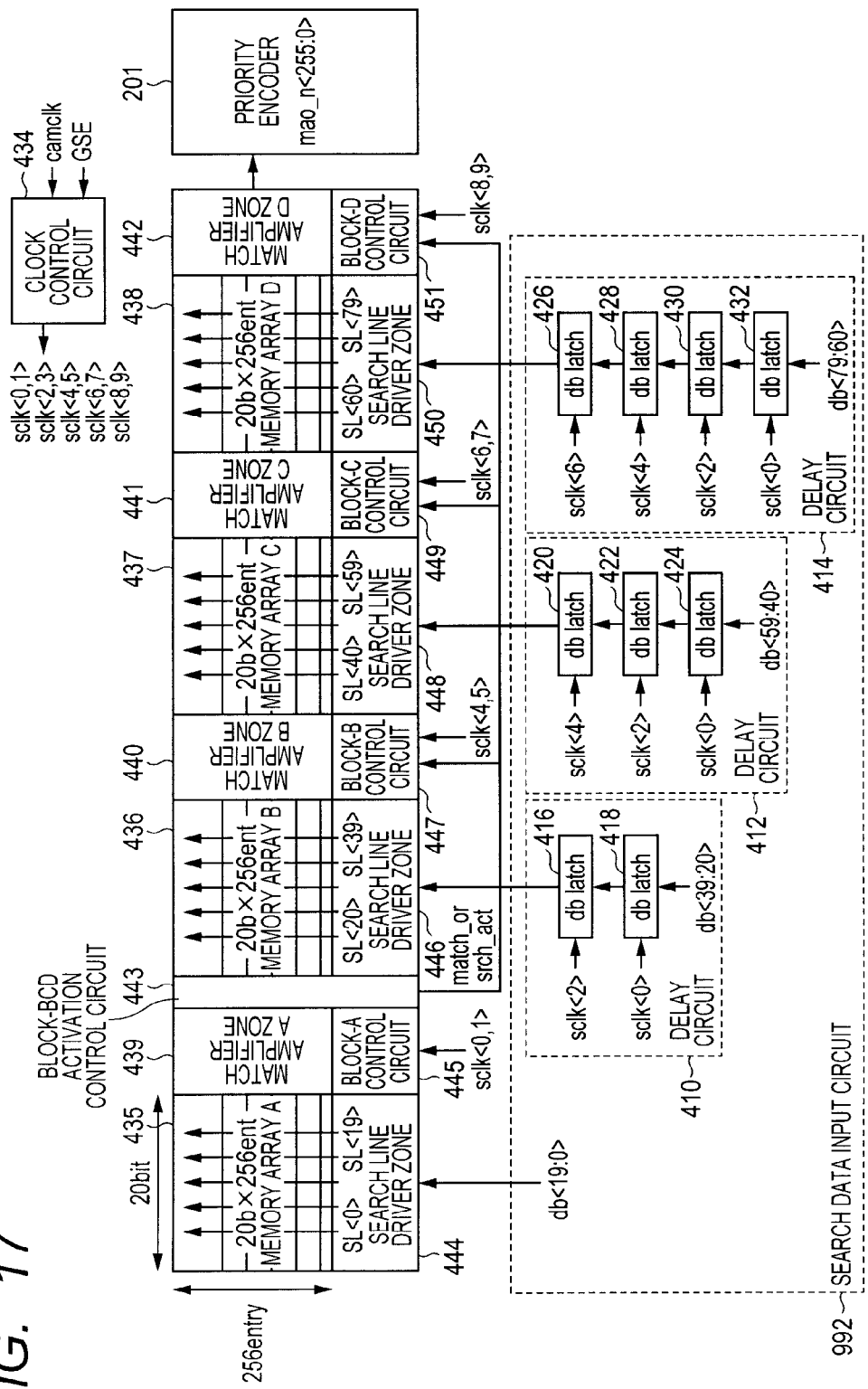
FIG. 17 is a drawing illustrating a configuration of a content addressable memory device according to Embodiment 3.

(Configuration) FIG. 17 illustrates a configuration of a content addressable memory device according to Embodiment 3.

As illustrated in FIG. 17, in the content addressable memory device according to Embodiment 3, searching is performed in units of block of blocks A, B, C, and D which are formed by dividing the basic array block (80 bits) into four blocks in units of 20 bits.

The block A comprises a memory array A, a match amplifier A zone 439 adjoining the memory array A in the row direction, a search line driver A zone 444 adjoining the memory array A in the column direction, a block-A control circuit 445 adjoining the match amplifier A zone 439 and the search line driver A zone 444, and a block-BCD activation control circuit 443 adjoining the match amplifier A zone 439 and the block-A control circuit 445 in the row direction.

The block B comprises a memory array B, a match amplifier B zone 440 adjoining the memory array B in the row direction, a search line driver B zone 446 adjoining the memory array B in the column direction, and a block-B control circuit 447 adjoining the match amplifier B zone 440 and the search line driver B zone 446.

The block C comprises a memory array C, a match amplifier C zone 441 adjoining the memory array C in the row direction, a search line driver C zone 448 adjoining the memory array C in the column direction, and a block-C control circuit 449 adjoining the match amplifier C zone 441 and the search line driver C zone 448.

The block D comprises a memory array D, a match amplifier D zone 442 adjoining the memory array D in the row direction, a search line driver D zone 450 adjoining the memory array D in the column direction, and a block-D control circuit 451 adjoining the match amplifier D zone 442 and the search line driver D zone 450.

The block-BCD activation control circuit 443 has the same configuration as the block-B activation control circuit 207 according to Embodiment 1, and outputs a search activation signal srch_act and an inverted logical product signal match_or to the blocks B, C, and D.

As is the case with the block B according to Embodiment 1, the blocks B, C, and D operate when the search activation signal srch_act is activated to an H level, and do not operate when the search activation signal srch_act is deactivated to an L level.

A delay circuit 410 which delays search data of the block B comprises a latch circuit 416 and a latch circuit 418. The latch circuit 418 latches search data db<39:20> from the exterior, according to the search clock sclk<0>. The latch circuit 416 latches an output of the latch circuit 418, according to the search clock sclk<2>.

A delay circuit 412 which delays search data of the block C comprises a latch circuit 424, a latch circuit 422, and a latch circuit 420. The latch circuit 424 latches search data db<59:40> from the exterior, according to the search clock sclk<0>. The latch circuit 422 latches an output of the latch circuit 424, according to the search clock sclk<2>. The latch circuit 420 latches an output of the latch circuit 422, according to the search clock sclk<4>.

A delay circuit 414 which delays search data of the block D comprises a latch circuit 432, a latch circuit 430, a latch circuit 428, and a latch circuit 426.

The latch circuit 432 latches search data db<79:60> from the exterior, according to the search clock sclk<0>. The latch circuit 430 latches an output of the latch circuit 432, according to the search clock sclk<2>. The latch circuit 428 latches an output of the latch circuit 430, according to the search clock sclk<4>. The latch circuit 426 latches an output of the latch circuit 428, according to the search clock sclk<6>.

The search line driver A zone 444, the search line driver B zone 446, the search line driver C zone 448, and the search line driver D zone 450 have the same function as the search line driver A zone and the search line driver B zone according to Embodiment 1.

The block-A control circuit 445, the block-B control circuit 447, the block-C control circuit 449, and the block-D control circuit 451 have the same configuration as the block-A control circuit 205 and the block-B control circuit 210 according to Embodiment 1.

The match amplifier A, the match amplifier B, and the match amplifier C have the same configuration as the match amplifier A according to Embodiment 1.

Figure 18:
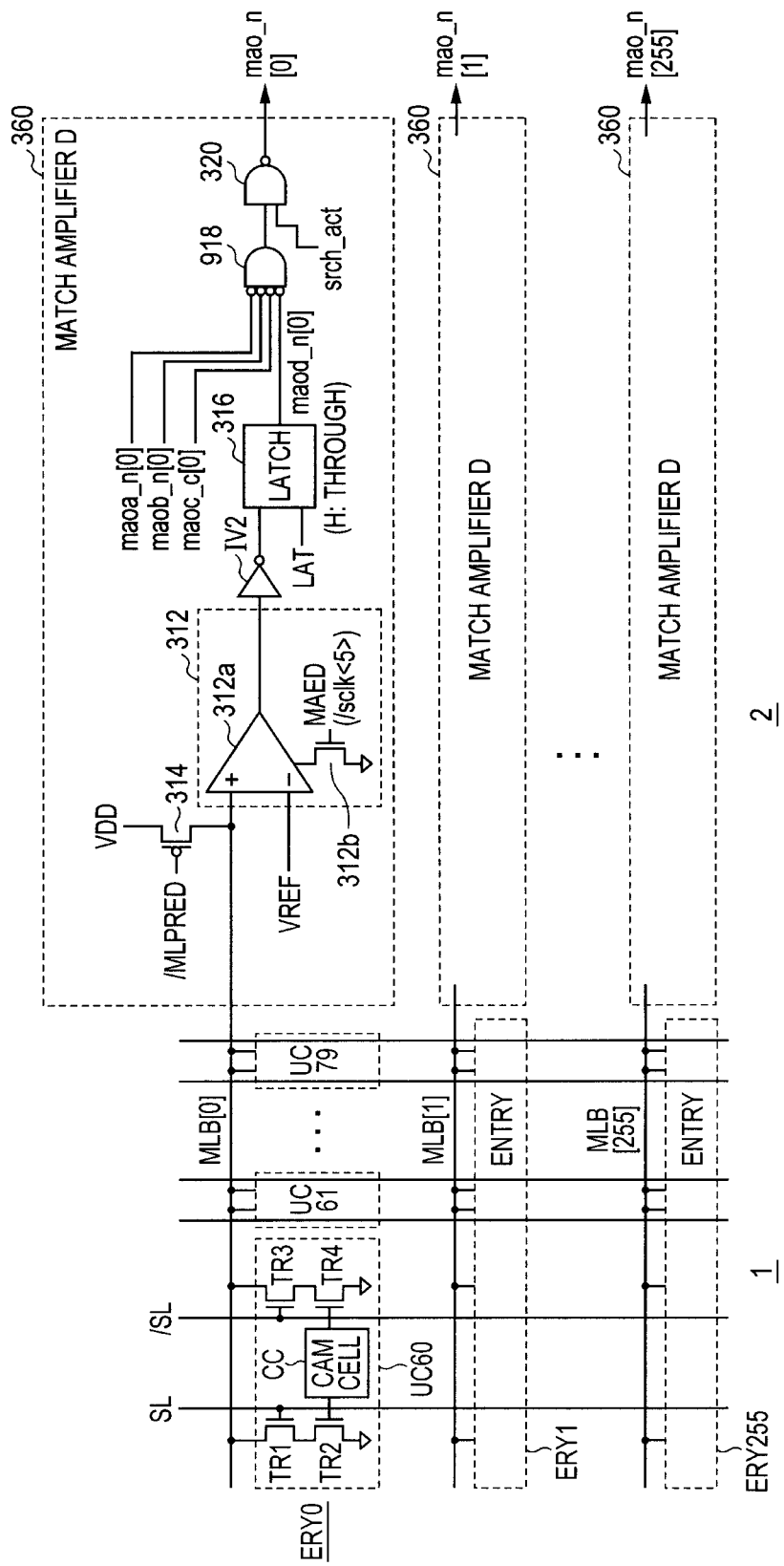
FIG. 18 is a drawing illustrating a configuration of a match amplifier D of a block D.

FIG. 18 illustrates a configuration of the match amplifier D of the block D. As illustrated in FIG. 18, the match amplifier D according to Embodiment 3 is different from the match amplifier B according to Embodiment 1 with respect to the inverted logical addition circuit 918.

The inverted logical addition circuit 918 outputs an inverted logical addition of a block-A search determination signal maoa_n[0], a block-B search determination signal maob_n[0], a block-C search determination signal maoc_n[0], and a block D search determination signal maod_n[0].

Figure 19:
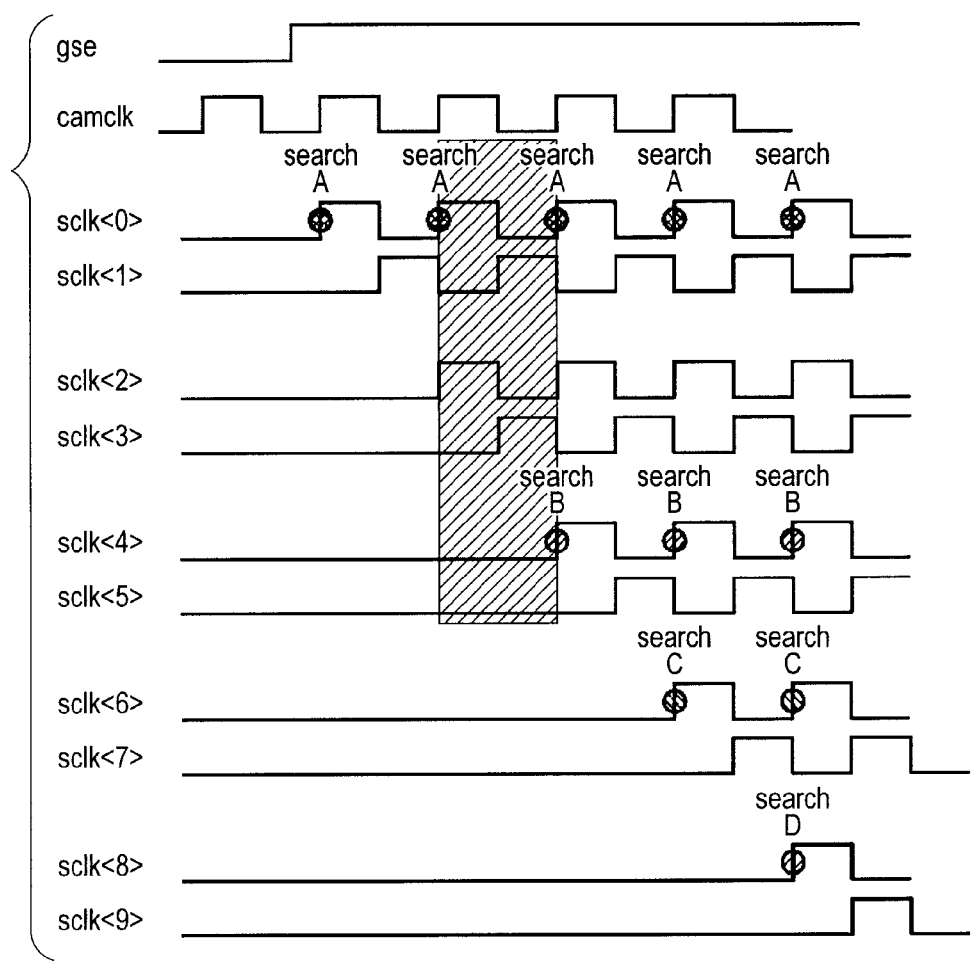
FIG. 19 is a drawing for explaining search timing of blocks A-D according to Embodiment 3.

(Search timing) FIG. 19 is a drawing for explaining search timing of the blocks A-D according to Embodiment 3.

As illustrated in FIG. 19, the clock control circuit 434 generates the search clocks sclk<0>-sclk<9> based on the clock camclk, when the search command GSE is activated to an H level. The block A performs searching at the timing of rising of the search clock sclk<0>. The block B performs searching at the timing of rising of the search clock sclk<4> which is delayed by two cycles from the search clock sclk<0>. The block C performs searching at the timing of rising of the search clock sclk<6> which is delayed by one cycle from the search clock sclk<4>. The block D performs searching at the timing of rising of the search clock sclk<8> which is delayed by one cycle from the search clock sclk<6>.

(Effects) As described above, according to the present embodiment, it is possible to attain speeding up, by dividing the basic array block into four blocks, and performing searching in units of the divided blocks. According to the present embodiment, the search activity of the second-stage block, the third-stage block, and the fourth-stage block is controlled, depending on the search result of the first-stage block. Therefore, it is possible to reduce the consumption current to the maximum of about ¼.

(Embodiment 4)

Figure 20:
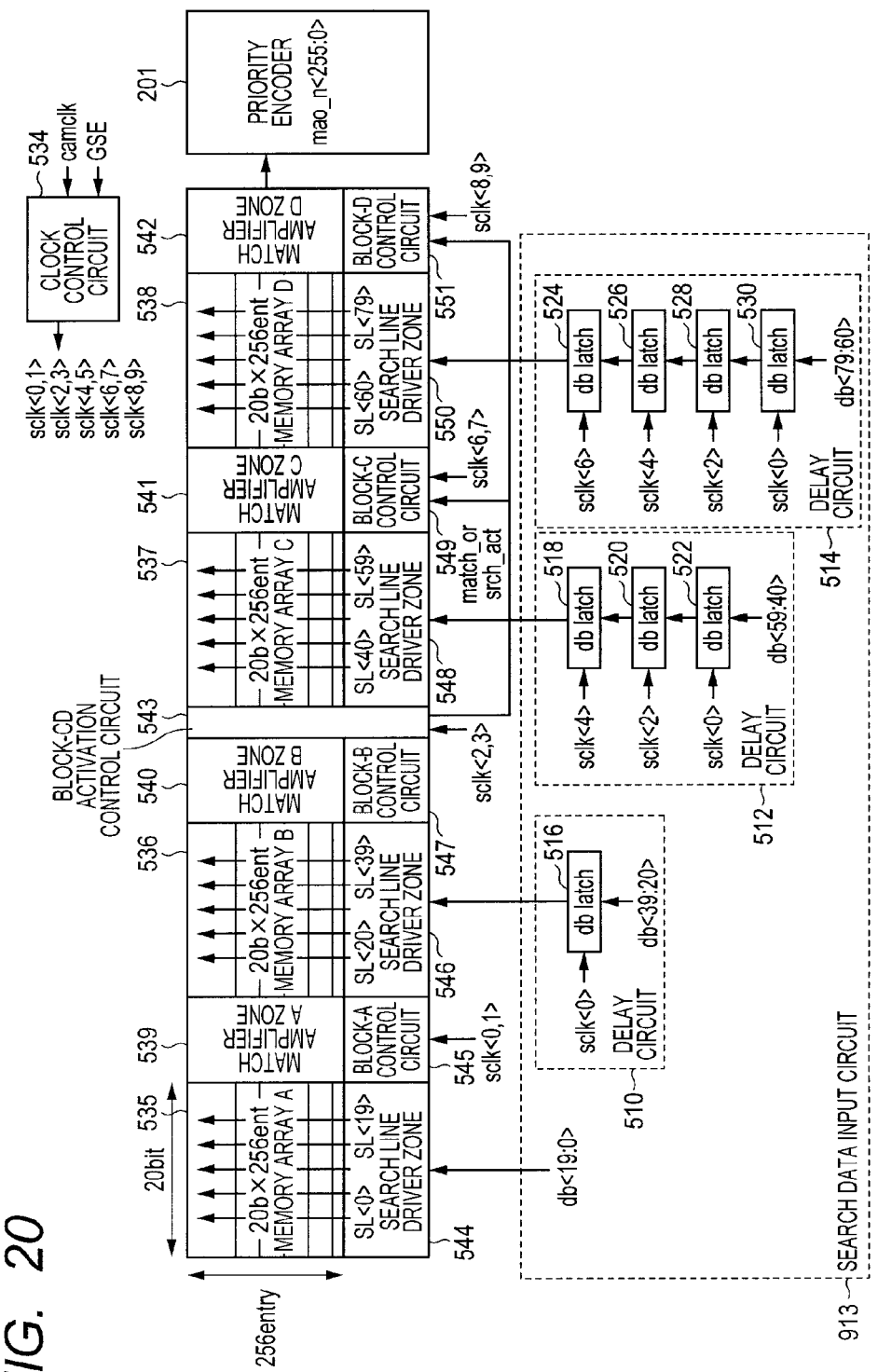
FIG. 20 is a drawing illustrating a configuration of a content addressable memory device according to Embodiment 4.

(Configuration) FIG. 20 illustrates a configuration of a content addressable memory device according to Embodiment 4.

As illustrated in FIG. 20, in the content addressable memory device according to Embodiment 4, searching is performed in units of block of blocks A, B, C, and D which are formed by dividing the basic array block (80 bits) into four blocks in units of 20 bits.

The block A comprises a memory array A, a match amplifier A zone adjoining the memory array A in the row direction, a search line driver A zone adjoining the memory array A in the column direction, and a block-A control circuit 545 adjoining the match amplifier A zone and the search line driver A zone.

The block B comprises a memory array B, a match amplifier B zone adjoining the memory array B in the row direction, a search line driver B zone adjoining the memory array B in the column direction, a block-B control circuit 547 adjoining the match amplifier B zone and the search line driver B zone, and a block-CD activation control circuit 543 adjoining the match amplifier B zone and the block-B control circuit 547 in the row direction.

The block C comprises a memory array C, a match amplifier C zone adjoining the memory array C in the row direction, a search line driver C zone adjoining the memory array C in the column direction, and a block-C control circuit 549 adjoining the match amplifier C zone and the search line driver C zone.

The block D comprises a memory array D, a match amplifier D zone adjoining the memory array D in the row direction, a search line driver D zone adjoining the memory array D in the column direction, and a block-D control circuit 551 adjoining the match amplifier D zone and the search line driver D zone.

The block-CD activation control circuit 543 has the same configuration as the block-B activation control circuit 207 according to Embodiment 1, and outputs the inverted logical product signal match_or and the search activation signal srch_act to the blocks C and D.

As is the case with the block B according to Embodiment 1, the block C and the block D operate when the search activation signal srch_act is activated to an H level, and do not operate when the search activation signal srch_act is deactivated to an L level.

A delay circuit 510 which delays the search data of the block B comprises a latch circuit 516. The latch circuit 516 latches search data db<39:20> from the exterior, according to the search clock sclk<0>.

A delay circuit 512 which delays search data of the block C comprises a latch circuit 522, a latch circuit 520, and a latch circuit 518. The latch circuit 522 latches search data db<59:40> from the exterior, according to the search clock sclk<0>. The latch circuit 520 latches an output of the latch circuit 522, according to the search clock sclk<2>. The latch circuit 518 latches an output of the latch circuit 520, according to the search clock sclk<4>.

A delay circuit 514 which delays search data of the block D comprises a latch circuit 530, a latch circuit 528, a latch circuit 526, and a latch circuit 524. The latch circuit 530 latches search data db<79:60> from the exterior, according to the search clock sclk<0>. The latch circuit 528 latches an output of the latch circuit 530, according to the search clock sclk<2>. The latch circuit 526 latches an output of the latch circuit 528, according to the search clock sclk<4>. The latch circuit 524 latches an output of the latch circuit 526, according to the search clock sclk<6>.

The match amplifier A, the match amplifier B, and the match amplifier C have the same configuration as the match amplifier A according to Embodiment 1. The match amplifier D has the same configuration as the match amplifier D according to Embodiment 3, illustrated in FIG. 17.

Figure 21:
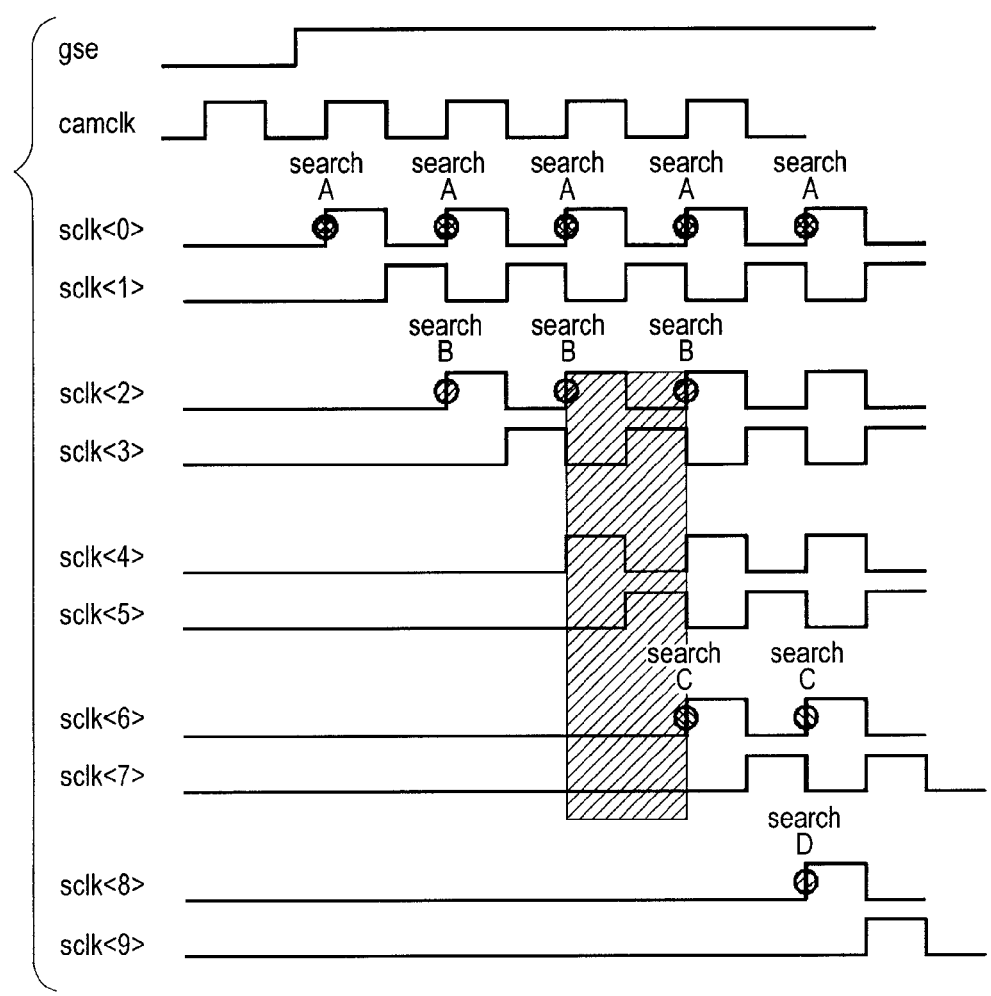
FIG. 21 is a drawing for explaining search timing of blocks A-D according to Embodiment 4.

(Search timing) FIG. 21 is a drawing for explaining search timing of the blocks A-D according to Embodiment 4.

As illustrated in FIG. 21, the clock control circuit 534 generates the search clocks sclk<0>-sclk<9> based on the clock camclk, when the search command GSE is activated to an H level. The block A performs searching at the timing of rising of the search clock sclk<0>. The block B performs searching at the timing of rising of the search clock sclk<2> which is delayed by one cycle from the search clock sclk<0>. The block C performs searching at the timing of rising of the search clock sclk<6> which is delayed by two cycles from the search clock sclk<2>. The block D performs searching at the timing of rising of the search clock sclk<8> which is delayed by one cycle from the search clock sclk<6>.

(Effects) As described above, according to the present embodiment, it is possible to attain speeding up, by dividing the basic array block into four blocks, and performing searching in units of the divided blocks. According to the present embodiment, the search activity of the third-stage block and the fourth-stage block is controlled, depending on the search results of the first-stage block and the second-stage block. Therefore, it is possible to reduce the consumption current to the maximum of about ½.

(Embodiment 5)

Figure 22:
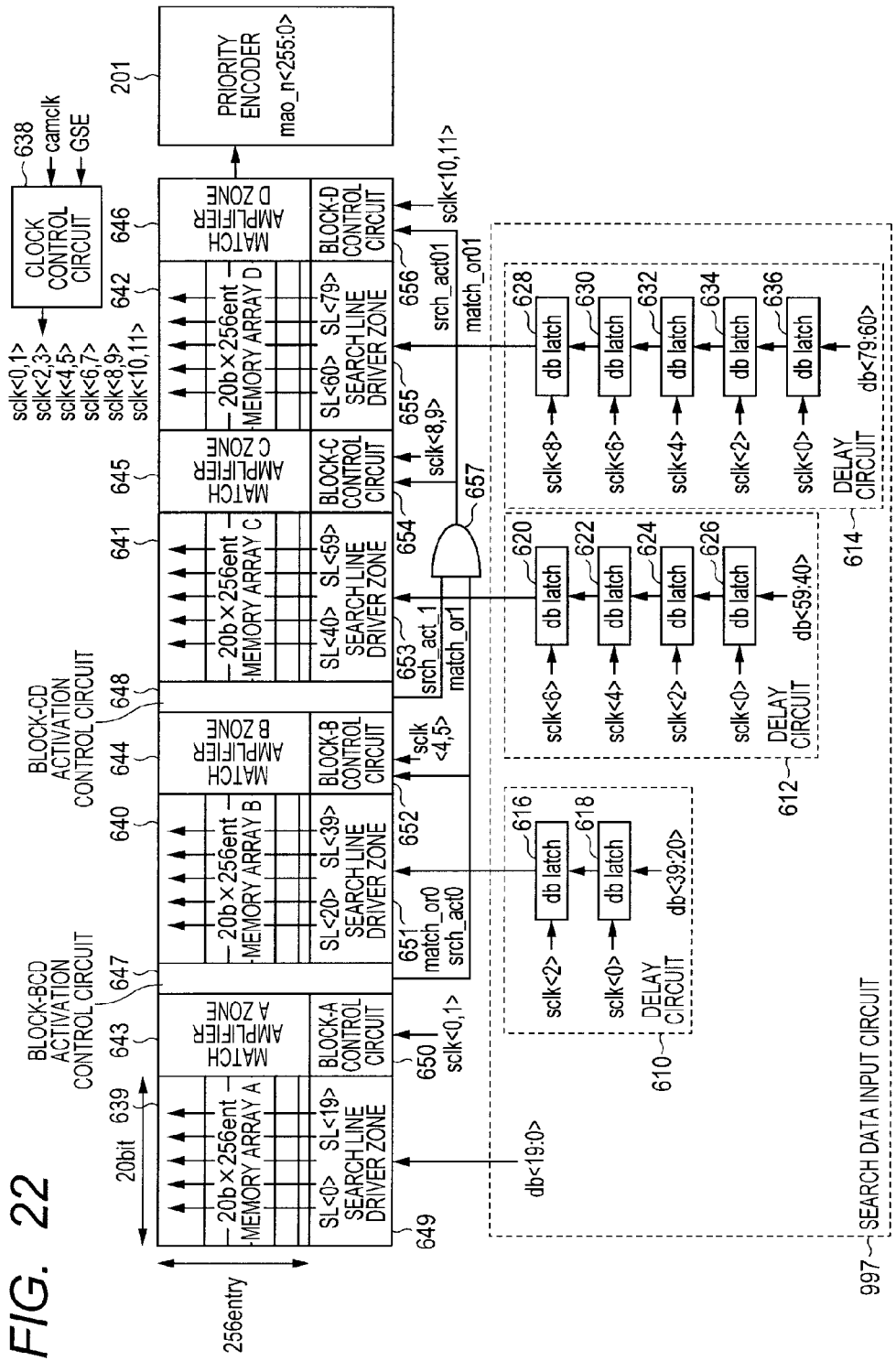
FIG. 22 is a drawing illustrating a configuration of a content addressable memory device according to Embodiment 5.

(Configuration) FIG. 22 illustrates a configuration of a content addressable memory device according to Embodiment 5.

As illustrated in FIG. 22, in the content addressable memory device according to Embodiment 5, searching is performed in units of block of blocks A, B, C, and D which are formed by dividing the basic array block (80 bits) into four blocks in units of 20 bits.

The block A comprises a memory array A, a match amplifier A zone adjoining the memory array A in the row direction, a search line driver A zone adjoining the memory array A in the column direction, a block-A control circuit 650 adjoining the match amplifier A zone and the search line driver A zone, and a block-BCD activation control circuit 647 adjoining the match amplifier A zone and the block-A control circuit 650 in the row direction.

The block B comprises a memory array B, a match amplifier B zone adjoining the memory array B in the row direction, a search line driver B zone adjoining the memory array B in the column direction, a block-B control circuit 652 adjoining the match amplifier B zone and the search line driver B zone, and a block-CD activation control circuit 648 adjoining the match amplifier B zone and the block-B control circuit 652 in the row direction.

The block C comprises a memory array C, a match amplifier C zone adjoining the memory array C in the row direction, a search line driver C zone adjoining the memory array C in the column direction, and a block-C control circuit 654 adjoining the match amplifier C zone and the search line driver C zone.

The block D comprises a memory array D, a match amplifier D zone adjoining the memory array D in the row direction, a search line driver D zone adjoining the memory array D in the column direction, and a block-D control circuit 656 adjoining the match amplifier D zone and the search line driver D zone.

The block-BCD activation control circuit 647 has the same configuration as the block-B activation control circuit 207 according to Embodiment 1, and outputs the search activation signal srch_act0 and the inverted logical product signal match_or0 to the block B, as well as to a logical product circuit 657.

The block-CD activation control circuit 648 has the same configuration as the block-B activation control circuit 207 according to Embodiment 1, and outputs the search activation signal srch_act1 and the inverted logical product signal match_or1 to the logical product circuit 657.

The logical product circuit 657 outputs, to the blocks C and D, a search activation signal srch_act01 that is a logical product of the search activation signal srch_act0 and the search activation signal srch_act1, and an inverted logical product signal match_or01 that is a logical product of the inverted logical product signal match_or0 and the inverted logical product signal match_or1.

As is the case with the block B according to Embodiment 1, the block B operates when the search activation signal srch_act0 is activated to an H level, and does not operate when the search activation signal srch_act1 is deactivated to an L level.

As is the case with the block B according to Embodiment 1, the block C and the block D operate when the search activation signal srch_act01 is activated to an H level (that is when the search activation signal srch_act0 and the search activation signal srch_act1 are both activated to an H level), and do not operate when the search activation signal srch_act01 is deactivated to an L level.

A delay circuit 610 which delays search data of the block B comprises a latch circuit 618 and a latch circuit 616. The latch circuit 618 latches search data db<39:20> from the exterior, according to the search clock sclk<0>. The latch circuit 616 latches an output of the latch circuit 618, according to the search clock sclk<2>.

A delay circuit 612 which delays search data of the block C comprises a latch circuit 626, a latch circuit 624, a latch circuit 622, and a latch circuit 620. The latch circuit 626 latches search data db<59:40> from the exterior, according to the search clock sclk<0>. The latch circuit 624 latches an output of the latch circuit 626, according to the search clock sclk<2>. The latch circuit 622 latches an output of the latch circuit 624, according to the search clock sclk<4>. The latch circuit 620 latches an output of the latch circuit 622, according to the search clock sclk<6>.

A delay circuit 614 which delays search data of the block D comprises a latch circuit 636, a latch circuit 634, a latch circuit 632, a latch circuit 630, and a latch circuit 628.

The latch circuit 636 latches search data db<79:60> from the exterior, according to the search clock sclk<0>. The latch circuit 634 latches an output of the latch circuit 636, according to the search clock sclk<2>. The latch circuit 632 latches an output of the latch circuit 634, according to the search clock sclk<4>. The latch circuit 630 latches an output of the latch circuit 632, according to the search clock sclk<6>. The latch circuit 628 latches an output of the latch circuit 630, according to the search clock sclk<8>.

The match amplifier A, the match amplifier B, and the match amplifier C have the same configuration as the match amplifier A according to Embodiment 1. The match amplifier D has the same configuration as the match amplifier D according to Embodiment 3, illustrated in FIG. 17.

Figure 23:
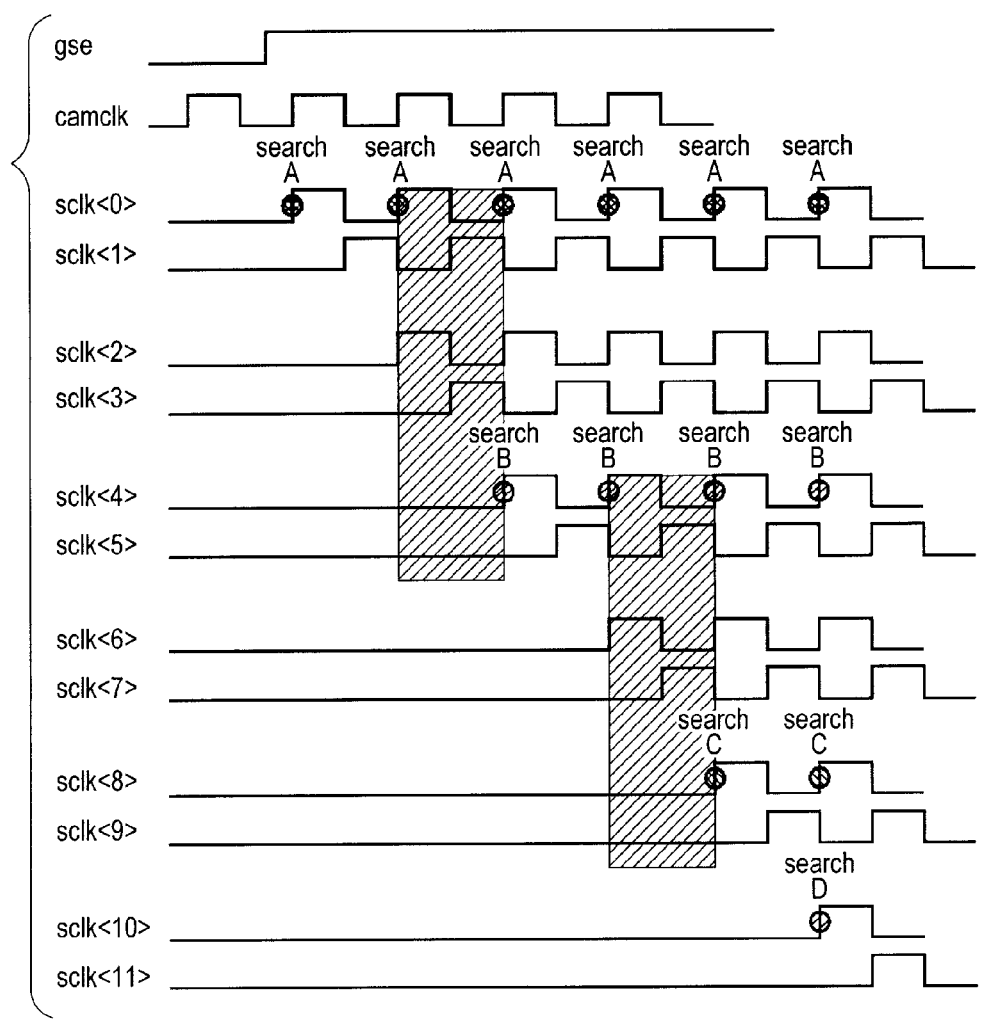
FIG. 23 is a drawing for explaining search timing of blocks A-D according to Embodiment 5.

(Search timing) FIG. 23 is a drawing for explaining search timing of the blocks A-D according to Embodiment 5.

As illustrated in FIG. 23, the clock control circuit 638 generates the search clock sclk<0>-sclk<11> based on the clock camclk, when the search command GSE is activated to an H level. The block A performs searching at the timing of rising of the search clock sclk<0>. The block B performs searching at the timing of rising of the search clock sclk<4> which is delayed by two cycles from the search clock sclk<0>. The block C performs searching at the timing of rising of the search clock sclk<8> which is delayed by two cycles from the search clock sclk<4>. The block D performs searching at the timing of rising of the search clock sclk<10> which is delayed by one cycle from the search clock sclk<8>.

(Effects) As described above, according to the present embodiment, it is possible to attain speeding up, by dividing the basic array block into four blocks, and performing searching in units of the divided blocks. According to the present embodiment, the search activity of the second-stage block, the third-stage block, and the fourth-stage block is controlled, depending on the search result of the first-stage block, and the search activity of the third-stage block and the fourth-stage block is controlled, depending on the search results of the first-stage block and the second-stage block. Therefore, it is possible to reduce the consumption current to the maximum of about ¼.

(Embodiment 6)

Figure 24:
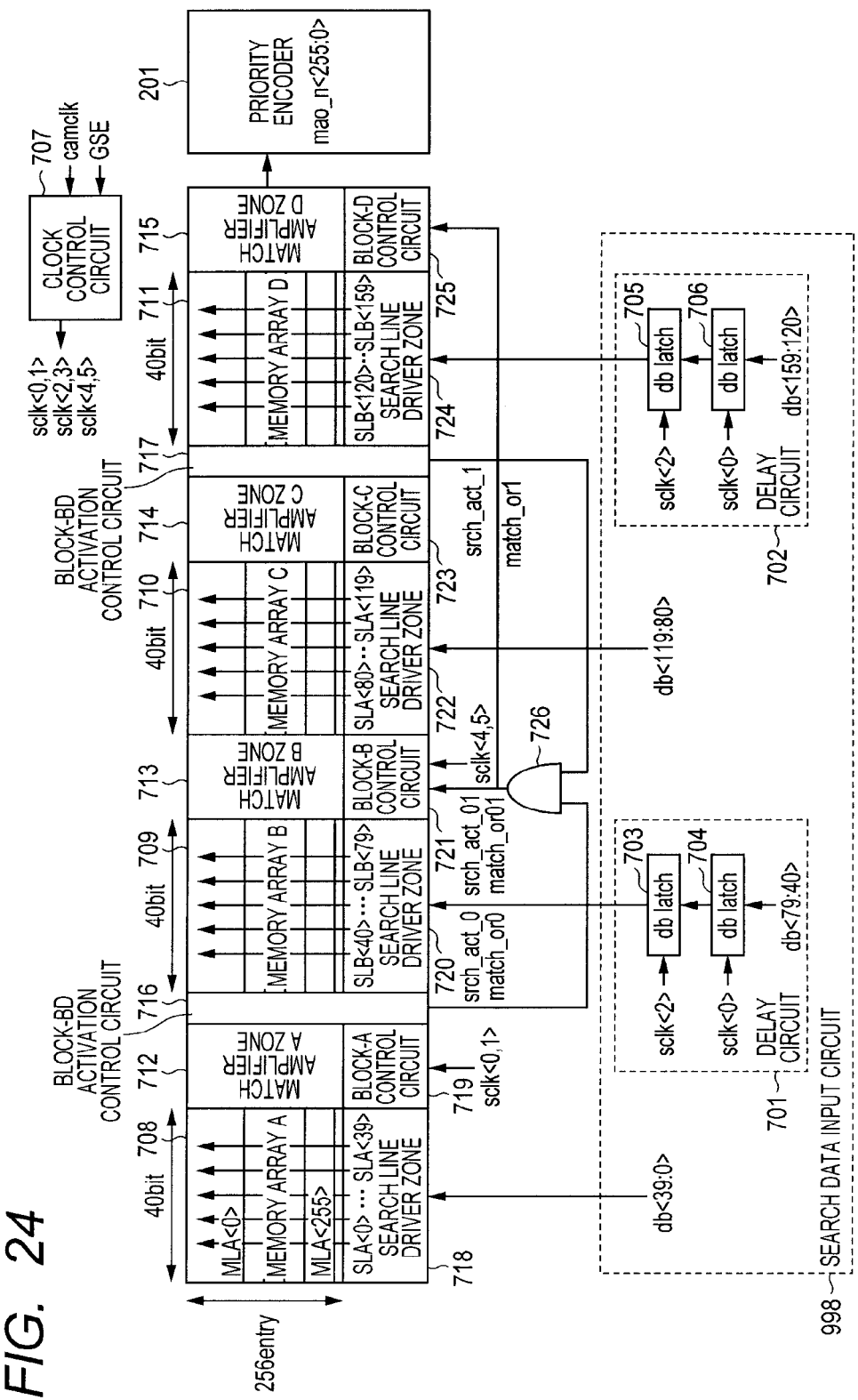
FIG. 24 is a drawing illustrating a configuration of a content addressable memory device according to Embodiment 6.

(Configuration) FIG. 24 illustrates a configuration of a content addressable memory device according to Embodiment 6.

As illustrated in FIG. 24, in the content addressable memory device according to Embodiment 6, searching is performed in units of block of blocks A, B, C, and D which are formed by dividing two basic array blocks (each basic array block: 80 bits) into four blocks in units of 40 bits.

The block A comprises a memory array A, a match amplifier A zone adjoining the memory array A in the row direction, a search line driver A zone adjoining the memory array A in the column direction, a block-A control circuit 719 adjoining the match amplifier A zone and the search line driver A zone, and a block-BD activation control circuit 716 adjoining the match amplifier A zone and the block-A control circuit 719 in the row direction.

The block B comprises a memory array B, a match amplifier B zone adjoining the memory array B in the row direction, a search line driver B zone adjoining the memory array B in the column direction, and a block-B control circuit 721 adjoining the match amplifier B zone and the search line driver B zone.

The block C comprises a memory array C, a match amplifier C zone adjoining the memory array C in the row direction, a search line driver C zone adjoining the memory array C in the column direction, a block-C control circuit 723 adjoining the match amplifier C zone and the search line driver C zone, and a block-BD activation control circuit 717 adjoining the match amplifier C zone and the block-C control circuit 723 in the row direction.

The block D comprises a memory array D, a match amplifier D zone adjoining the memory array D in the row direction, a search line driver D zone adjoining the memory array D in the column direction, and a block-D control circuit 725 adjoining the match amplifier D zone and the search line driver D zone.

The block-BD activation control circuit 716 has the same configuration as the block-B activation control circuit 207 according to Embodiment 1, and outputs a search activation signal srch_act0 and an inverted logical product signal match_or0 to the logical product circuit 726.

The block-BD activation control circuit 717 has the same configuration as the block-B activation control circuit 207 according to Embodiment 1, and outputs the search activation signal srch_act1 and the inverted logical product signal match_or1 to the logical product circuit 726.

The logical product circuit 726 outputs, to the blocks B and C, a search activation signal srch_act01 that is a logical product of the search activation signal srch_act0 and the search activation signal srch_act1, and an inverted logical product signal match_or01 that is a logical product of the inverted logical product signal match_or0 and the inverted logical product signal match_or1.

As is the case with the block B according to Embodiment 1, the block B and the block D operate when the search activation signal srch_act01 is activated to an H level (that is when the search activation signal srch_act0 and the search activation signal srch_act1 are both activated to an H level), and do not operate when the search activation signal srch_act01 is deactivated to an L level.

A delay circuit 701 which delays search data of the block B comprises a latch circuit 704 and a latch circuit 703. The latch circuit 704 latches the search data db<79:40> from the exterior, according to the search clock sclk<0>. The latch circuit 703 latches an output of the latch circuit 704, according to the search clock sclk<2>. A delay circuit 702 which delays search data of the block D comprises a latch circuit 706 and a latch circuit 705. The latch circuit 706 latches search data db<159:120> from the exterior, according to the search clock sclk<0>. The latch circuit 705 latches an output of the latch circuit 706, according to the search clock sclk<2>.

The match amplifier A, the match amplifier B, and the match amplifier C have the same configuration as the match amplifier A according to Embodiment 1. The match amplifier D has the same configuration as the match amplifier D according to Embodiment 3.

Figure 25:
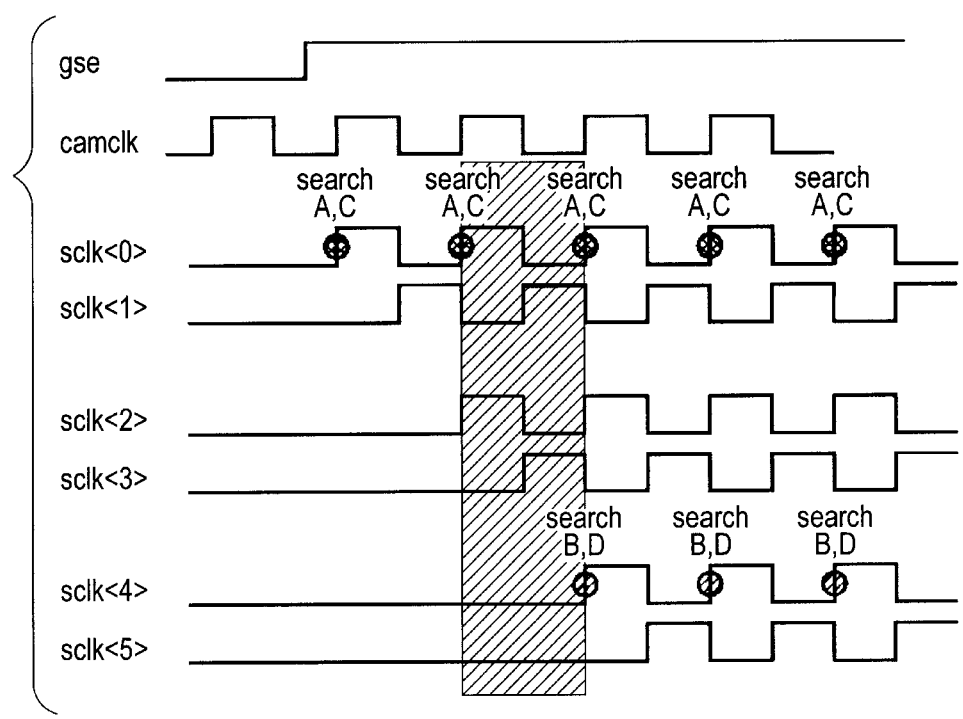
FIG. 25 is a drawing for explaining search timing of blocks A-D according to Embodiment 6.

(Search timing) FIG. 25 is a drawing for explaining search timing of the blocks A-D according to Embodiment 6.

As illustrated in FIG. 25, the clock control circuit 707 generates the search clock sclk<0>-sclk<5> based on the clock camclk, when the search command GSE is activated to an H level. The block A and the block C perform searching at the timing of rising of the search clock sclk<0>. The block B and the block D perform searching at the timing of rising of the search clock sclk<4> which is delayed by two cycles from the search clock sclk<0>.

(Effects) As described above, according to the present embodiment, it is possible to attain speeding up, by dividing each of two basic array blocks into two blocks, and performing searching in units of the divided blocks. According to the present embodiment, the search activity of two second-stage blocks is controlled, depending on the search result (logical product) of two first-stage blocks. Therefore, it is possible to reduce the consumption current to the maximum of about ½.

(Embodiment 7)

Figure 26:
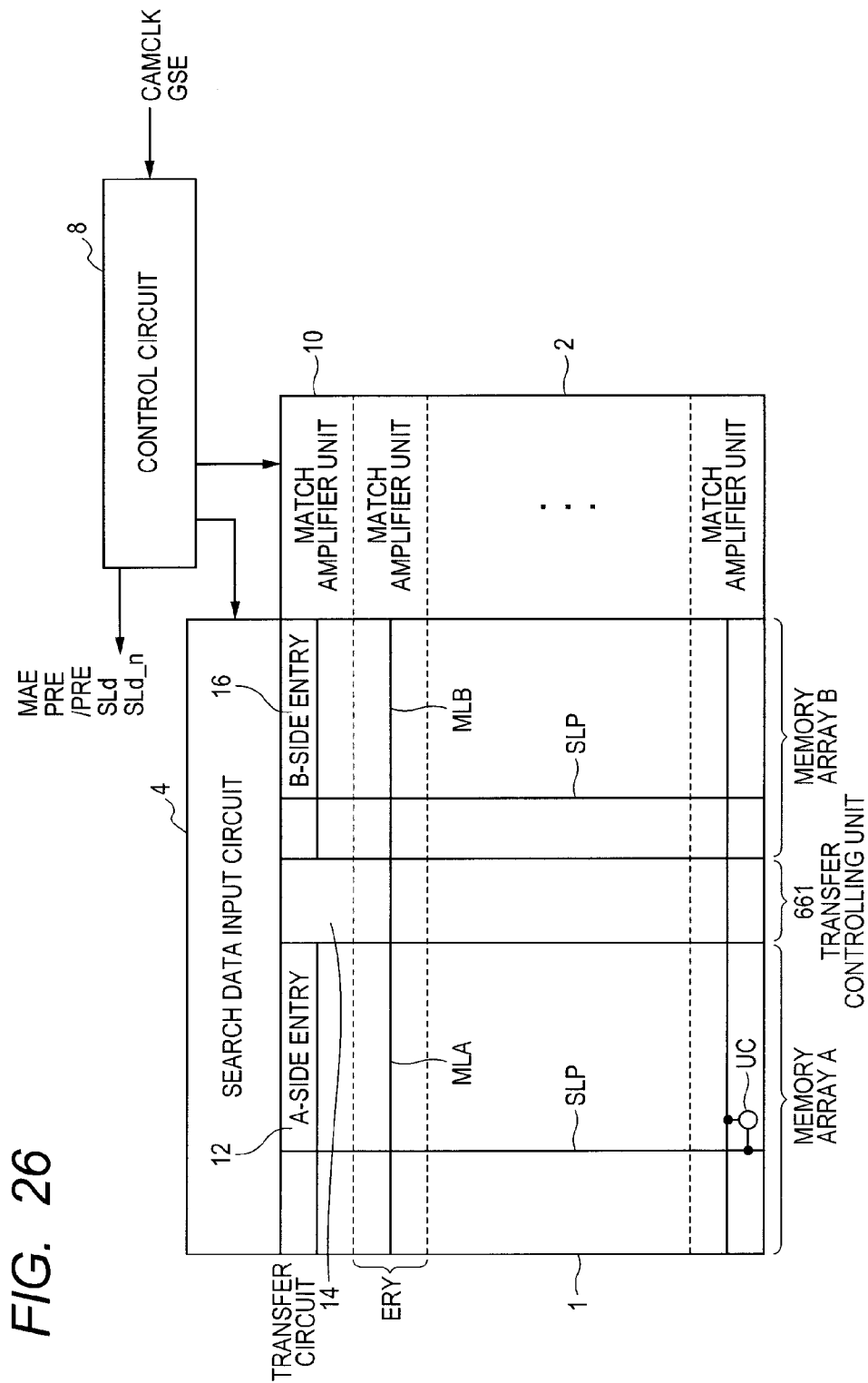
FIG. 26 is a drawing illustrating roughly an entire configuration of a content addressable memory device according to Embodiment 7.

(Configuration) FIG. 26 illustrates roughly an entire configuration of a content addressable memory device according to Embodiment 7.

As illustrated in FIG. 26, the content addressable memory device according to Embodiment 7 comprises a array block 1, a control circuit 8, and a search data input circuit 4.

The control circuit 8 controls the whole based on search data GSE and a clock camclk. At the same time, the control circuit 8 generates a pre-charge signal PRE, an inverted pre-charge signal /PRE, a search line activation signal SLd, an inverted search line activation signal SLd_n, and a match amplifier activation signal MAE.

The array block 1 (80 bits×256 entries) comprises a memory array A (the first half 40 bits×256 entries), a transfer controlling unit 661, a memory array B (the second half 40 bits×256 entries), and a coincidence determination unit 2.

The memory array A and the memory array B comprise a matrix of unit cells UC each of which serves as a content addressable memory cell (CAM cell).

The memory array A and the memory array B are divided into plural entries ERY in units of row. One entry ERY comprises unit cells UC of one row of the memory array A and the memory array B. One entry ERY is divided into an Aside entry including a unit cell UC belonging to the memory array A, and a B side entry including a unit cell UC belonging to the memory array B.

The A side entry is provided with a match line MLA to which plural unit cells UC belonging to the A side entry are coupled in parallel. Similarly, the B side entry is provided with a match line MLB to which plural unit cells UC belonging to the B side entry are coupled in parallel.

A search line pair SLP (SL, /SL) which transmits the search data is provided in the column direction of the memory array A and the memory array B. Unit cells UC are provided corresponding to cross points of the search line pair SLP and the match lines MLA and MLB.

The transfer controlling unit 661 comprises a transfer circuit 14 provided for every corresponding entry ERY. During the time of searching, the transfer circuit 14 separates the match line MLA provided in the A side entry ERY, from the match line MLB provided in the corresponding B side entry ERY, and transfers a voltage of the match line MLA to the match line MLB. Except for the time of searching, the transfer circuit 14 couples the match line MLA provided in the A side entry ERY to the match line MLB provided in the corresponding B side entry ERY.

The coincidence determination unit 2 comprises a match amplifier unit 10 provided corresponding to each B side entry ERY. The match amplifier unit 10 is coupled to the match line MLB of the corresponding B side entry ERY.

Figure 27:
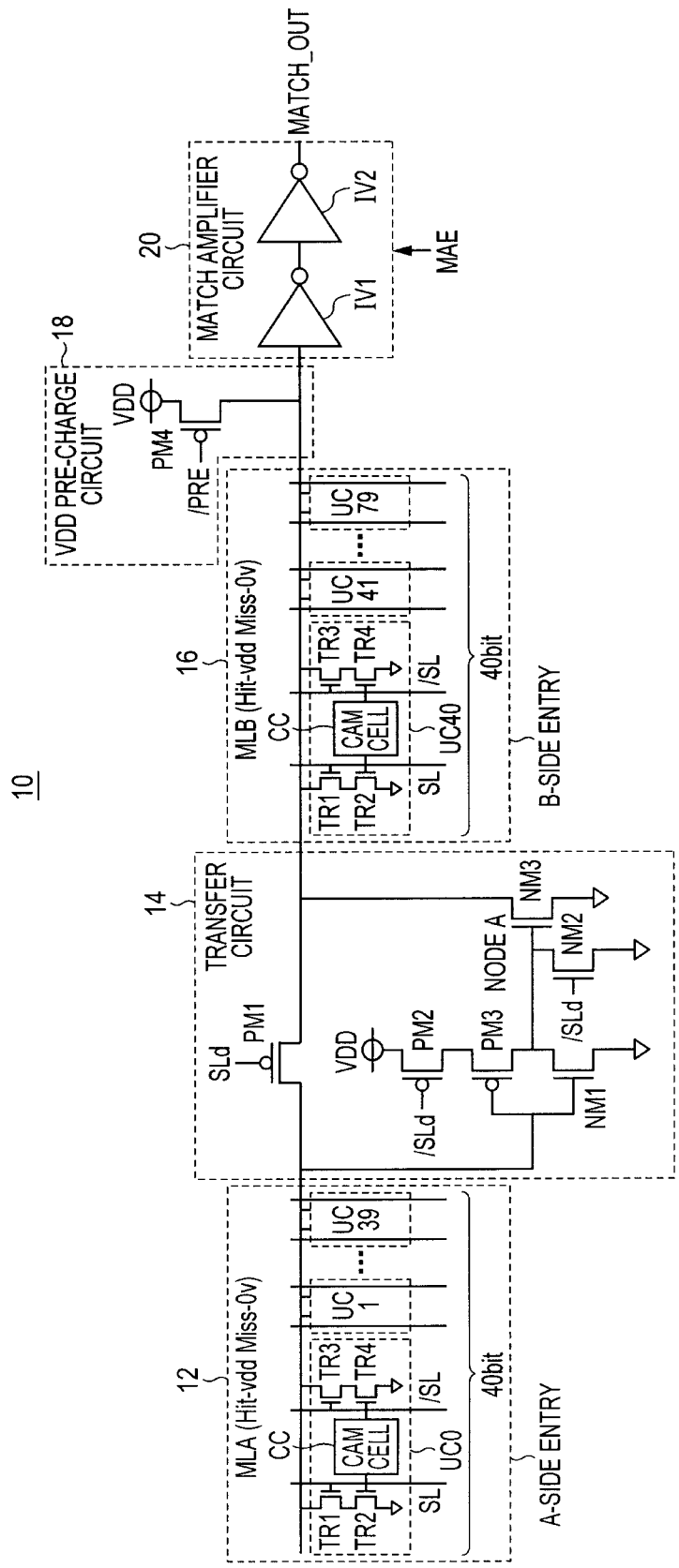
FIG. 27 is a drawing illustrating a configuration of one entry and a transfer circuit 14 and a match amplifier unit 10 corresponding to the entry, in the content addressable memory device according to Embodiment 7.

FIG. 27 illustrates a configuration of one entry and a transfer circuit 14 and a match amplifier unit 10 corresponding to the entry, in the content addressable memory device according to Embodiment 7.

As illustrated in FIG. 27, 40 unit cells UC0-UC39 of the A side entry are coupled to the match line MLA. Similarly, 40 unit cells UC40-UC79 of the B side entry are coupled to the match line MLB.

The transfer circuit 14 comprises a P-channel MOS transistor PM1, a P-channel MOS transistor PM2, a P-channel MOS transistor PM3, an N-channel MOS transistor NM1, an N-channel MOS transistor NM2, and an N-channel MOS transistor NM3.

Since the search line activation signal SLd is activated to an H level during a search period, the P-channel MOS transistor PM1 is set to OFF, and the coupling between the match line A and the match line B is cutoff. Since the search line activation signal SLd is deactivated to an L level except for the search period, the P-channel MOS transistor PM1 is set to ON, and the coupling between the match line A and the match line B is established.

The P-channel MOS transistor PM3 and the N-channel MOS transistor NM1 form an inverter. This inverter amplifies a voltage of the match line MLA.

The P-channel MOS transistor PM2 is provided between a source of the P-channel MOS transistor PM3 and the VDD power supply. The P-channel MOS transistor PM2 receives an inverted search line activation signal /SLd at a gate thereof.

The N-channel MOS transistor NM2 is provided between an output of the inverter and the ground power supply. The N-channel MOS transistor NM2 receives an inverted search line activation signal /SLd at a gate thereof.

The N-channel MOS transistor NM3 is provided between one end of the match line MLB and the ground power supply and serves as a discharging circuit. The N-channel MOS transistor NM3 receives an output of the inverter at a gate thereof.

Since the inverted search line activation signal /SLd is deactivated to an L level during the search period, the P-channel MOS transistor PM2 is set to ON, and the N-channel MOS transistor NM2 is set to OFF. When the search result of the A side entry is of Miss and the voltage of the match line MLA is at an L level (0V) at this time, the gate voltage of the N-channel MOS transistor NM3 turns to an H level (VDD) by the action of the inverter. Accordingly, the N-channel MOS transistor NM3 is set to ON, and the match line MLB is discharged to an L level (0V). Since the N-channel MOS transistor NM3 has larger driving ability than the search transistors TR1 and TR2 (or TR3 and TR4) comprised of two-staged NMOS transistors, it is possible to transfer the voltage of an L level of the match line MLA to the match line MLB at high speed.

When the search result of the A side entry is of Hit and the voltage of the match line MLA is at an H level, on the other hand, the gate voltage of the N-channel MOS transistor NM3 turns to an L level by the action of the inverter. Accordingly, the N-channel MOS transistor NM3 is set to OFF, and the match line MLB is not discharged to an L level (0V).

The match amplifier unit 10 comprises a VDD pre-charge circuit 18 and the match amplifier circuit 20.

The VDD pre-charge circuit 18 comprises a P-channel MOS transistor PM4 coupled to the match line MLB.

When the inverted pre-charge signal /PRE is activated to an L level except for the search period, the P-channel MOS transistor PM4 pre-charges the match line MLB to an H level (VDD). Since the P-channel MOS transistor PM1 is set to ON except for the search period, the P-channel MOS transistor PM4 pre-charges the match line MLA to an H level (VDD) as well.

The match amplifier circuit 20 is coupled to the match line MLB and comprises two stages of inverters IV1 and IV2. The inverters IV1 and IV2 are coupled to the VDD power supply and operate by the VDD voltage. When the match amplifier activation signal MAE is activated to an H level, the match amplifier circuit 20 amplifies the voltage of the match line MLB, and outputs the search determination signal MATCH_OUT.

When the A side entry is of Miss, the match line MLB is discharged to an L level by the transfer circuit 14; accordingly, the match amplifier circuit 20 outputs the search determination signal MATCH_OUT of an L level which indicates Miss. When the B side entry is of Miss, the match line MLB is discharged to an L level by the search transistors TR1 and TR2 (or TR3 and TR4) comprised of two-staged NMOS transistors; accordingly, the match amplifier circuit 20 outputs the search determination signal MATCH_OUT of an L level which indicates Miss. When the A side entry is of Hit and the B side entry is of Hit, the match line MLB is not discharged; accordingly, the match amplifier circuit 20 outputs the search determination signal MATCH_OUT of an H level which indicates Hit.

Figure 28:
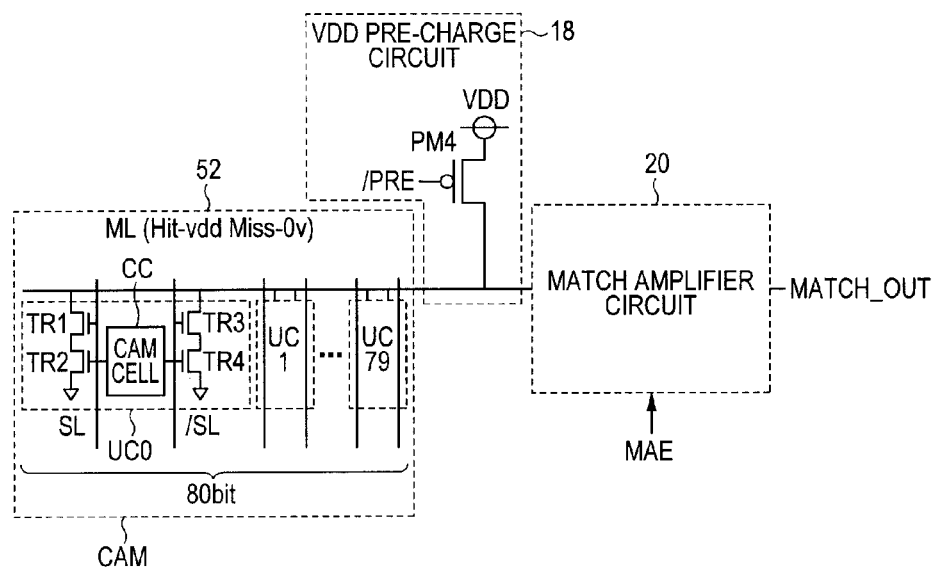
FIG. 28 is a drawing illustrating a configuration of one entry and a match amplifier corresponding to the entry, in a conventional content addressable memory device.

(Reference: a conventional configuration) By reference, FIG. 28 illustrates a configuration of one entry and a match amplifier corresponding to the entry, in a conventional content addressable memory device.

In FIG. 28, a memory array is not divided, and a match line ML is coupled to unit cells UC for 80 bits; accordingly, parasitic capacitance of the match line ML becomes large. Consequently, a voltage change of the match line ML at the time of Miss becomes of a small amplitude. Therefore, a differential amplifier or a cross coupling amplifier, etc., which can amplify a signal of small amplitude, are employed as a match amplifier circuit 20. This is because it is difficult that a circuit such as an inverter amplifies a signal of small amplitude at high speed.

On the other hand, in the present embodiment, the level of signal amplitude becomes two times larger because the load of the match line becomes half compared with the past. Therefore, it is possible to perform amplification at a high speed by an amplifier of a simple configuration, such as an inverter.

Figure 29:
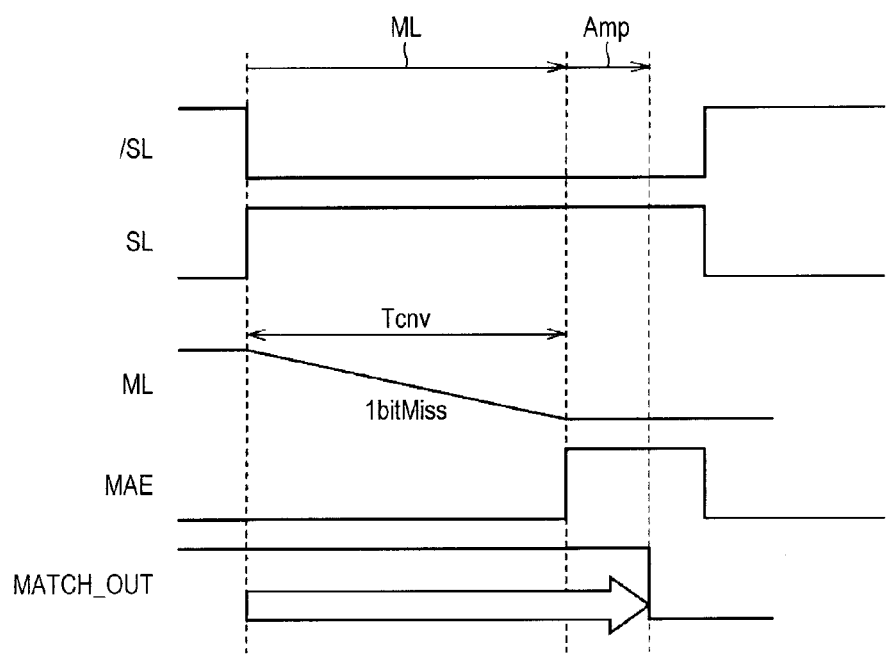
FIG. 29 is a drawing illustrating operating waveforms of the conventional content addressable memory device illustrated in FIG. 28.

(Reference: conventional operation) FIG. 29 illustrates operating waveforms of the conventional content addressable memory device illustrated in FIG. 28.

As illustrated in FIG. 29, before searching a memory array, the match line ML is pre-charged to VDD by a VDD pre-charge circuit.

When the search line activation signal SLd is activated, the search line SL is activated to an H level (VDD). When a corresponding entry is of Miss, the match line ML is discharged to an L level (0V) by a search transistor TR2 or TR4. Here, Tcnv (in the order of several ns) is assumed to express a period in which the match line is discharged when one unit cell UC of an entry is of Miss.

After the voltage of the match line ML is discharged to 0V, the match amplifier activation signal MAE is activated to an H level. The match line ML is amplified by the match amplifier circuit 20, and a search determination signal MATCH_OUT is outputted.

Figure 30:
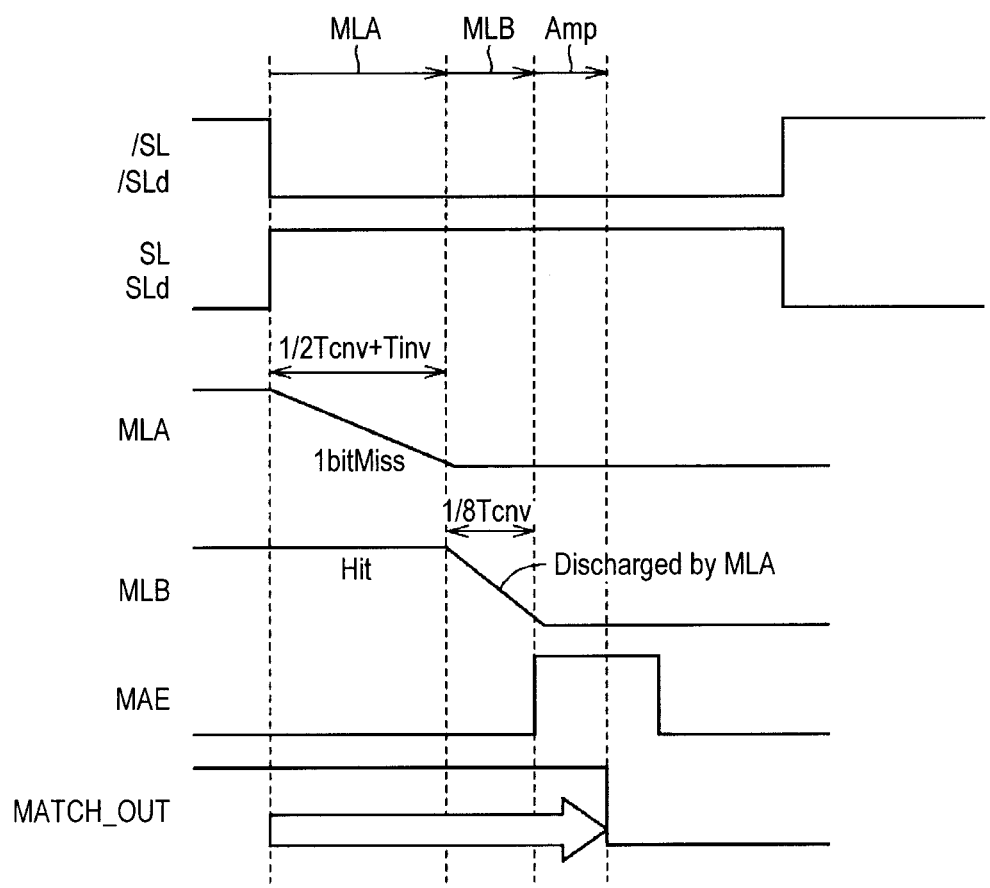
FIG. 30 is a drawing illustrating operating waveforms when an A side entry is of Miss and a B side entry is of Hit in Embodiment 7.
Figure 31:
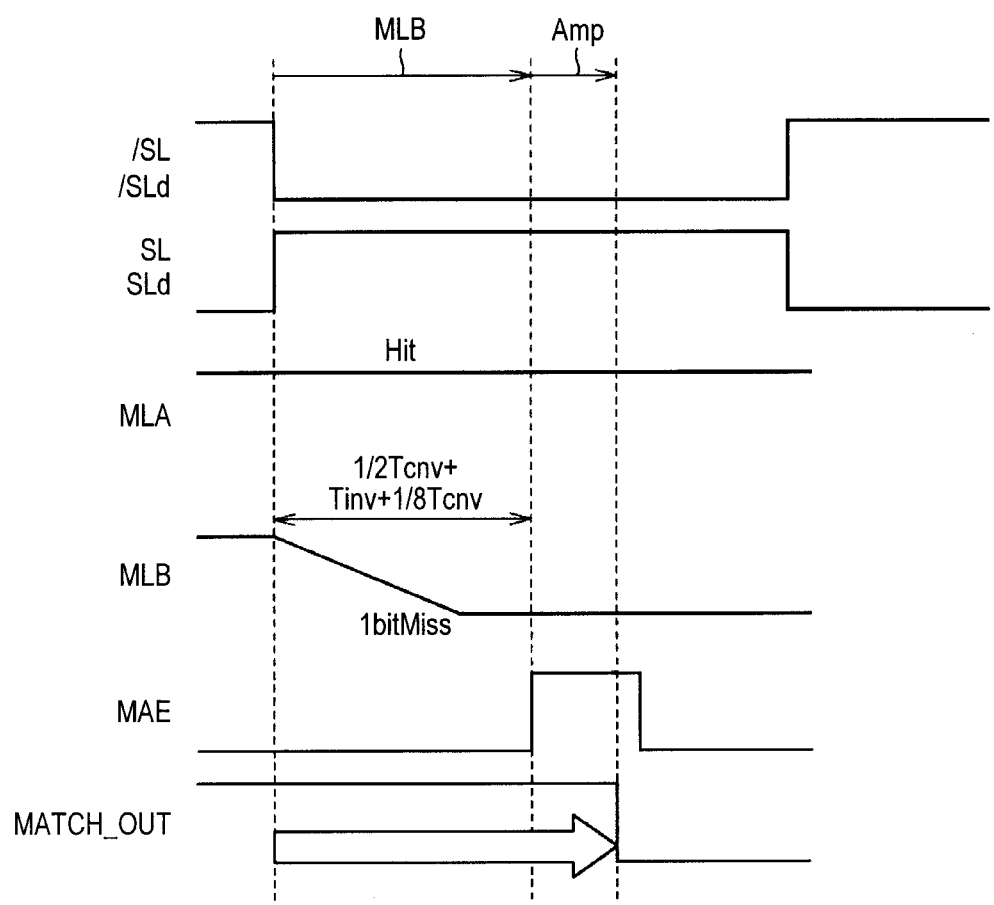
FIG. 31 is a drawing illustrating operating waveforms when the A side entry is of Hit and the B side entry is of Miss in Embodiment 7.

(Operation in the present embodiment) FIG. 30 and FIG. 31 illustrate operating waveforms of the content addressable memory device according to Embodiment 7.

FIG. 30 illustrates operating waveforms when the A side entry is of Miss and the B side entry is of Hit in Embodiment 7.

As illustrated in FIG. 30, before searching the memory array, the match lines MLA and MLB are pre-charged to VDD by the VDD pre-charge circuit 18.

When the search line activation signal SLd is activated, the search line SL is activated to an H level (VDD). When the corresponding A side entry is of Miss, the match line MLA is discharged to an L level (0V) by the search transistor TR2 or TR4. Since the parasitic capacitance is half compared with the past, the amplitude level of the match line MLA in the present embodiment becomes twice, and the voltage of the match line MLA is drawn out to an L level (0V) at a speed twice faster than the past. Therefore, when one unit cell UC of an entry is of Miss, the period in which the match line MLA is discharged is given by Tcnv/2.

Subsequently, the voltage of the match line MLA is amplified by an inverter comprised of the P-channel MOS transistor PM3 and the N-channel MOS transistor NM1. It is assumed that the operating time of the present inverter is given by Tinv.

Furthermore, the voltage of the match line MLB is discharge to an L level (0V) by the N-channel MOS transistor NM3. When the driving ability of the N-channel MOS transistor NM3 is increased four times greater than the driving ability of the search transistors TR1 and TR2 (or TR3 and TR4) which are comprised of two-staged NMOS transistors, the discharge time is given by Tcnv/8, because the parasitic capacitance of the match line MLB is half compared with the past.

After the voltage of the match line MLB is discharged to 0V, the match amplifier activation signal MAE is activated to an H level. The match line MLB is amplified by the match amplifier circuit 20, and a search determination signal MATCH_OUT is outputted.

Accordingly, as illustrated in FIG. 29, in the past, the period after the search line SL is activated until the match amplifier circuit 20 starts amplification is given by Tcnv (in the order of several ns). In contrast with this, in the present embodiment, the period after the search line SL is activated until the match amplifier circuit 20 starts amplification is given by $(5/8) \times Tcnv + Tinv$ (Tinv is in the order of hundreds ps). That is, according to embodiments of the present invention, speeding up of about 1.5 times on an average can be attained compared with the past.

FIG. 31 illustrates operating waveforms when the A side entry is of Hit and the B side entry is of Miss in Embodiment 7.

Before searching the memory array, the match lines MLA and MLB are pre-charged to VDD by the VDD pre-charge circuit 18.

When the search line activation signal SLd is activated, the search line SL is activated to an H level (VDD). When the corresponding B side entry is of Miss, the match line MLB is discharged to an L level (0V) by the search transistor TR2 or TR4. Since the parasitic capacitance is half compared with the past, the amplitude level of the match line MLB in the present embodiment becomes twice, and the voltage of the match line MLB is drawn out to an L level (0V) at a speed twice faster than the past. Therefore, when one unit cell UC of an entry is of Miss, the period in which the match line MLB is discharged is given by Tcnv/2.

After a period of Tcnv/8+Tinv passes after that, the match amplifier activation signal MAE is activated to an H level at the same timing as the case where the A side entry is of Miss. The match line MLB is amplified by the match amplifier circuit 20, and the search determination signal MATCH_OUT is outputted.

(Effects) As described above, according to the present embodiment, it is possible to attain speeding up of searching, by halving the load capacitance of the match line during the search period.

Since the amplitude level of the match line is small in the conventional device illustrated in FIG. 28, there is a problem that an amplifier circuit with a large layout area is needed in consideration of speeding up and local variation, and a control signal of the amplifier circuit becomes complicated. In contrast with this, according to embodiments of the present invention, the amplitude level of the match line becomes large and the voltage of the match line can be amplified by a simple amplifier circuit, such as an inverter; accordingly, it is possible to reduce the layout area. Since control of the amplifier circuit is also simple, a circuit which generates a signal for controlling the amplifier circuit can be reduced in size as well. Consequently, it is possible to reduce the layout and the circuit scale as the whole.

Signals for controlling the transfer circuit which is appended by the embodiments of the present invention are the search line activation signal SLd used from the past, and a signal /SLd which is the negative logic of SLd. Accordingly, it is not necessary to provide a special circuit for generating the signals for controlling the transfer circuit.

In the present embodiment, the VDD pre-charge circuit is coupled to the match line MLB. However, it is not limited to the case and the VDD pre-charge circuit may be coupled to the match line MLA.

(Embodiment 8)

Figure 32:
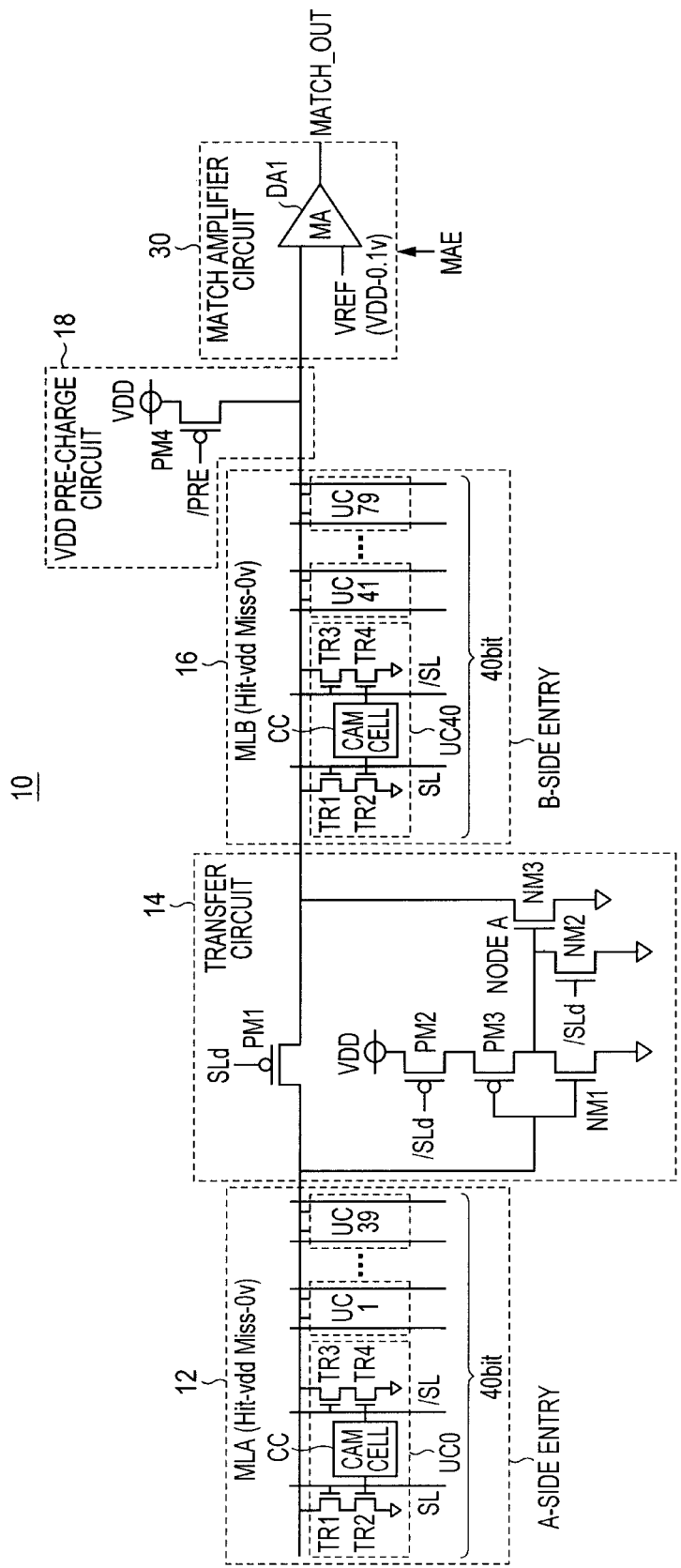
FIG. 32 is a drawing illustrating a configuration of one entry and a transfer circuit and a match amplifier unit corresponding to the entry, in a content addressable memory device according to Embodiment 8.

(Configuration) FIG. 32 illustrates a configuration of one entry and a transfer circuit and a match amplifier unit corresponding to the entry, in a content addressable memory device according to Embodiment 8.

The configuration illustrated in FIG. 32 is different from the configuration of Embodiment 7 illustrated in FIG. 27, with respect to a match amplifier circuit 30.

The match amplifier circuit 30 illustrated in FIG. 32 comprises a cross-coupling-type differential amplifier DA1 which is activated by a match amplifier activation signal MAE. The differential amplifier DA1 is coupled to the VDD power supply and operates by the VDD voltage. At the time of activation, the differential amplifier DA1 receives the reference voltage VREF and a voltage of the match line MLB, amplifies a difference of these voltages, and outputs a determination signal MATCH_OUT. The reference voltage VREF can be set as VDD-0.1V, for example (it is assumed that VDD=1.0V).

Figure 33:
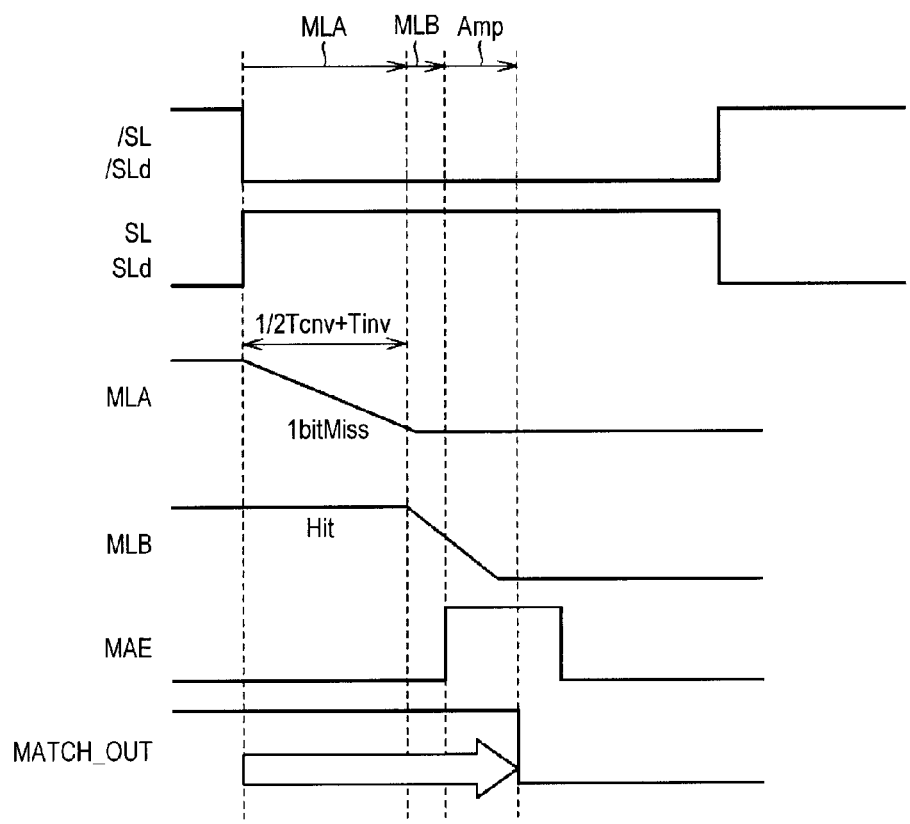
FIG. 33 is a drawing illustrating operating waveforms of the content addressable memory device according to Embodiment 8.

(Operation) FIG. 33 illustrates operating waveforms of the content addressable memory device according to Embodiment 8.

According to Embodiment 7 illustrated in FIG. 29, when the match line MLB reaches 0V, the match amplifier activation signal MAE is activated and the match amplifier circuit 20 starts amplification of the match line MLB.

As compared with this, the match amplifier circuit 30 according to the present embodiment can amplify a signal even when the amplitude of the voltage of the match line MLB is small. Accordingly, as illustrated in FIG. 33, before the match line MLB reaches 0V, the match amplifier activation signal MAE is activated and the match amplifier circuit 30 starts the differential amplification of the match line MLB.

(Effects) In the present embodiment, timing at which the determination signal MATCH_OUT is outputted can be set earlier than in Embodiment 7.

(Embodiment 9)

Figure 34:
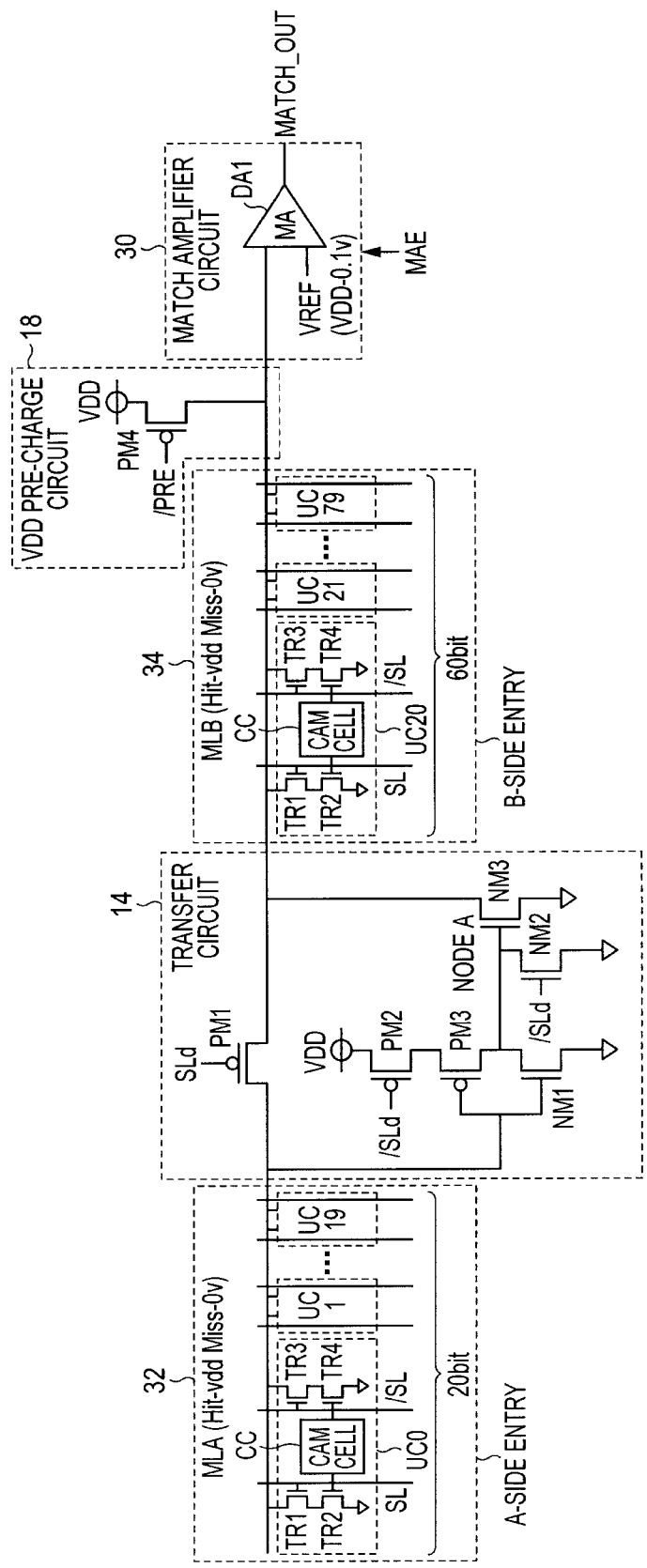
FIG. 34 is a drawing illustrating a configuration of one entry and a transfer circuit and a match amplifier unit corresponding to the entry, in a content addressable memory device according to Embodiment 9.

(Configuration) FIG. 34 illustrates a configuration of one entry and a transfer circuit and a match amplifier unit corresponding to the entry, in a content addressable memory device according to Embodiment 9.

The configuration illustrated in FIG. 34 is different from the configuration according to Embodiment 8 illustrated in FIG. 32 with respect to the method of division of a memory array.

In Embodiment 8, the number of columns of the memory array A and the memory array B is 40. That is, each of the A side entry and the B side entry comprises 40 unit cells UC.

As compared with this, in the present embodiment, the number of columns of the memory array A is 20, and the number of columns of the memory array B is 60. That is, the A side entry comprises 20 CAM cells CC, and the B side entry comprises 60 CAM cells CC. According to the configuration of the present embodiment, the number of unit cells UC coupled to the match line MLA becomes half and the length of the match line MLA also becomes half, compared with the configuration according to Embodiment 8. Accordingly, at the time of Miss, the voltage can be discharged to 0V at high speed.

Figure 35:
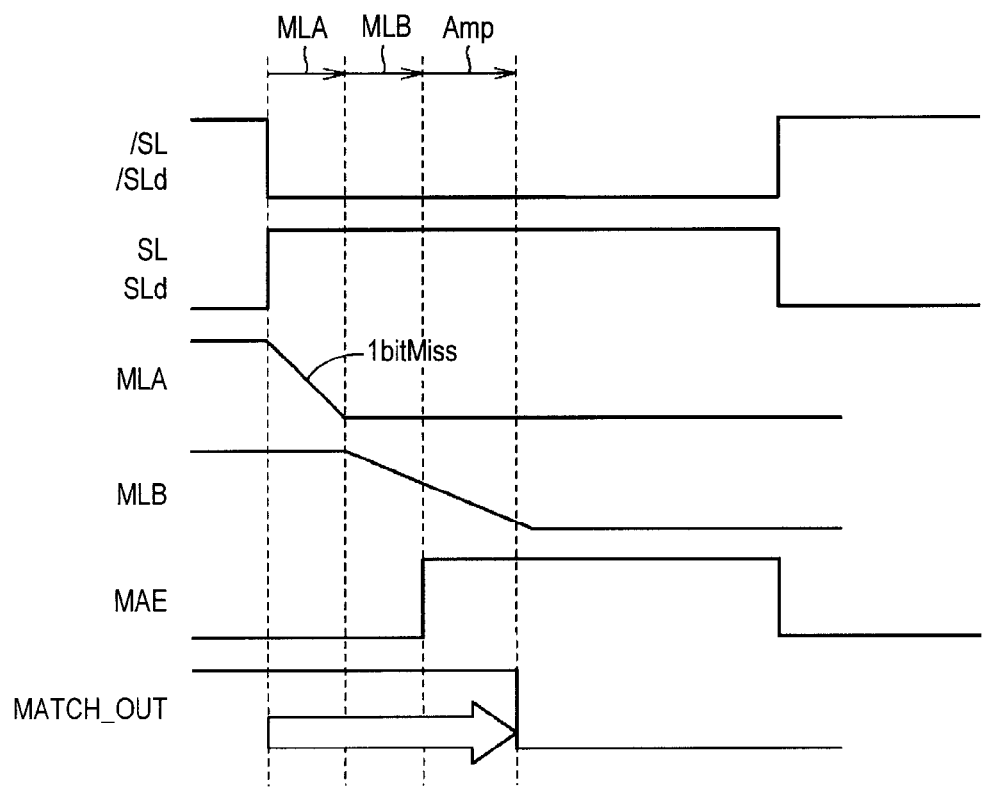
FIG. 35 is a drawing illustrating operating waveforms of the content addressable memory device according to Embodiment 9.

(Operation) FIG. 35 illustrates operating waveforms of the content addressable memory device according to Embodiment 9.

In the present embodiment, the number of unit cells UC coupled to the match line MLA becomes half, and the length of the match line MLA also becomes half compared with Embodiment 8. Accordingly, at the time of Miss, the voltage can be discharged to 0V at high speed. The period required for discharging is Tcnv/4.

In the present embodiment, the number of unit cells UC coupled to the match line MLB increases, and the length of the match line MLB also increases compared with Embodiment 8. However, since the differential amplifier DA1 can also amplify a small amplitude signal, an increase in the period required for amplification can be disregarded mostly.

(Effects) In the present embodiment, timing at which the determination signal MATCH_OUT is outputted can be set yet earlier than in Embodiment 8.

(Embodiment 10)

Figure 36:
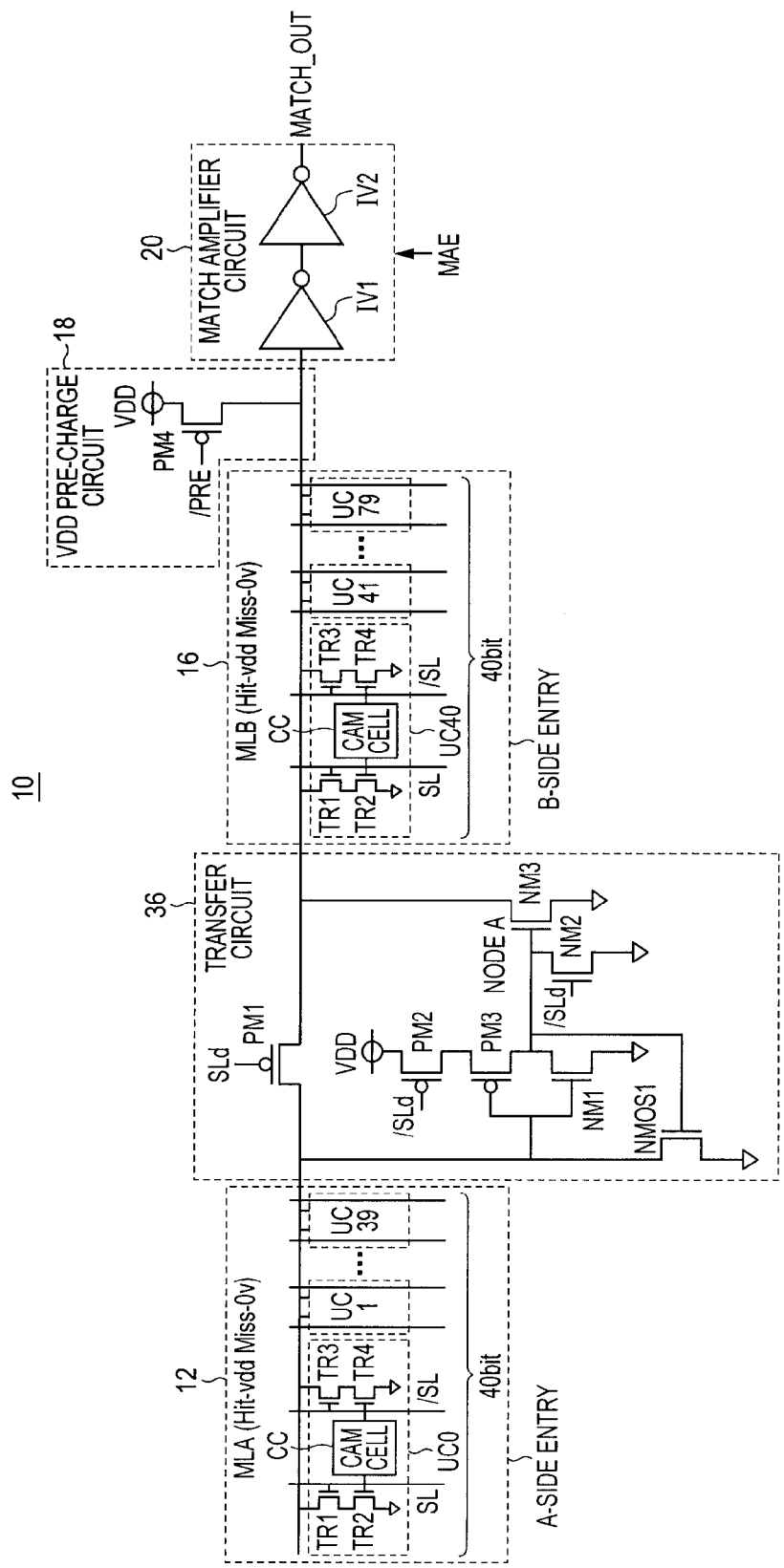
FIG. 36 is a drawing illustrating a configuration of one entry and a transfer circuit and a match amplifier unit corresponding to the entry, in a content addressable memory device according to Embodiment 10.

(Configuration) FIG. 36 illustrates a configuration of one entry and a transfer circuit and a match amplifier unit corresponding to the entry, in a content addressable memory device according to Embodiment 10.

The configuration illustrated in FIG. 36 is different from the configuration according to Embodiment 7 illustrated in FIG. 27 with respect to a transfer circuit 36.

The transfer circuit 36 comprises an N-channel MOS transistor NMOS1 in addition to the components of the transfer circuit 14 according to Embodiment 7.

The N-channel MOS transistor MNOS1 has a drain coupled to the input of an inverter comprised of a P-channel MOS transistor PM3 and an N-channel MOS transistor NM1, a source coupled to the ground, and a gate coupled to a node A which is an output of the inverter.

Figure 37:
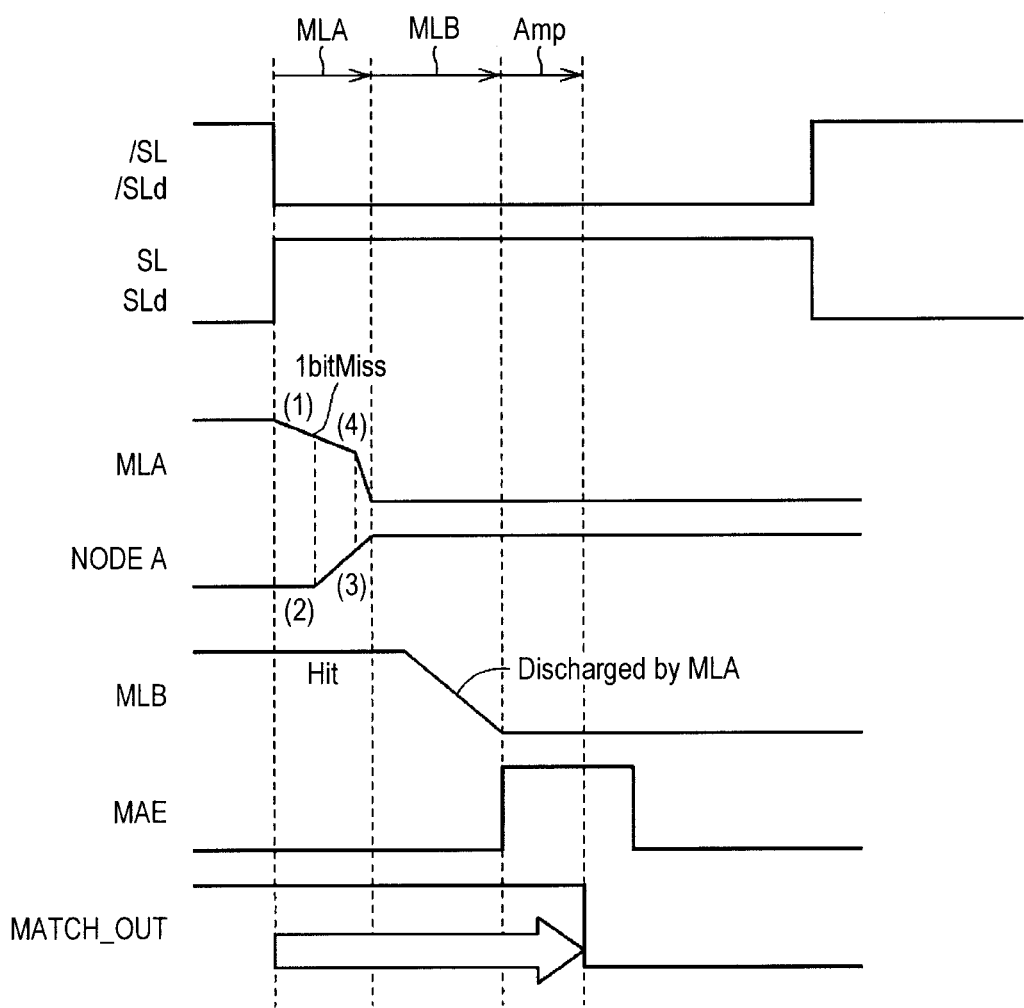
FIG. 37 is a drawing illustrating operating waveforms of the content addressable memory device according to Embodiment 10.

(Operation) FIG. 37 illustrates operating waveforms of the content addressable memory device according to Embodiment 10.

As illustrated in FIG. 37, when the search line activation signal SLd is activated, the search line SL is activated to an H level (VDD). When the corresponding A side entry is of Miss, the match line MLA is discharged gradually by the search transistor TR2 or TR4. When the voltage of the match line MLA reaches a threshold of the inverter (indicated as (1)), the voltage of the node A increases gradually by the action of the inverter (indicated as (2)). Subsequently, when the voltage of the node A reaches a threshold of the N-channel MOS transistor NMOS1 (indicated as (3)), the voltage of the match line MLA is discharged rapidly by the N-channel MOS transistor NMOS1.

(Effects) In the present embodiment, timing at which the determination signal MATCH_OUT is outputted can be set earlier than in Embodiment 7.

(Embodiment 11)

Figure 38:
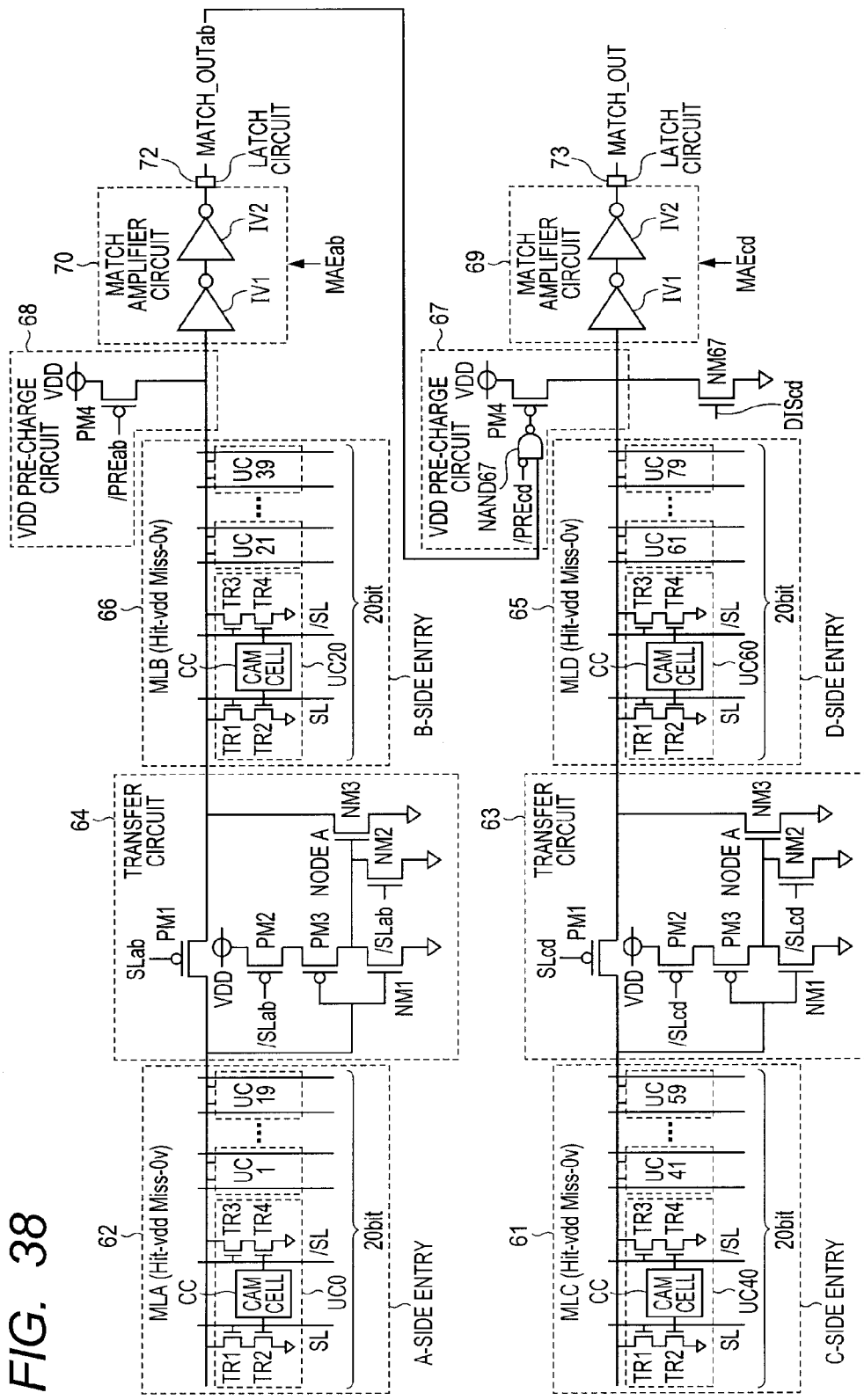
FIG. 38 is a drawing illustrating a configuration of one entry and a transfer circuit and a match amplifier unit corresponding to the entry, in a content addressable memory device according to Embodiment 11.

(Configuration) FIG. 38 illustrates a configuration of one entry and a transfer circuit and a match amplifier unit corresponding to the entry, in a content addressable memory device according to Embodiment 11.

Although FIG. 38 depicts components disposed in two stages in the vertical direction, in fact all the components are extended horizontally.

In the present embodiment, the array block (80 bits×256 entries) is divided into a memory array A, a memory array B, a memory array C, and a memory array D, each in units of 20 bits.

As illustrated in FIG. 38, 20 unit cells UC0-UC19 of an A side entry are coupled with a match line MLA. Similarly, 20 unit cells UC20-UC39 of a B side entry are coupled with a match line MLB. Similarly, 20 unit cells UC40-UC59 of a C side entry are coupled with a match line MLC. Similarly, 20 unit cells UC60-UC79 of a D side entry are coupled with a match line MLD.

A transfer circuit 64 couples or separates the match line MLA and the match line MLB. In addition, when the search result of the A side entry is of Miss, and when the voltage of the match line MLA is at an L level (0V), the transfer circuit 64 discharges the match line MLB to an L level (0V). The transfer circuit 64 has the same configuration as the transfer circuit 14 according to Embodiment 7. However, the transfer circuit 64 is controlled by a search line activation signal SLab, and an inverted search line activation signal /SLab.

A transfer circuit 63 couples or separates the match line MLC and the match line MLD. In addition, when the search result of the C side entry is of Miss, and when the voltage of the match line MLC is at an L level (0V), the transfer circuit 63 discharges the match line MLD to an L level (0V). The transfer circuit 63 has the same configuration as the transfer circuit 14 according to Embodiment 7. However, the transfer circuit 63 is controlled by a search line activation signal SLcd, and an inverted search line activation signal /SLcd.

A latch circuit 72 latches an output of a match amplifier circuit 70, and outputs a search determination signal MATCH_OUTab. A latch circuit 73 latches an output of a match amplifier circuit 69, and outputs a search determination signal MATCH_OUT.

A VDD pre-charge circuit 68 is coupled to the match line MLB. The VDD pre-charge circuit 68 has the same configuration as the VDD pre-charge circuit 18 according to Embodiment 7. However, a P-channel MOS transistor PM4 in the VDD pre-charge circuit 68 is activated by an inverted pre-charge signal /PREab.

A VDD pre-charge circuit 67 is coupled to the match line MLD. The VDD pre-charge circuit 67 comprises an inverted logical product circuit NAND67, a P-channel MOS transistor PM4, and an N-channel MOS transistor NM67.

The inverted logical product circuit NAND67 outputs an inverted logical product of an inverted signal of an inverted pre-charge signal /PREcd, and a signal MATCH_OUTab which is an output of the latch circuit 72. The P-channel MOS transistor PM4 has a source coupled to the power supply VDD, a drain coupled to the match line MLD, and a gate coupled to an output of the inverted logical product circuit NAND67.

When the inverted pre-charge signal /PREcd is activated to an L level and the signal MATCH_OUTab is at an H level (that is when the match line LB is not discharged), the VDD pre-charge circuit 68 pre-charges the match line MLD by the VDD voltage.

The N-channel MOS transistor NM67 serves as a discharging circuit, and has a source coupled to the ground, a gate coupled to a discharge signal Discd, and a drain coupled to the match line MLD. The N-channel MOS transistor NM67 discharges the match line MLD to an L level (0V), when the discharge signal Discd is activated to an H level.

Figure 39:
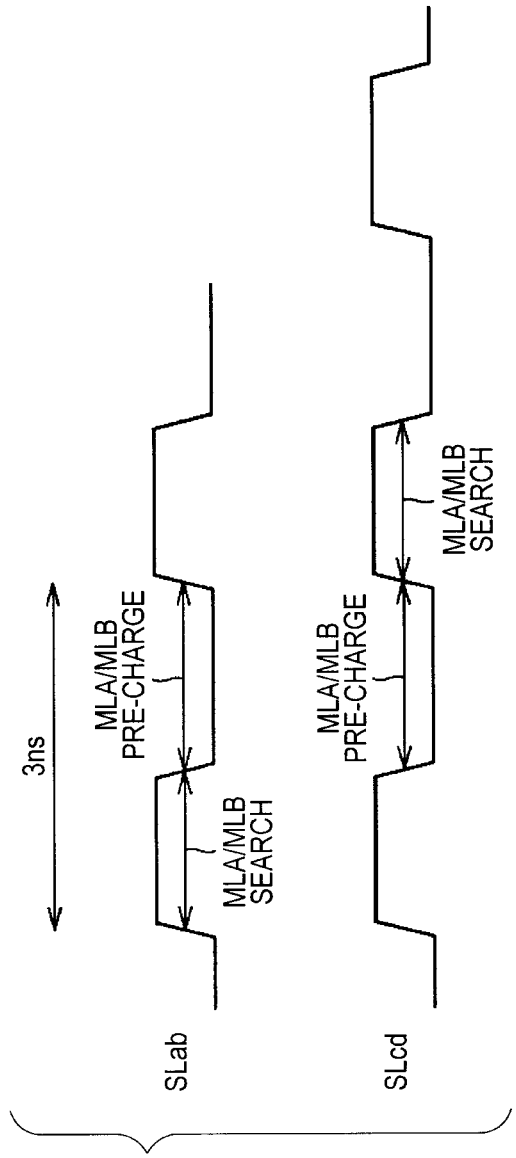
FIG. 39 is a drawing illustrating search timing of the content addressable memory device according to Embodiment 11.

(Operation) FIG. 39 illustrates search timing of the content addressable memory device according to Embodiment 11.

When searching is performed for the A side entry and the B side entry, the search line activation signal SLab is activated. After the searching of the A side entry and the B side entry, the search line activation signal SLcd is activated. Then, searching is performed for the C side entry and the D side entry.

Figure 40:
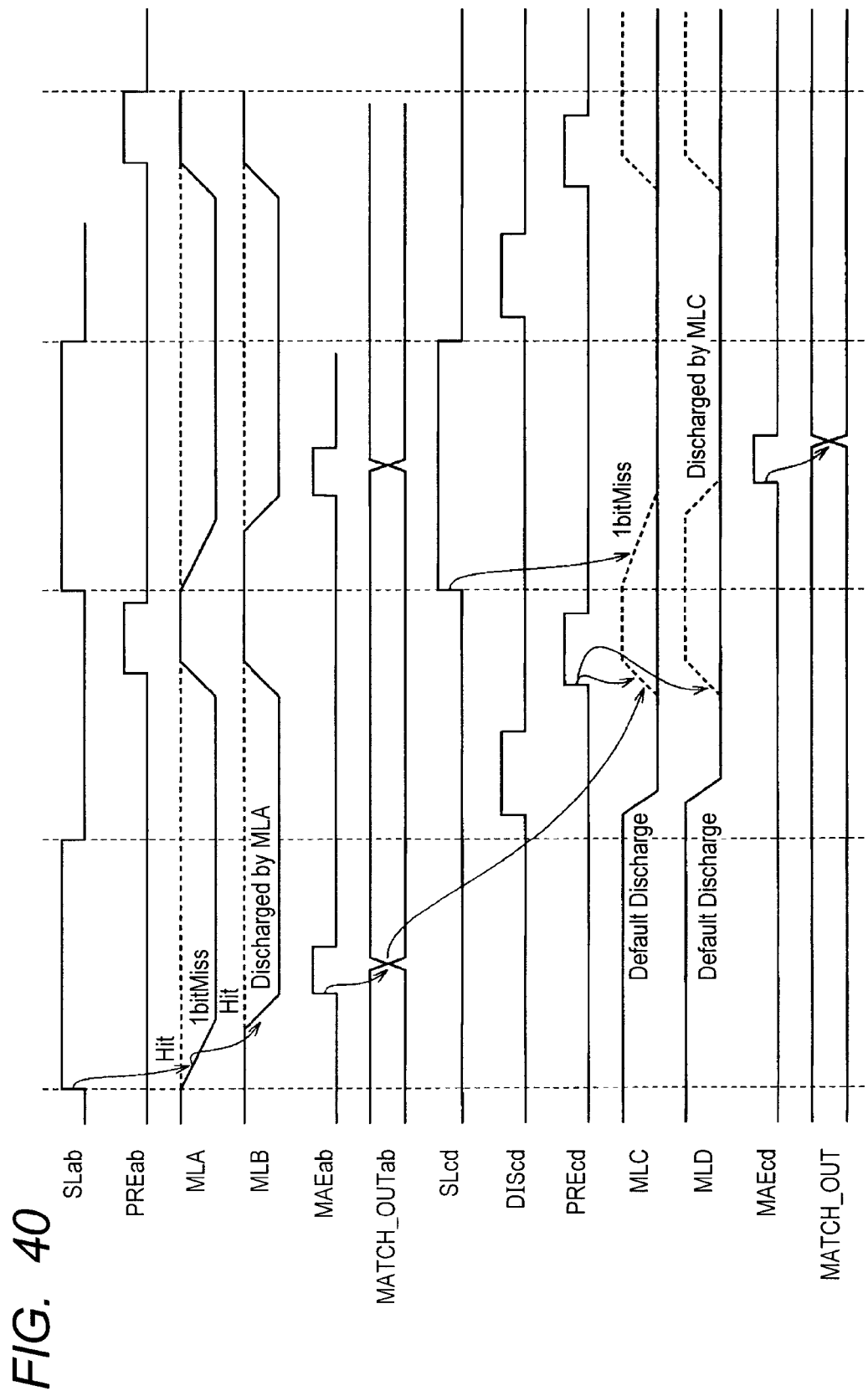
FIG. 40 is a drawing illustrating operating waveforms of the content addressable memory device according to Embodiment 11.

FIG. 40 illustrates operating waveforms of the content addressable memory device according to Embodiment 11. FIG. 40 illustrates the operating waveforms for the case where the A side entry is of Miss, the B side entry, the C side entry, and the D side entry are of Hit.

As illustrated in FIG. 40, before searching is performed for the memory array, the match lines MLA and MLB are pre-charged to VDD by the VDD pre-charge circuit 68.

When the search line activation signal SLab is activated, the search lines SL of the A side entry and the B side entry are activated to an H level (VDD). When the corresponding A side entry is of Miss, the match line MLA is discharged to an L level (0V) by the search transistors TR1 and TR2 (or TR3 and TR4). Subsequently, the voltage of the match line MLA is amplified by the inverter comprised of the P-channel MOS transistor PM3 and the N-channel MOS transistor NM1. Furthermore, the voltage of the match line MLB is discharge to an L level (0V) by the N-channel MOS transistor NM3.

After the voltage of the match line MLB is discharged to 0V, the match amplifier activation signal MAEab is activated to an H level. Subsequently, the voltage of the match line MLB is amplified by the match amplifier circuit 70, and the search determination signal MATCH_OUTab of an L level is outputted from the latch circuit 72.

Next, when the discharge signal Discd is activated to an H level, the match line MLD is discharged to the ground level by the NMOS transistor NM67 which serves as a discharging circuit. When the inverted pre-charge signal /PREcd is activated to an L level, by the action of the inverted logical product circuit NAND67 and the P-channel MOS transistor PM4, the match line MLD is pre-charged to the VDD voltage when the search determination signal MATCH_OUTab is at an H level, and the match line MLD is not pre-charged when the search determination signal MATCH_OUTab is at an L level. When the A side entry is of Miss as described above, the search determination signal MATCH_OUTab is at an L level; accordingly, the match line MLD is not pre-charged to the Vdd but maintains the ground level.

Subsequently, when the search line activation signal SLcd is activated, the search line SL of the C side entry and the D side entry is activated to an H level (VDD). The match line MLD maintains the ground level as described above, regardless of whether the C side entry and the D side entry are of Hit or Miss.

Subsequently, the match amplifier activation signal MAEcd is activated to an H level, the voltage of the match line MLD is amplified by the match amplifier circuit 69, the search determination signal MATCH_OUTcd of an L level is outputted from the latch circuit 73, and it is possible to determine that the present entry comprised of the match lines MLA, MLB, MLC, and MLD is of Miss.

(Effects) In the present embodiment, an array block is divided into four memory arrays A, B, C, and D, and it is possible to attain speeding up by searching in division units during the search period. Furthermore, pre-charge/discharge of the match line of blocks of the memory array C and the memory array D are controlled based on the search result of the memory array A and the memory array B. Accordingly, it is possible to attain speeding up, and at the same time, to realize reduction of consumption current to the maximum of about ½.

(Embodiment 12)

Figure 41:
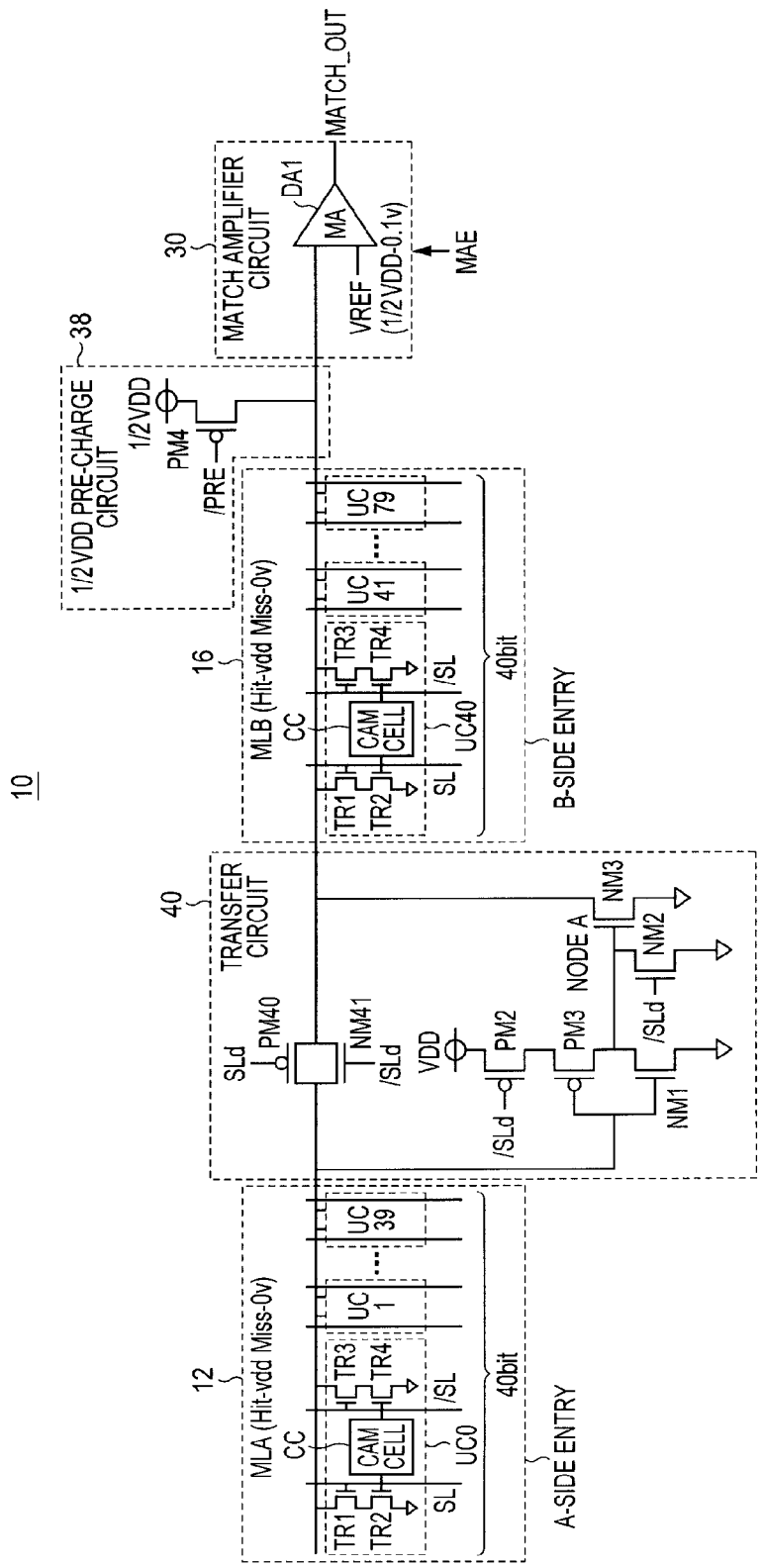
FIG. 41 is a drawing illustrating a configuration of one entry and a transfer circuit and a match amplifier unit corresponding to the entry, in a content addressable memory device according to Embodiment 12.

(Configuration) FIG. 41 illustrates a configuration of one entry and a transfer circuit and a match amplifier unit corresponding to the entry, in a content addressable memory device according to Embodiment 12.

The configuration illustrated in FIG. 41 is different from the configuration according to Embodiment 7 illustrated in FIG. 27 with respect to a transfer circuit 40 and a ½ VDD pre-charge circuit 38.

As illustrated in FIG. 41, the ½ VDD pre-charge circuit 38 comprises a P-channel MOS transistor PM4 which has a source coupled to a power supply of VDD/2 in magnitude.

The match line MLB is pre-charged to the magnitude of VDD/2, by the action of the ½ VDD pre-charge circuit 38.

The size of the P-channel MOS transistor PM3 and the N-channel MOS transistor NM1 of the transfer circuit 40 is set up so that the inverter which comprises these transistors may output an L level, when the voltage of the magnitude of VDD/2 is inputted.

The transfer circuit 40 comprises a transfer gate which is comprised of a P-channel MOS transistor PM40 and an N-channel MOS transistor 41. The transfer gate couples or separates the match line MLA and the match line B under the control of the search line activation signal SLd and the inverted search line activation signal/SLd.

(Effects) Since the pre-charge level of the match lines MLA and MLB is reduced in the present embodiment, it is possible to attain power lowering. Although the amplitude level of the match line MLB becomes small, it is possible to amplify a small amplitude voltage of the match line MLB at high speed, by using the differential amplifier DA1.

In the present embodiment, by controlling the size of the P-channel MOS transistor PM3 and the N-channel MOS transistor NM1 which forms the inverter, the inverter which comprises these transistors is set up so as to output an L level, when the voltage of the magnitude of VDD/2 is inputted. However, the configuration is not limited to the above. As an alternative, the power supply voltage of the inverter may be set as VDD/2.

(Embodiment 13)

Figure 42:
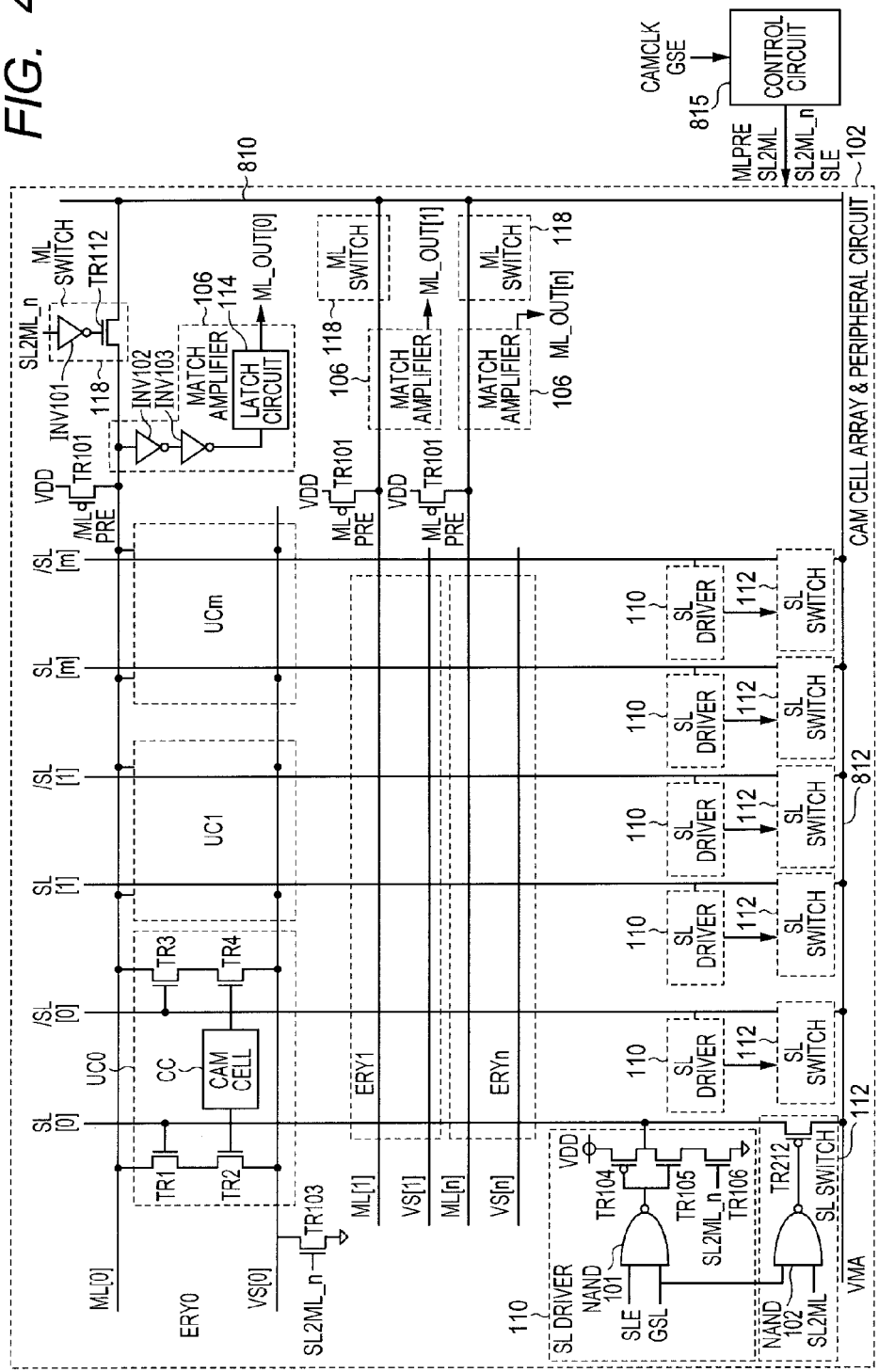
FIG. 42 is a drawing illustrating a configuration of a content addressable memory device according to Embodiment 13.

(Configuration) FIG. 42 illustrates a configuration of a content addressable memory device according to Embodiment 13.

As illustrated in FIG. 42, the search lines SL[0]-SL[m], and /SL[0]-/SL[m] are collectively called a search line SL. The match lines ML[0]-ML[n] are collectively called a match line ML. Floating lines VS[0]-VS[n] are collectively called a floating line VS.

The CAM cell array comprises a matrix of unit cells UC each of which serves as a content addressable memory cell (CAM cell).

The memory array is divided into plural entries ERY in units of row. Each entry ERY is provided with a match line ML and a floating line VS to which unit cells UC in the entry are coupled in parallel. A search line SL which transmits search data is provided in the column direction of the memory array. A unit cell UC is provided corresponding to a cross point of the search line SL and the match line ML.

A common node VMA comprises a first wring section 810 and a second wring section 812; the first wring section 810 is wired in the vertical direction with respect to the match line ML and coupled to one end of the match line ML, and the second wring section 812 is wired in the vertical direction with respect to the search line SL and coupled to one end of the search line SL.

A SL driver 110 for driving each search line SL is provided to each search line SL.

The SL driver 110 supplies the VDD voltage (activation) or the ground voltage (deactivation) to the corresponding search line SL according to search data from the exterior.

The SL driver 110 comprises an inverted logical product circuit NAND101, a P-channel MOS transistor TR104 coupled to the power supply VDD, an N-channel MOS transistor TR105, and an N-channel MOS transistor TR106 which receives an inverted switch activation signal SL2 ML_n.

The inverted logical product circuit NAND101 outputs an inverted logical product of a search line activation signal SLE and search data GSL, to an inverter comprised of the P-channel MOS transistor TR104, the N-channel MOS transistor TR105, and the N-channel MOS transistor TR106.

The N-channel MOS transistor TR106 is provided between the N-channel MOS transistor TR105 and the ground power supply. The N-channel MOS transistor TR106 turns to OFF when the inverted switch activation signal SL2 ML_n is activated to an L level, and turns to ON when the inverted switch activation signal SL2 ML_n is deactivated to an H level.

The SL driver 110 drives the search line SL into a high impedance state (Hi-Z state), when the inverted switch activation signal SL2 ML_n is at an L level and the search line activation signal SLE is at an L level.

The SL driver 110 supplies a voltage of an H level to the search line SL to activate it, when the inverted switch activation signal SL2 ML_n is at an H level, the search line activation signal SLE is at an H level, and the search data GSL is at an H level.

The SL driver 110 supplies a voltage of an L level to the search line SL to deactivate it, when the inverted switch activation signal SL2 ML_n is at an H level, the search line activation signal SLE is at an H level, and the search data GSL is at an L level.

A SL switch 112 is provided to each search line SL for coupling each search line SL to the common node VMA.

The SL switch 112 comprises an inverted logical product circuit NAND102 which receives a switch activation signal SL2ML and the search data GSL, and a P-channel MOS transistor TR212 which receives an output of the inverted logical product circuit NAND102. The P-channel MOS transistor TR212 is set to ON when the switch activation signal SL2ML and the search data GSL are activated to an H level, and couples the activated search line SL to the common node VMA. The reason why only the activated search line SL is coupled to the common node VMA is because charge distribution efficiency would worsen if a non-activated search line (of which the voltage is the ground level) is coupled.

A P-channel MOS transistor TR101 is provided to each match line ML for pre-charging each match line ML.

The P-channel MOS transistor TR101 has a source coupled to the power supply voltage VDD, a drain coupled to the match line ML, and a gate to which an inverted pre-charge signal /MLPRE is inputted. The P-channel MOS transistor TR101 pre-charges the match line ML to the power supply voltage VDD, when the inverted pre-charge signal /MLPRE is activated to an L level.

A match amplifier 106 is provided to each match line ML for amplifying voltage of each match line ML.

The match amplifier 106 is coupled to the match line ML of the corresponding entry ERY, and determines coincidence/non-coincidence of search data and stored data of each entry.

The match amplifier 106 comprises an inverter INV102 coupled to the match line ML, an inverter INV103 which receives an output of the inverter INV102, and a latch circuit 114 which receives an output of the inverter INV103, and outputs a search determination signal ML_OUT.

A ML switch 118 is provided to each match line ML for coupling each match line ML to the common node VMA.

The ML switch 118 comprises an inverter INV101 which receives the inverted switch activation signal SL2 ML_n, and an N-channel MOS transistor TR112 which receives an output of the inverter INV101.

The N-channel MOS transistor TR112 is provided between one end of the match line ML and the common node VMA, and receives an output of inverter INV101 at the gate thereof.

When the inverted switch activation signal SL2 ML_n is activated to an L level, the N-channel MOS transistor TR112 is set to ON and couples the match line ML to the common node VMA.

An N-channel MOS transistor TR103 is provided to each floating line VS.

The N-channel MOS transistor TR103 has a drain coupled to the corresponding floating line VS, a source coupled to the ground, and a gate which receives the inverted switch activation signal SL2 ML_n.

The N-channel MOS transistor TR103 couples the source of the search transistors TR1 and TR2 (or TR3 and TR4) to the ground level so that the match line ML can be discharged, when the inverted switch activation signal SL2 ML_n is deactivated to an H level, that is, when the search line SL and the match line ML are not coupled with each other via the common node VMA (in a search period etc.).

The N-channel MOS transistor TR103 floats the source of the search transistors TR1 and TR2 (or TR3 and TR4), when the inverted switch activation signal SL2 ML_n is activated to an L level, that is, when the match line ML and the search line SL are coupled with each other via the common node VMA.

The reason is as follows. Since the voltage of the search line SL becomes a middle potential Vma by coupling the search line SL and the match line ML, a penetration current path from the match line ML to the ground is created and a penetration path to the ground is created also to the search line SL coupled to the match line ML. In order to prevent the present situation, the N-channel MOS transistor TR103 is provided to float the source of the search transistors TR1 and TR2 (or TR3 and TR4). When the search result is of Miss while the search line SL is activated, the worst case of a period to discharge the match line ML to the ground level is given by discharging of the match line ML to the ground level by a one-bit search transistor. By providing the transistor TR103 which has a sufficiently larger driving ability than the one-bit search transistor, the period to discharge the match line ML to the ground level in the case of the search result of Miss becomes equivalent to the past, accordingly, it is possible to realize the discharging without degrading the characteristics of the past search transistor.

Figure 43:
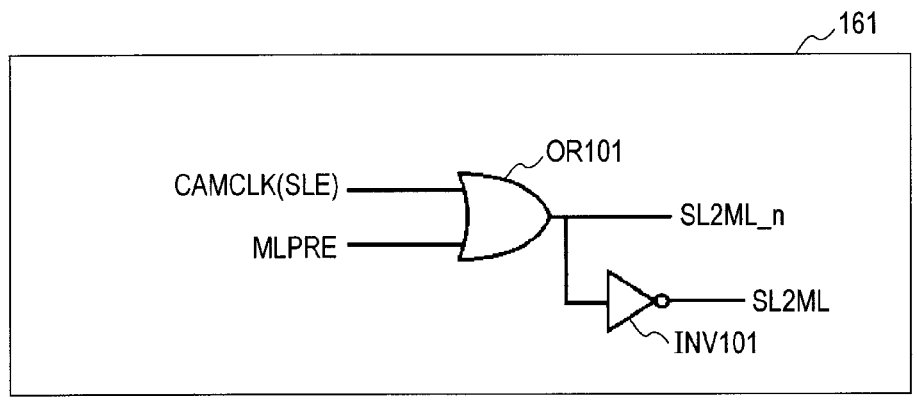
FIG. 43 is a drawing illustrating an example of a switching control circuit.

The control circuit 815 outputs the pre-charge signal MLPRE, the inverted pre-charge signal /MLPRE, and the search line activation signal SLE, based on the clock CAMCLK and the search data GSL. The control circuit 815 comprises a switching control circuit as illustrated in FIG. 43.

The switching control circuit 161 comprises a logical addition circuit OR101 and an inverter INV161. The logical addition circuit OR101 generates a logical addition of the clock CAMCLK (search line activation signal SLE) and the pre-charge signal MLPRE, and outputs the logical addition as the inverted switch activation signal SL2 ML_n. The inverter INV161 reverses the inverted switch activation signal SL2 ML_n, and outputs it as the switch activation signal SL2ML.

After the clock CAMCLK (search line activation signal SLE) is set to an L, until the pre-charge signal MLPRE is activated to an H level, the switching control circuit 161 activates the inverted switch activation signal SL2 ML_n to an L level, and after some delay (since it passes through the inverter), the switching control circuit 161 activates the switch activation signal SL2ML to an H level. This is logic which activates the switch activation signal SL2ML, in a period other than the search period and the pre-charge period, and the search line SL and the match line ML are coupled in the period.

Figure 44:
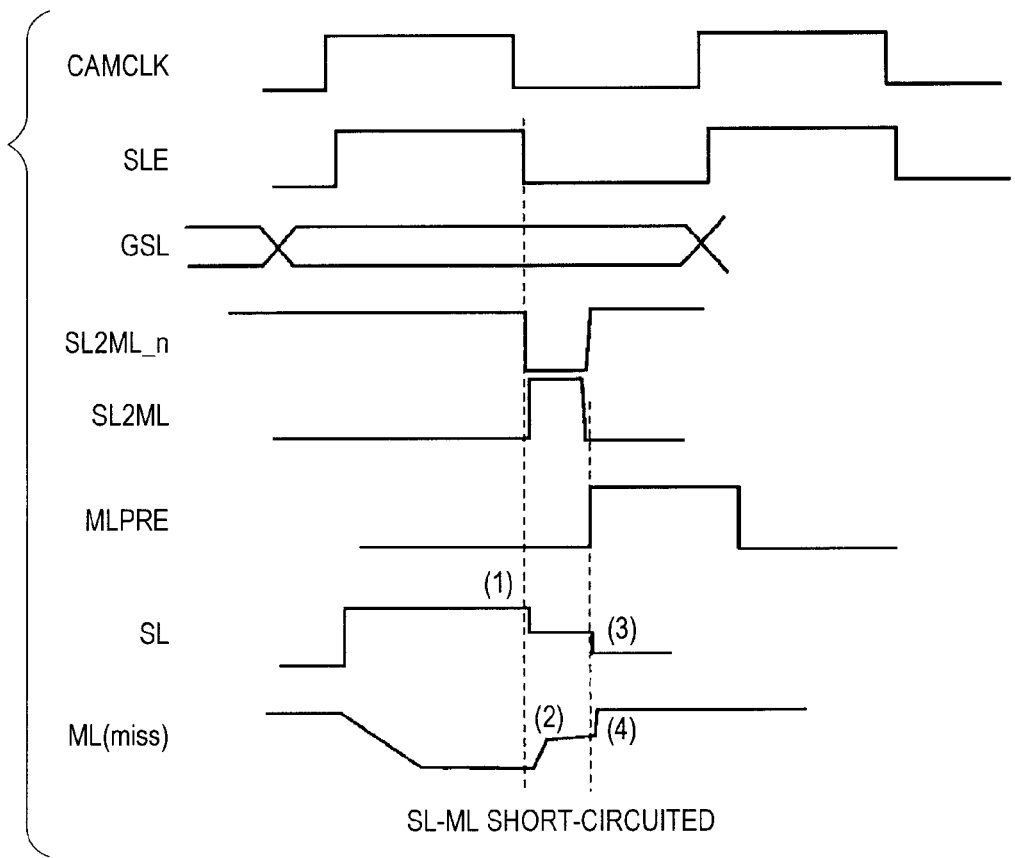
FIG. 44 is a drawing illustrating operating waveforms of the content addressable memory device according to Embodiment 13.

(Operating waveform) FIG. 44 illustrates operating waveforms of the content addressable memory device according to Embodiment 13.

As illustrated in FIG. 44, the SL driver 100 activates the search line SL to VDD, when the search line activation signal SLE is at an H level and the search data of an H level is supplied. When the search line SL is activated and search result of any one of unit cells UC coupled to the match line ML is of Miss, the match line ML is discharged and changes toward an L level (the ground level).

Subsequently, when the inverted switch activation signal SL2 ML_n is activated to an L level for a prescribed period (a period of about hundreds of ps), the match line ML and the common node VMA are coupled by the ML switch 118. The SL driver 110 drives the search line SL to a Hi-Z state, when the inverted switch activation signal SL2 ML_n is at an L level.

After the search line SL is driven to the Hi-Z state, the switch activation signal SL2ML is activated to an H level for a prescribed period (a period of about hundreds of ps), the search line SL activated to an H level (VDD level) by the SL switch 112 (that is, a search line to which the search data GSL of an H level has been supplied by the search line driver 110) and the common node VMA are coupled.

Accordingly, when the inverted switch activation signal SL2 ML_n is at an L level and the switch activation signal SL2ML is at an H level, the activated search line SL and all the match lines ML are coupled via the common node and all of these lines become at the same potential Vma.

When the pre-charge signal MLPRE is activated to an H level after the search line SL and all the match lines ML become at the same potential, the P-channel MOS transistor TR101 pre-charges the match line ML from the common potential Vma to VDD. The search line driver 110 deactivates the search line SL from the common potential Vma to an L level (the ground level).

(Reference: Operation of a conventional content addressable memory device) Operating waveforms of a conventional content addressable memory device are illustrated in FIG. 45 for comparison.

Figure 45:
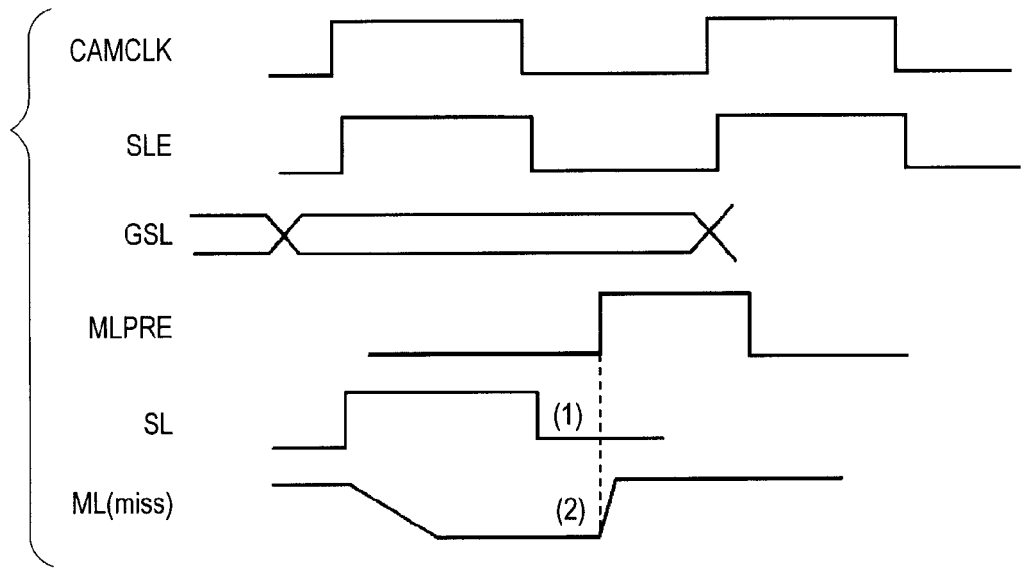
FIG. 45 is a drawing illustrating operating waveforms of the conventional content addressable memory device.

As illustrated in FIG. 45, the SL driver activates the search line SL to VDD, when the search line activation signal SLE is at an H level and search data of an H level is supplied. When the search line SL is activated and search result of any one of unit cells UC coupled to the match line ML is of Miss, the match line ML is discharged and changes toward an L level (the ground level).

Subsequently, when the search line activation signal SLE changes to an L level, the search line driver deactivates the search line SL from VDD to an L level (the ground level).

Subsequently, when the pre-charge signal MLPRE is activated to an H level, the P-channel MOS transistor pre-charges the match line ML from the ground level to VDD.

In FIG. 45, since the match line ML is not coupled to the search line SL, the match line ML is charged to an H level (VDD), without passing through the middle common voltage Vma. Therefore, the consumption current of the past content addressable memory device is larger than that of the content addressable memory device according to the present embodiment.

(Current reduction effect) A current reduction effect of the present embodiment is explained.

A case where all the match lines ML are of Miss, that is, a case where consumption current becomes the maximum, is compared. It is assumed that parasitic capacitance of the match line ML is CML, and that parasitic capacitance of the search line SL is CSL.

In the past, the consumption current is given by CML× VDD. As compared with this, in the present embodiment, by coupling the search line SL charged to VDD level (accordingly, having a charge (CSL×VDD)) to the match line ML of the ground level, the voltage Vma of the match line ML becomes CSL/(CSL+CML)×VDD. Subsequently, the consumption current Ic necessary to charge the match line ML to VDD becomes CML×{1−CSL/(CSL+CML)}×VDD.

When the parasitic capacitance CSL of the match line ML and the parasitic capacitance CML of the search line SL are equal, the consumption current is given as follows: Ic=(CML/2)×VDD. This is a half of that in the past.

When the parasitic capacitance CML of the match line ML is ½ of the parasitic capacitance CSL of the search line SL, the consumption current is given as follows: Ic=(CML/3)× VDD. This is one third of that in the past.

(Reduction effect of current variation (dI/dt)) A reduction effect of current variation dI/dt is considered as follows.

When the parasitic capacitance CML of the match line ML and the parasitic capacitance CSL of the search line SL are equal, the match line ML is pre-charged to 0V or to VDD in the past. As compared with this, in the present embodiment, the match line ML is pre-charged from (VDD/2) to VDD. That is, dI/dt of the match line ML in the present embodiment is relaxed to ½ of that in the past.

In the past, the search line SL is discharged from VDD to 0V. As compared with this, in the present embodiment, the search line SL is discharged from (VDD/2) to 0V. That is, dI/dt of the search line SL in the present embodiment is relaxed to ½ of that in the past.

Figure 46:
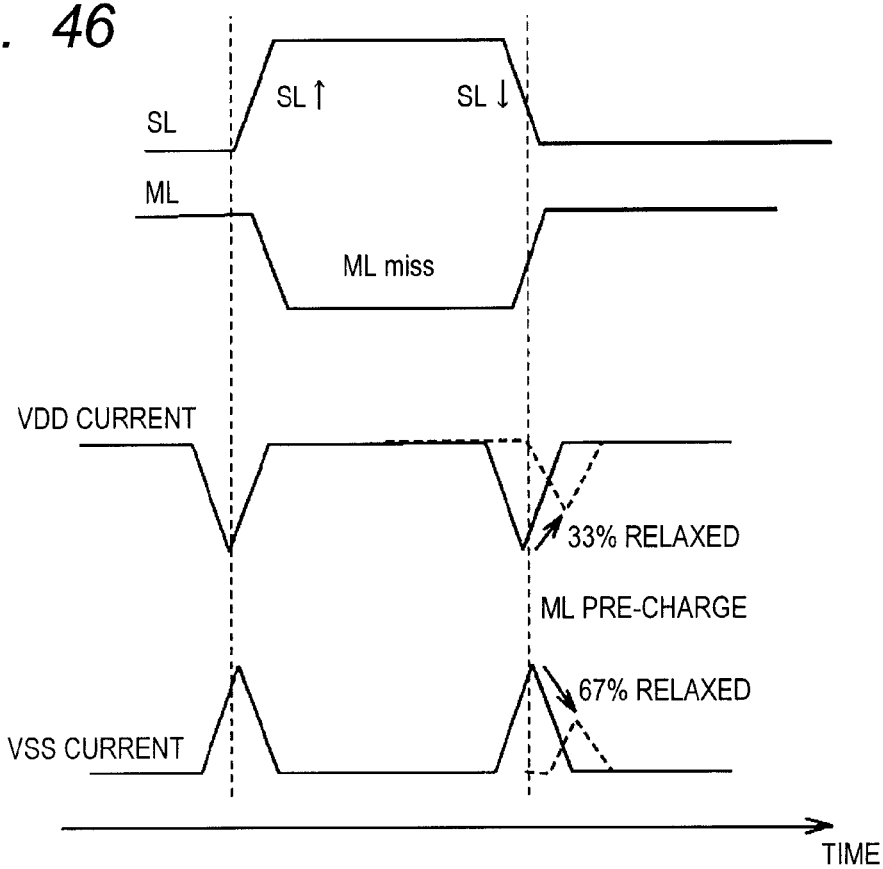
FIG. 46 is a drawing illustrating current waveforms in Embodiment 13.

FIG. 46 illustrates current waveforms in Embodiment 13. As illustrated in FIG. 46, the VDD current is relaxed 33% and the VSS current is relaxed 67%.

(Effects) As described above, according to the present embodiment, the voltage of the activated search line SL is used for pre-charging of the match line ML. Accordingly, it is possible to reduce the consumption current and the current variation.

It is sufficient that one ML switch is provided for one match line ML, and that one SL switch is provided for one search line SL. Accordingly, it is possible to realize the preset layout without large alteration from the layout in the past.

(Embodiment 14)

Figure 47:
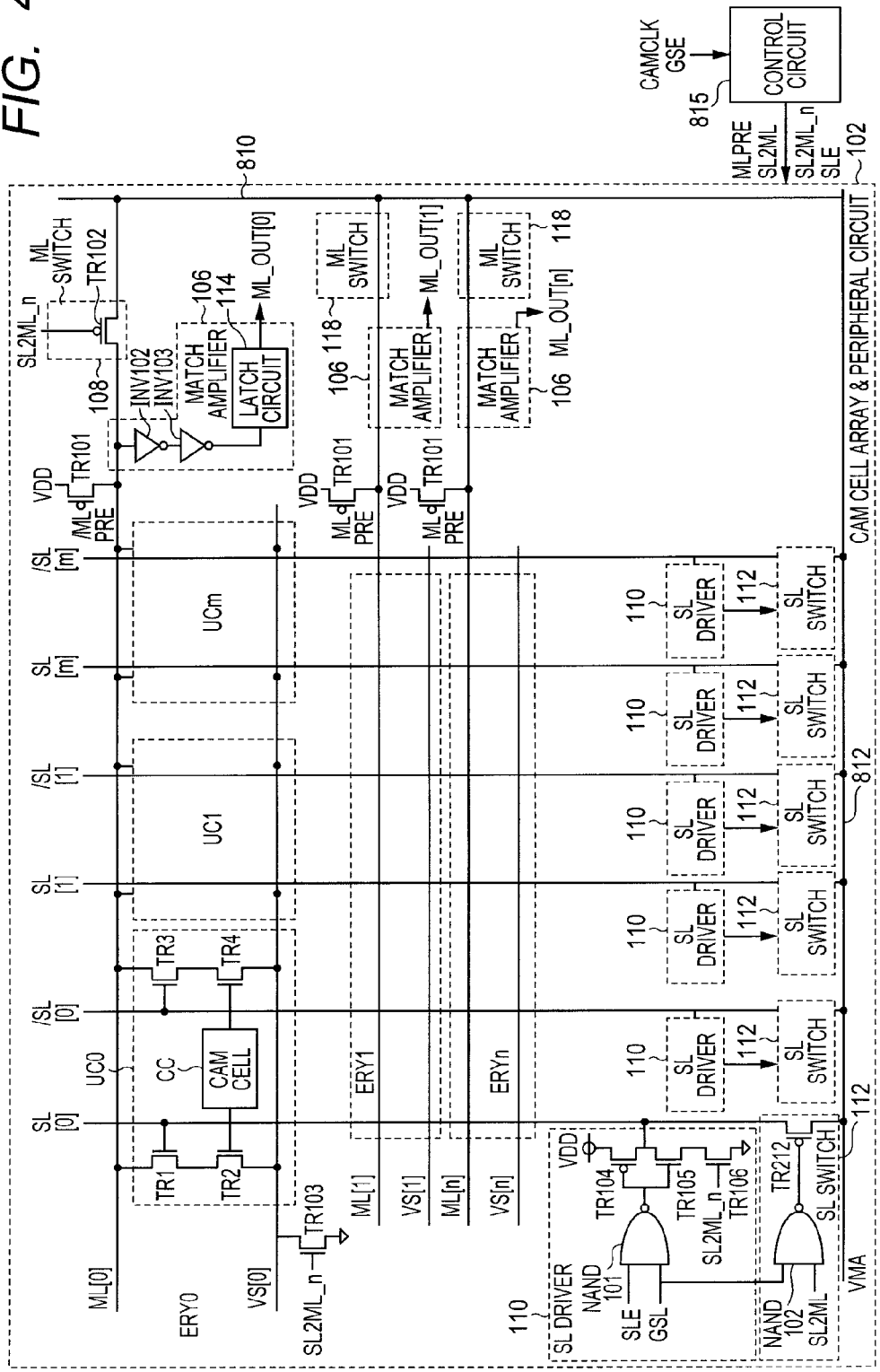
FIG. 47 is a drawing illustrating a configuration of a content addressable memory device according to Embodiment 14.

(Configuration) FIG. 47 illustrates a configuration of a content addressable memory device according to Embodiment 14.

The configuration illustrated in FIG. 47 is different from the configuration according to Embodiment 13 illustrated in FIG. 42 with respect to a ML switch 108.

That is, in Embodiment 13, the ML switch 118 comprises the inverter INV101 which receives the inverted switch activation signal SL2 ML_n, and the N-channel MOS transistor TR112 which receives the output of the inverter INV101.

As compared with this, in Embodiment 14, the ML switch 108 comprises a P-channel MOS transistor TR102 which receives the inverted switch activation signal SL2 ML_n.

When the inverted switch activation signal SL2 ML_n is activated to an L level, the P-channel MOS transistor TR102 is set to ON, and couples the match line ML and the common node VMA.

(Effects) As described above, according to the present embodiment, the same effect as in Embodiment 13 can be obtained by composing the ML switch of the P-channel MOS transistor, in place of the N-channel MOS transistor.

(Embodiment 15)

Figure 48:
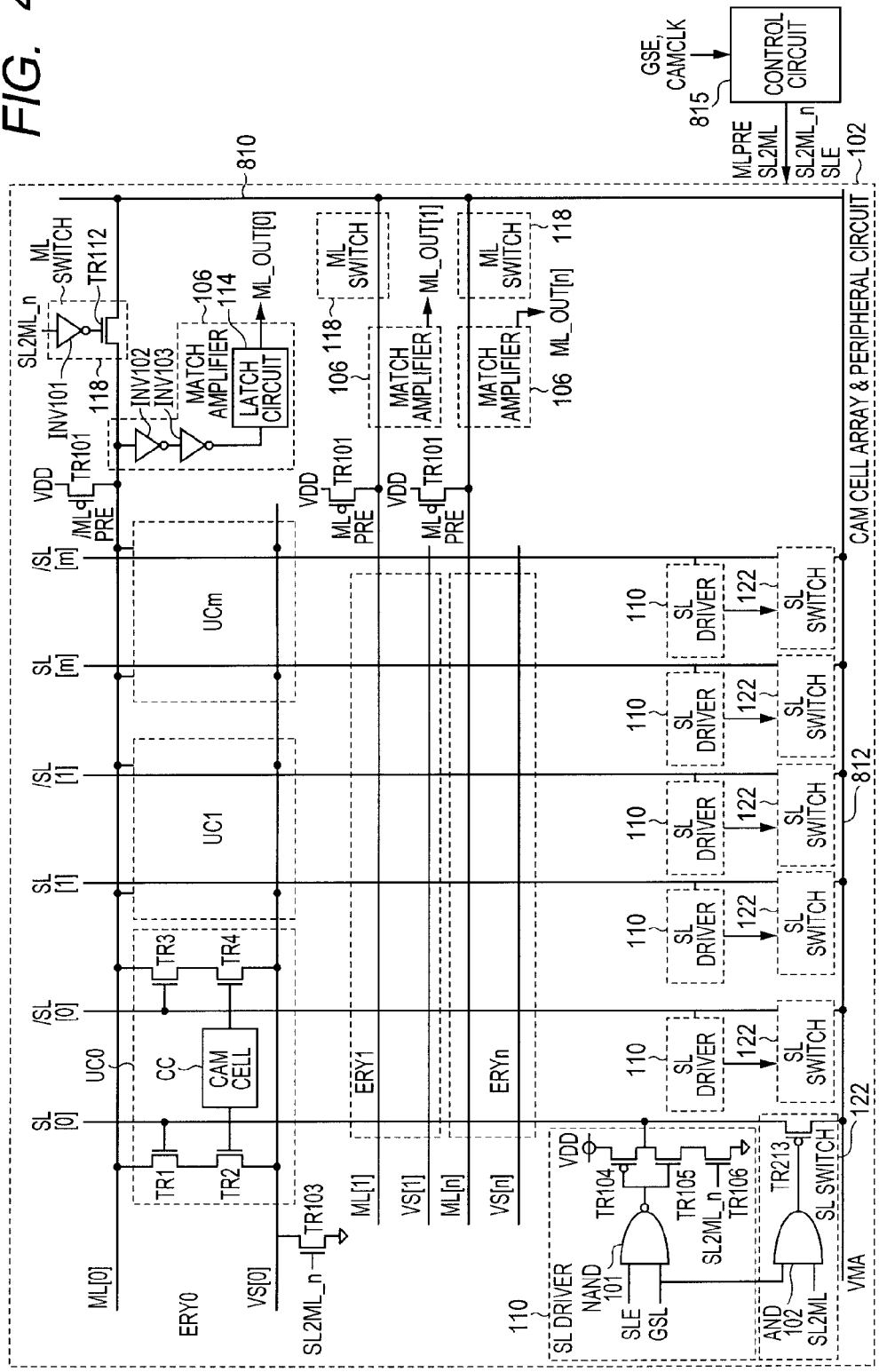
FIG. 48 is a drawing illustrating a configuration of a content addressable memory device according to Embodiment 15.

(Configuration) FIG. 48 illustrates a configuration of a content addressable memory device according to Embodiment 15.

The configuration illustrated in FIG. 48 is different from the configuration according to Embodiment 13 illustrated in FIG. 42 with respect to a SL switch 122.

That is, in Embodiment 13, the SL switch 112 comprises the inverted logical product circuit NAND102 which receives the switch activation signal SL2ML and the search data GSL, and the P-channel MOS transistor TR212 which receives the output of the inverted logical product circuit NAND102.

As compared with this, in Embodiment 15, the SL switch 122 comprises a logical product circuit AND102 which receives the switch activation signal SL2ML and the search data GSL, and an N-channel MOS transistor TR213 which receives an output of the logical product circuit AND102.

When the switch activation signal SL2ML and the search data GSL are activated to an H level, the N-channel MOS transistor TR213 is set to ON, and couples the match line ML and the common node VMA.

(Effects) As described above, according to the present embodiment, the same effect as in Embodiment 13 can be obtained by composing the SL switch of the N-channel MOS transistor, in place of the P-channel MOS transistor.

(Embodiment 16)

Figure 49:
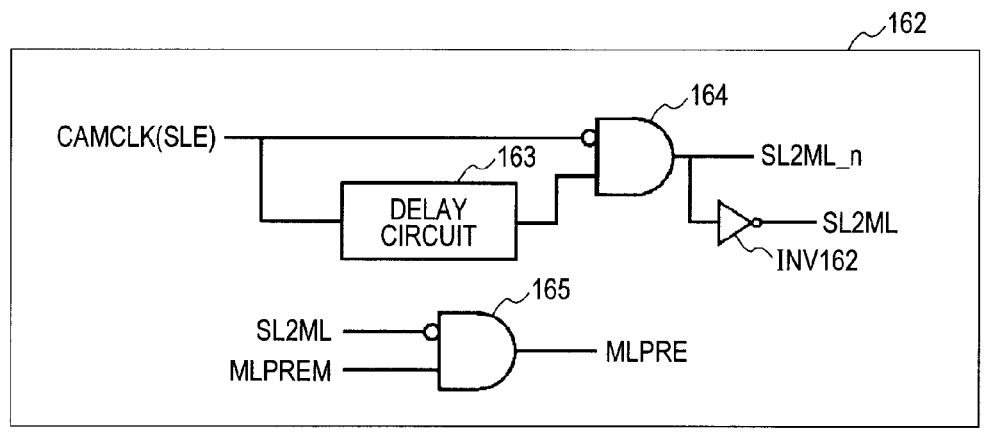
FIG. 49 is a drawing illustrating a configuration of a switching control circuit according to Embodiment 16.

(Configuration) FIG. 49 illustrates a configuration of a switching control circuit according to Embodiment 16.

As illustrated in FIG. 49, the switching control circuit 162 comprises a delay circuit 163, such as an inverter which delays the clock CAMCLK, and an inverted logical product circuit 164 which outputs an inverted logical product of an inverted signal of the clock CAMCLK and the clock CAMCLK, as an inverted switch activation signal SL2 ML_n. The switching control circuit 162 comprises further an inverter INV162 which reverses an output of the inverted logical product circuit 164, and outputs a switch activation signal SL2ML. That is, for a delay time in the delay circuit 163 after the clock CAMCLK is set to an L level, the switching control circuit 162 activates the inverted switch activation signal SL2 ML_n to an L level, and after some delay (since it passes through the inverter), the switching control circuit 162 activates the switch activation signal SL2ML to an H level.

Furthermore, the switching control circuit 162 comprises a logical product circuit 165 which outputs, as a pre-charge signal MLPRE, a logical product of an inverted signal of the switch activation signal SL2ML and the customary pre-charge signal MLPREM.

(Effects) As described above, according to the present embodiment, by replacing the switching control circuit illustrated in FIG. 43 with the switching control circuit illustrated in FIG. 49, the same effect as in Embodiment 13 is obtained.

(Embodiment 17)

Figure 50:
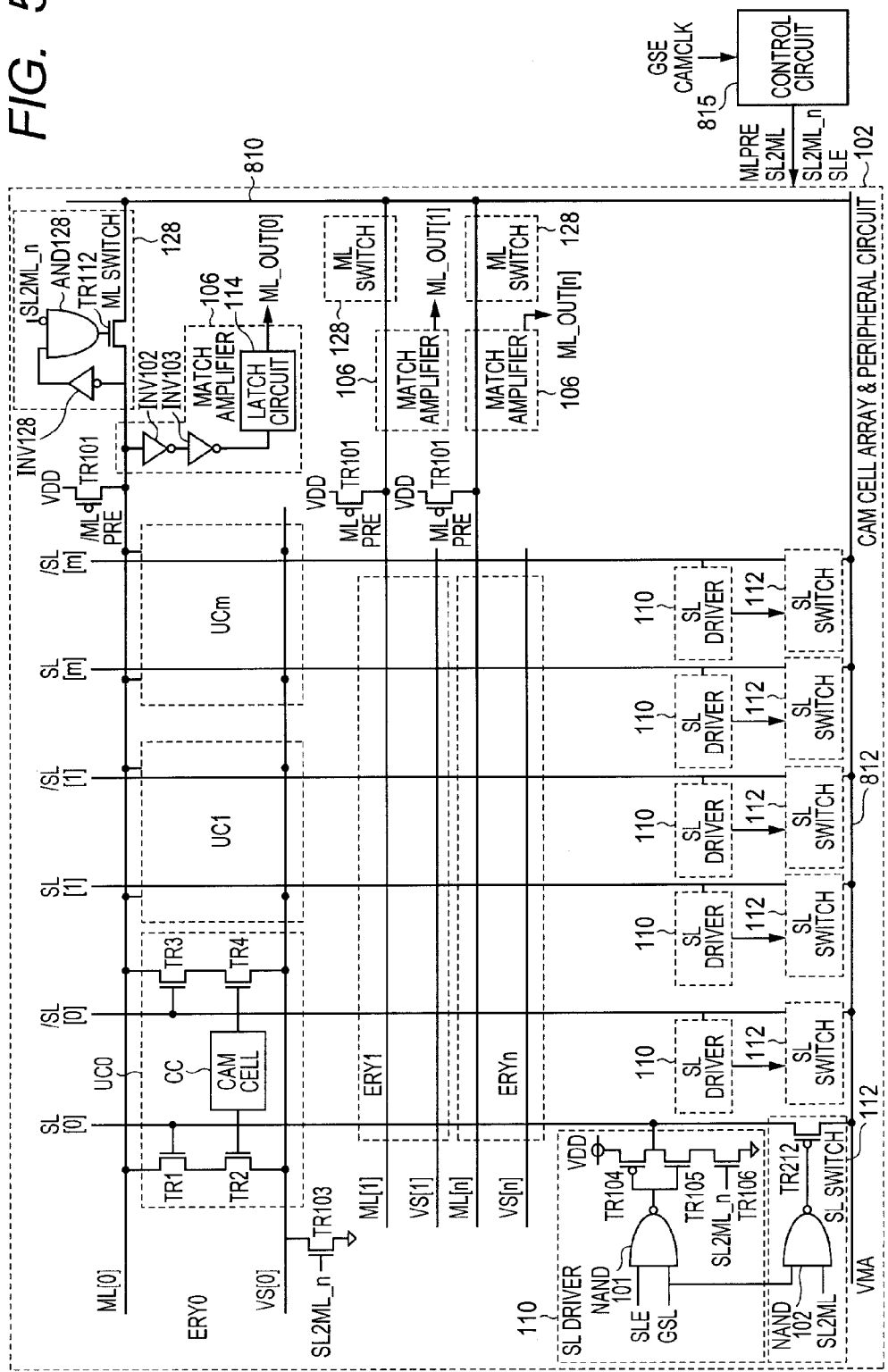
FIG. 50 is a drawing illustrating a configuration of a content addressable memory device according to Embodiment 17.

(Configuration) FIG. 50 illustrates a configuration of a content addressable memory device according to Embodiment 17.

The configuration illustrated in FIG. 50 is different from the configuration according to Embodiment 13 illustrated in FIG. 42 with respect to a ML switch 128.

The present ML switch 128 is coupled to the match line ML, and comprises an inverter INV128 which receives the voltage of the match line ML.

The ML switch 128 comprises further a logical product circuit AND128 which receives an inverted signal of the inverted switch activation signal SL2 ML_n and an output of the inverter INV128, and an N-channel MOS transistor TR112 which receives an output of the logical product circuit 128.

The N-channel MOS transistor TR112 is set to ON and couples the match line ML and the common node VMA, when the inverted switch activation signal SL2 ML_n is activated to an L level and the voltage of the match line ML is at an L level (that is, when the search result is of Miss).

(Effects) As described above, according to the present embodiment, when the search result is of Miss, only the match line ML which is discharged to 0V is coupled to the activated search line SL. Therefore, it is possible to enhance the distribution efficiency of a charge charged to the activated search line SL.

(Embodiment 18)

Figure 51:
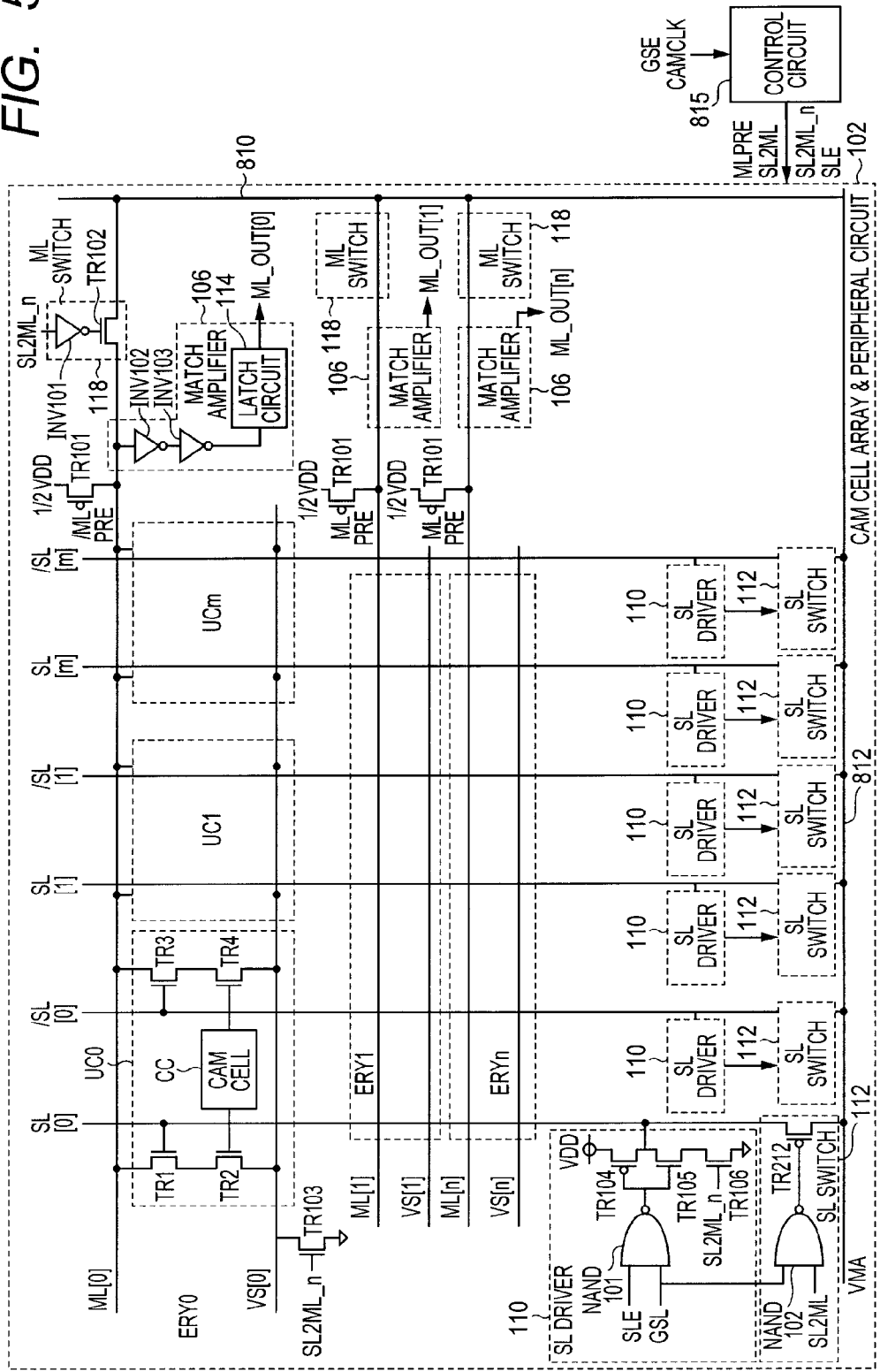
FIG. 51 is a drawing illustrating a configuration of a content addressable memory device according to Embodiment 18.

(Configuration) FIG. 51 illustrates a configuration of a content addressable memory device according to Embodiment 18.

The configuration illustrated in FIG. 51 is different from the configuration according to Embodiment 13 illustrated in FIG. 42 with respect to a P-channel MOS transistor TR191 which pre-charges the match line ML.

In FIG. 51, a P-channel MOS transistor TR191 is provided to each match line ML, for pre-charging each match line ML.

The P-channel MOS transistor TR191 has a source coupled to the power supply voltage (VDD/2), a drain coupled to the match line ML, and a gate to which an inverted pre-charge signal /MLPRE is inputted. The P-channel MOS transistor TR191 pre-charges the match line ML to the power supply voltage (VDD/2), when the inverted pre-charge signal /MLPRE is activated to an L level.

(Effects) As described above, according to the present embodiment, it is possible to enhance the distribution efficiency of a charge when the search line SL and the match line ML are coupled; accordingly, it is possible to attain low power consumption.

(Embodiment 19)

Figure 52:
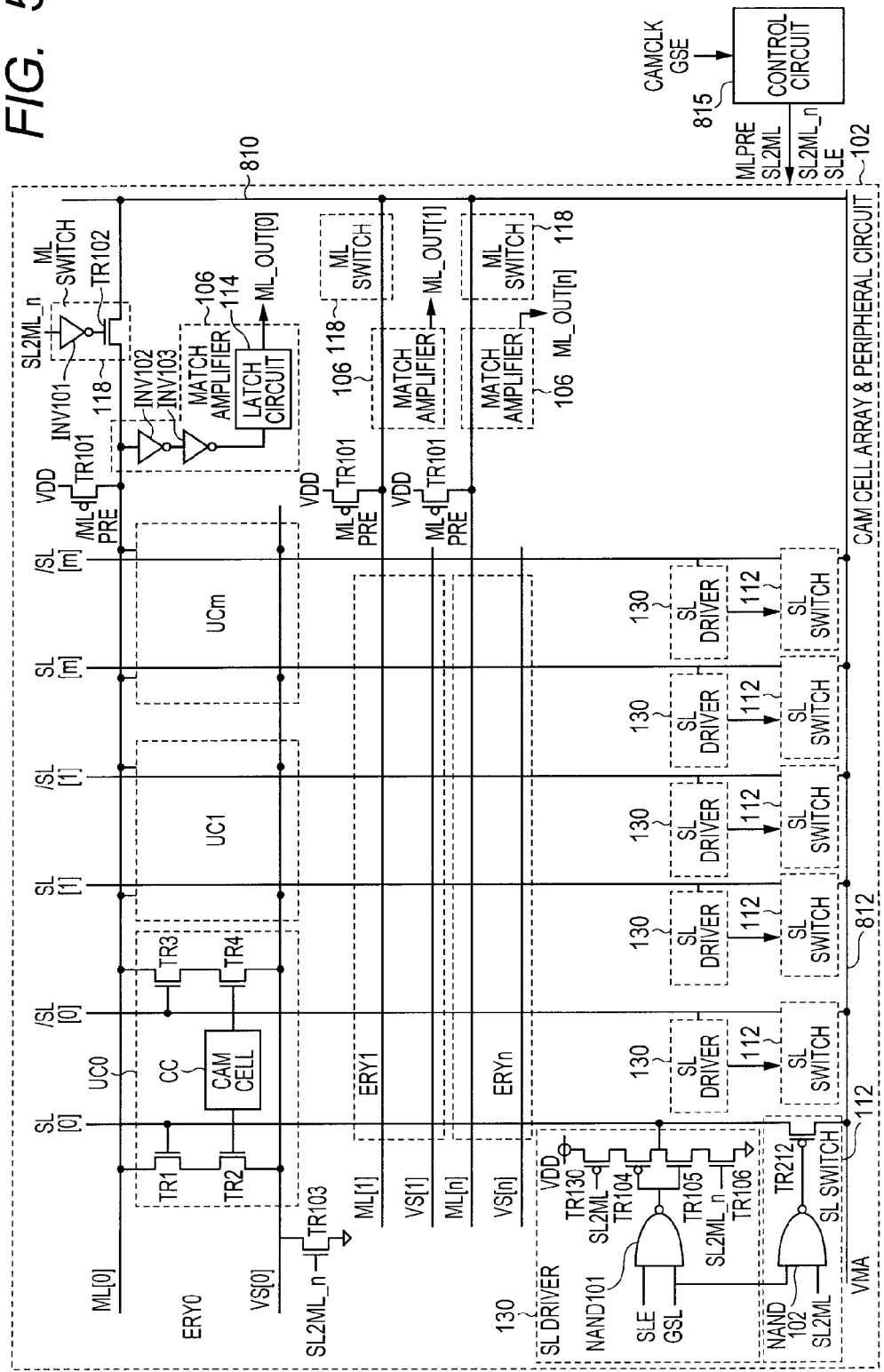
FIG. 52 is a drawing illustrating a configuration of a content addressable memory device according to Embodiment 19.

(Configuration) FIG. 52 illustrates a configuration of a content addressable memory device according to Embodiment 19.

The configuration illustrated in FIG. 52 is different from the configuration according to Embodiment 13 illustrated in FIG. 42 with respect to a SL driver 130.

The SL driver 130 comprises an inverted logical product circuit NAND101, a P-channel MOS transistor TR130 which receives a switch activation signal SL2ML, a P-channel MOS transistor TR104, an N-channel MOS transistor TR105, and an N-channel MOS transistor TR106 which receives an inverted switch activation signal SL2 ML_n.

The P-channel MOS transistor TR104 and the N-channel MOS transistor TR105 form an inverter. The P-channel MOS transistor TR130, the P-channel MOS transistor TR104, the N-channel MOS transistor TR105, and the N-channel MOS transistor TR106 form a clocked inverter.

The inverted logical product circuit NAND101 outputs an inverted logical product of a search line activation signal SLE and search data GSL, to the inverter which is comprised of the P-channel MOS transistor TR104 and the N-channel MOS transistor TR106.

The P-channel MOS transistor TR130 is set to ON when the switch activation signal SL2ML is deactivated to an L level. The P-channel MOS transistor TR130 is set to OFF when the switch activation signal SL2ML is activated to an H level.

The N-channel MOS transistor TR106 is set to OFF when the inverted switch activation signal SL2 ML_n is activated to an L level. The N-channel MOS transistor TR106 is set to ON when the inverted switch activation signal SL2 ML_n is deactivated to an H level.

The SL driver 130 drives the search line SL to a Hi-Z state, when the switch activation signal SL2ML is at an H level and the inverted switch activation signal SL2 ML_n is at an L level.

The SL driver 130 supplies a voltage of an H level to the search line SL (to activate the search line), when the switch activation signal SL2ML is at an L level, the inverted switch activation signal SL2 ML_n is at an H level, the search line activation signal SLE is at an H level, and the search data GSL is at an H level.

The SL driver 130 supplies a voltage of L level to the search line SL (to deactivate the search line), when the switch activation signal SL2ML is at an L level, the inverted switch activation signal SL2 ML_n is at an H level, the search line activation signal SLE is at an H level, and the search data GSL is at an L level.

(Effects) As described above, according to the present embodiment, it is possible to obtain the same effect as in Embodiment 13, by using the clocked inverter as the SL driver. Compared with Embodiment 13, it is possible to drive the search line SL to the Hi-Z state more reliably, before the search line SL is coupled to the common node VMA.

(Modification) (1) Match amplifier: Instead of the match amplifier A, the match amplifier B, and the match amplifier C, explained in Embodiment 3-Embodiment 6, it is also preferable to employ the match amplifier A plus the drive B, the match amplifier B plus the drive C, and the match amplifier C plus the drive D, as explained in Embodiment 2. The drive B, the drive C, and the drive D have the same configuration as the drive B according to Embodiment 2, and pre-charge or discharge the match lines MLB, MLC, and MLD, respectively, based on the voltage of match lines MLA, MLB, and MLC. In this case, the match amplifier B explained in Embodiment 2 is employed instead of the match amplifier D in Embodiment 3-Embodiment 6.

What is claimed is:

1. A contents addressable memory comprising:
a first memory array including a plurality of first match lines, a plurality of first search lines, a plurality of first contents addressable memory cells, and a first control logic;
a second memory array including a plurality of second match lines, a plurality of second search lines, a plurality of second contents addressable memory cells, and a second control logic; and
a clock supply circuit, which is used for generating and supplying clock signals to the first memory array and the second memory array,
wherein the first control logic controls a first search function in the first memory array, and each of the first match lines outputs a result of the first search function to the second memory array when at least one of the first contents addressable memory cells coupled with corresponding first match line is mismatched with a search data provided from corresponding first search line, and
wherein the second control logic controls a second search function in the second memory array, wherein when at least one of the first match lines indicates a hit result for the first search function, the second control logic makes activate the second match lines and the second search lines for starting the second search function, and when all of the first match lines indicate a miss result for the first search function, the second control logic makes inactivate the second match lines and the second search lines for stopping the second search function.

2. A contents addressable memory according to claim 1, wherein the second control logic starts pre-charging the second match lines and supplying search data to the second search lines, in response to all of the first match lines indicating the hit result of the first search function.

3. A contents addressable memory according to claim 1, wherein the second match line outputs a miss result for the second search function, when the result of corresponding first search function indicates the miss result.

4. A contents addressable memory according to claim 1, wherein the first memory array starts a next search function during performing the second search function in the second memory array.

* * * * *